United States Patent
Mayell et al.

(10) Patent No.: US 11,522,464 B2
(45) Date of Patent: *Dec. 6, 2022

(54) APPARATUS AND METHODS FOR SENSING RESONANT CIRCUIT SIGNALS TO ENHANCE CONTROL IN A RESONANT CONVERTER

(71) Applicant: Power Integrations, Inc., San Jose, CA (US)

(72) Inventors: Robert J. Mayell, Los Altos, CA (US); Hartley Fred Horwitz, Ottawa (CA); Frank Joseph Schulz, Ottawa (CA); Roger Colbeck, Ottawa (CA)

(73) Assignee: POWER INTEGRATIONS, INC., San Jose, CA (US)

( * ) Notice: Subject to any disclaimer, the term of this patent is extended or adjusted under 35 U.S.C. 154(b) by 151 days.

This patent is subject to a terminal disclaimer.

(21) Appl. No.: 16/923,066

(22) Filed: Jul. 7, 2020

(65) Prior Publication Data

US 2020/0336075 A1 Oct. 22, 2020

Related U.S. Application Data

(62) Division of application No. 16/219,529, filed on Dec. 13, 2018, now Pat. No. 10,763,756.

(51) Int. Cl.
*H02M 3/335* (2006.01)
*H03K 5/24* (2006.01)
*H02M 1/00* (2006.01)

(52) U.S. Cl.
CPC ...... *H02M 3/33592* (2013.01); *H02M 1/0009* (2021.05); *H02M 1/0058* (2021.05); *H03K 5/2472* (2013.01)

(58) Field of Classification Search
CPC ..... H02M 3/33592; H02M 2001/0058; H02M 2001/0009; H03K 5/2472
See application file for complete search history.

(56) References Cited

U.S. PATENT DOCUMENTS 6,049,471 A 4/2000 Korcharz et al.
8,842,449 B1 9/2014 Tong
(Continued)

FOREIGN PATENT DOCUMENTS

CN 101471606 A 7/2009
EP 3050205 A1 8/2016

OTHER PUBLICATIONS

TEA19161T Digital Controller for High-Efficiency Resonant Power Supply, NXP Semiconductors, Rev. 1, Mar. 10, 2016, 46 pages.
(Continued)

*Primary Examiner* — Kyle J Moody
(74) *Attorney, Agent, or Firm* — Brian H. Floyd

(57) ABSTRACT

Apparatus and methods for sensing resonant circuit signals to enhance control in a resonant converter are described herein. A buffer circuit coupled in parallel with or across a resonant component (e.g., a transformer) input port avails a buffered primary port signal for use in resonant conversion. The buffered primary port signal is a comprehensive signal including information relating to both input voltage and input power; and it may be used to advantageously enhance switching and power conversion in an inductor-inductor capacitor (LLC) converter. Additionally, the LLC converter uses a sense interface circuit to provide a scaled replica of the buffered primary port signal. In one example the scaled replica can advantageously be used with a secondary side controller to control output power based on the comprehensive information contained within the buffered primary port signal.

20 Claims, 36 Drawing Sheets

(56) References Cited

U.S. PATENT DOCUMENTS

| | | |
|---|---|---|
| 9,444,346 B2 | 9/2016 | Chen et al. |
| 9,825,546 B2 | 11/2017 | Tang et al. |
| 10,079,540 B2 | 9/2018 | Leisten et al. |
| 10,763,756 B2 * | 9/2020 | Mayell .............. H02M 3/33592 |
| 2008/0049456 A1 | 2/2008 | Moromizato et al. |
| 2009/0008995 A1 | 1/2009 | Cyr |
| 2009/0257250 A1 | 10/2009 | Liu |
| 2013/0083564 A1 | 4/2013 | Bai et al. |
| 2013/0163290 A1 | 6/2013 | Moon et al. |
| 2015/0138856 A1 | 5/2015 | Huynh et al. |
| 2015/0326103 A1 | 11/2015 | Choi |
| 2016/0261204 A1 | 9/2016 | Kikuchi et al. |
| 2017/0155335 A1 | 6/2017 | Chang et al. |
| 2018/0013352 A1 | 1/2018 | Cao et al. |
| 2018/0351462 A1 | 12/2018 | Li et al. |
| 2019/0252966 A1 | 8/2019 | Radic |

OTHER PUBLICATIONS

Examination Report dated Aug. 11, 2020 for IN application No. 201914051067, 5 pgs.

* cited by examiner

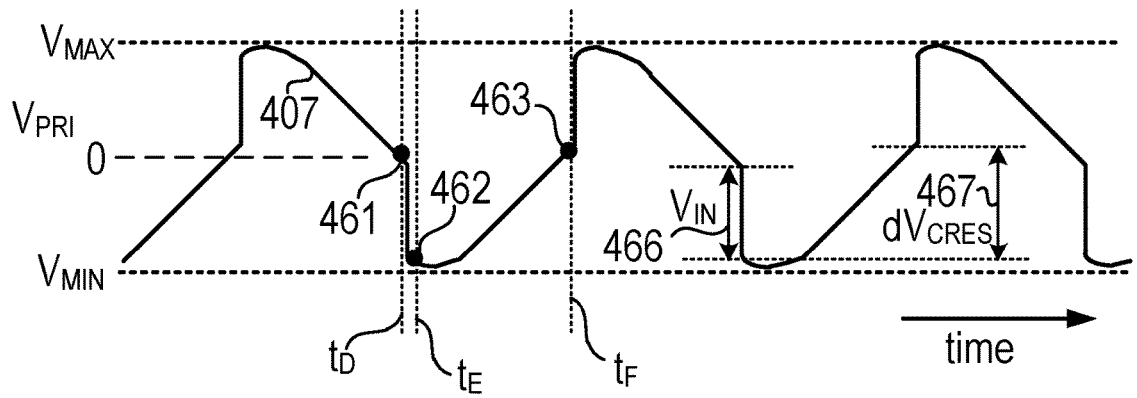
FIG. 4E
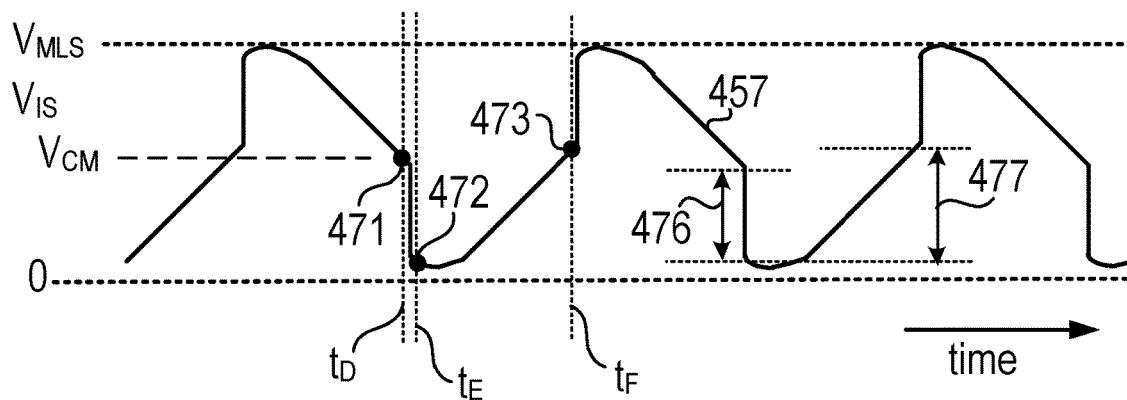
FIG. 4F
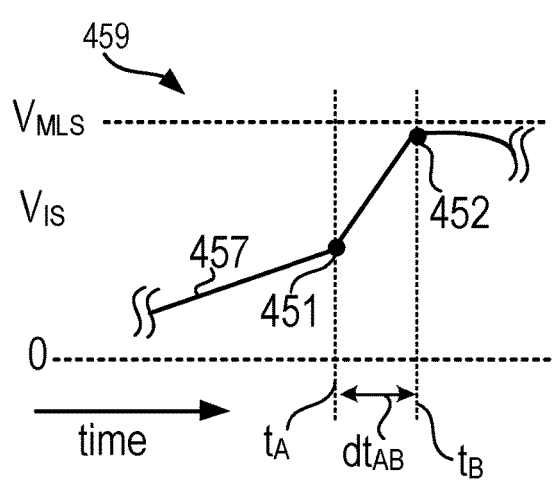 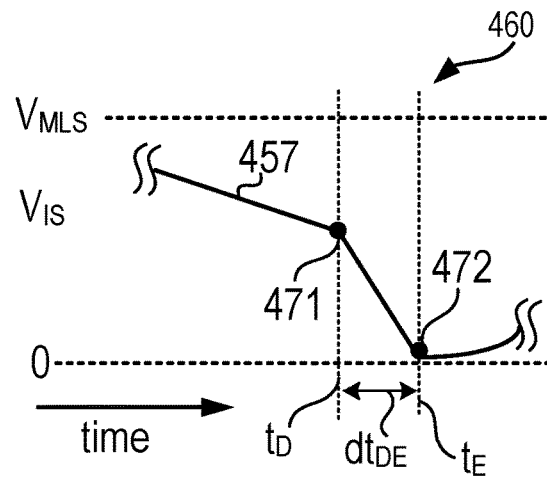
FIG. 4G  FIG. 4H

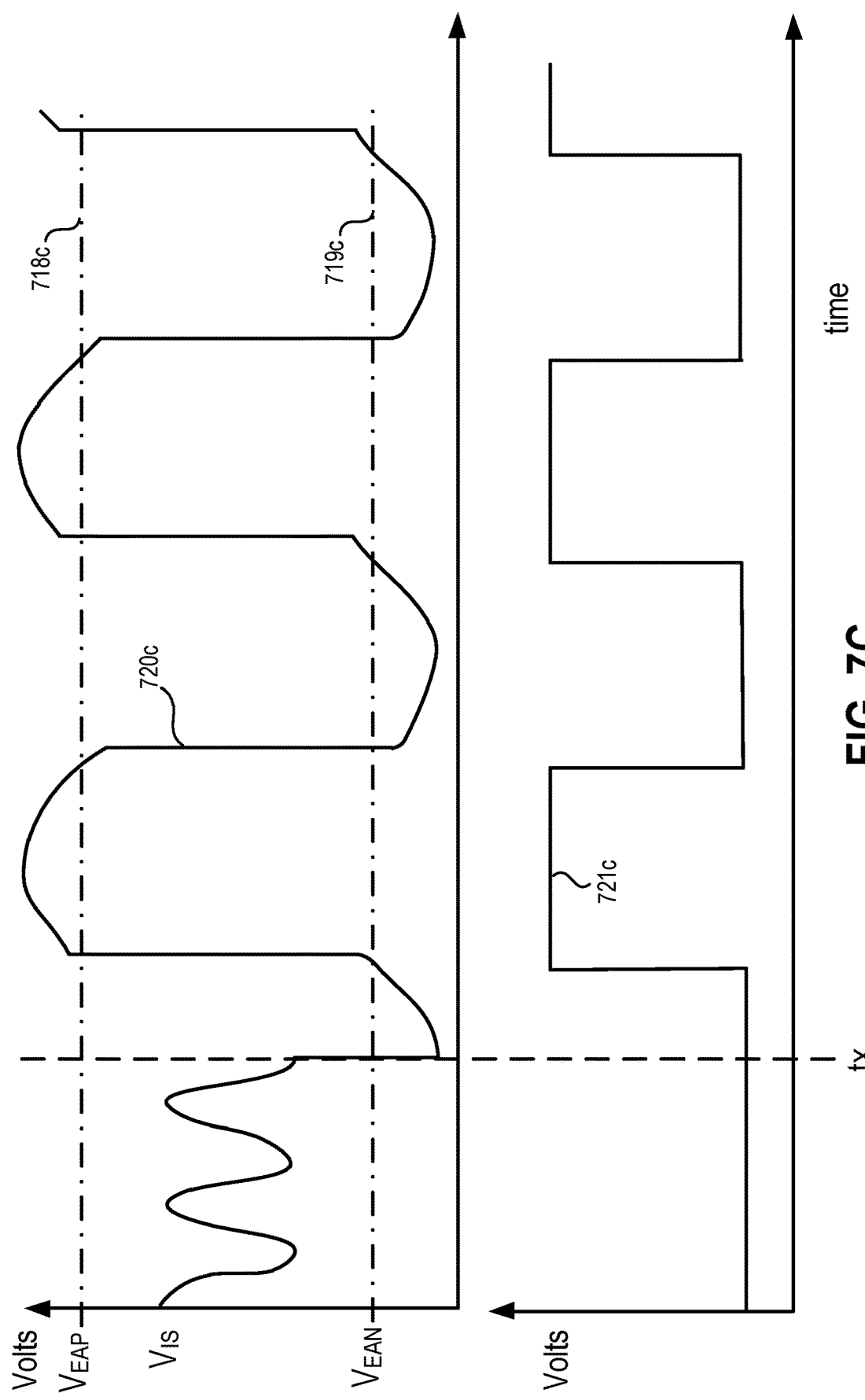

APPARATUS AND METHODS FOR SENSING RESONANT CIRCUIT SIGNALS TO ENHANCE CONTROL IN A RESONANT CONVERTER

CROSS-REFERENCE TO RELATED APPLICATIONS

This application is a divisional of U.S. patent application Ser. No. 16/219,529 filed on Dec. 13, 2018, now pending, which is hereby incorporated by reference in its entirety.

BACKGROUND INFORMATION

Field of the Disclosure

The present invention relates to sensing signals for the control of a resonant converter and more particularly to electronic circuits for sensing resonant circuit signals to enhance control in an inductor-inductor capacitor (LLC) converter.

Background

Many electronic devices, such as cell phones, laptops, etc., are powered by direct current (dc) power derived from a power supply. Conventional wall outlets generally deliver a high voltage alternating current (ac) power that needs to be converted to regulated dc power in order to be used as a power source for consumer electronic devices. Switch mode power converters, also referred to as switch mode power supplies (SMPSs), are commonly used due to their high efficiency, small size, and low weight to convert a high voltage ac power to a regulated dc power.

One type of switch mode power converter is a resonant converter, which includes a resonant circuit (e.g., inductor(s) and capacitor(s)) as part of a power stage. A resonant circuit may advantageously enhance power conversion efficiency by availing zero-current and/or zero-voltage switching.

A subset of resonant converters, the series inductor-inductor capacitor (LLC) converter, uses a resonant circuit with two inductors and one capacitor connected in series to form an LLC resonant circuit. Commonly, the power stage of an LLC converter is controlled so that power stage switches undergo zero-voltage switching.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 4E delineates additional aspects of a waveform of a primary port signal in an LLC converter according to an embodiment.

FIG. 4F delineates additional aspects of a waveform of a sense interface signal corresponding to the primary port signal of FIG. 4E.

FIG. 4G illustrates a magnified section of the waveform of the sense interface signal of FIG. 4D.

FIG. 4H illustrates a magnified section of the waveform of the sense interface signal of FIG. 4F.

FIG. 7C illustrates switching signal waveforms according to a second operating condition.

Figure 1A:
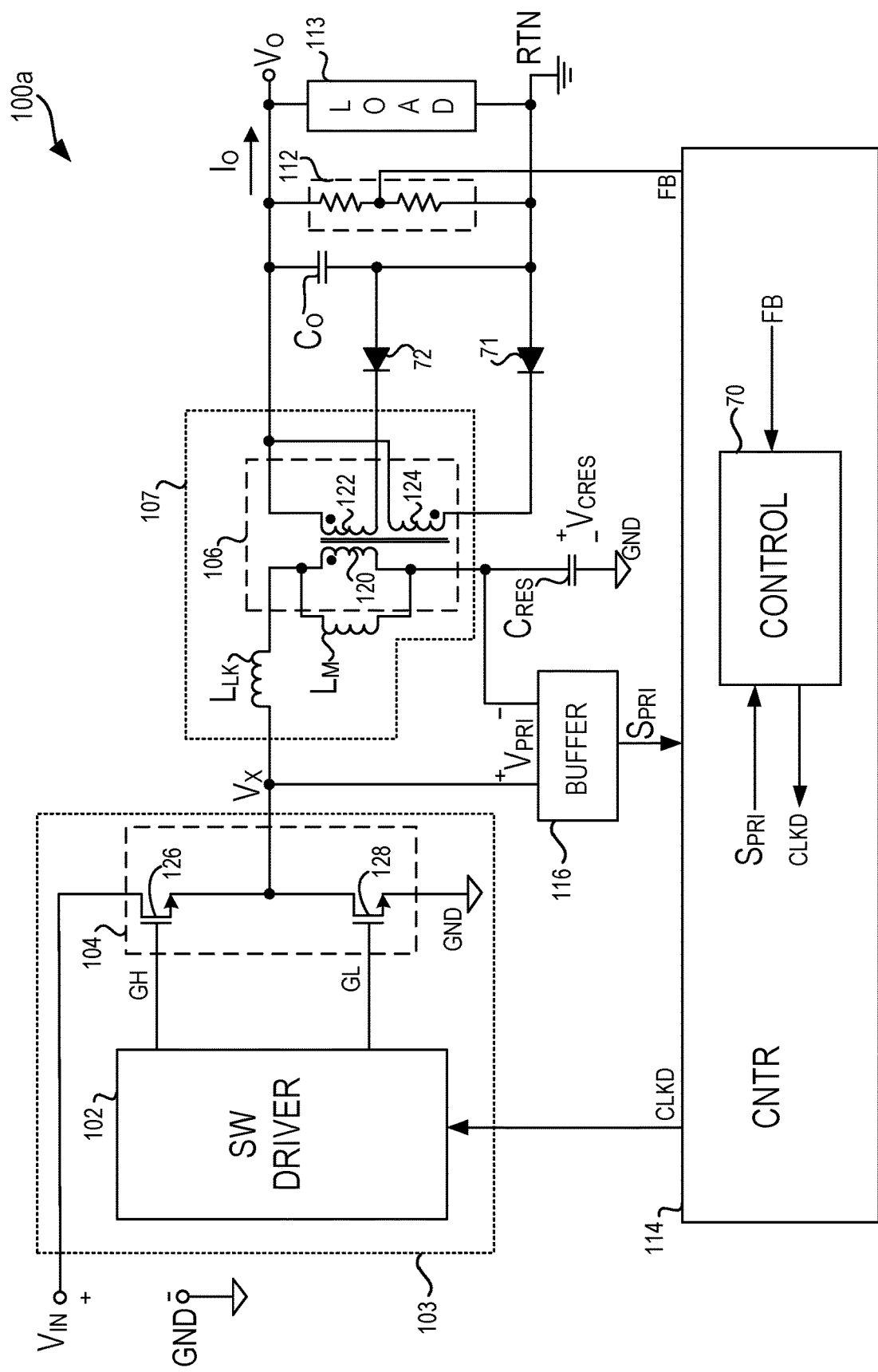
FIG. 1A illustrates an LLC converter for delivering output power to a load according to an embodiment.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of sensing resonant circuit signals to enhance control in a resonant converter. It will be apparent, however, to one having ordinary skill in the art that the specific detail need not be employed to practice the teachings herein. In other instances, well-known materials or methods have not been described in detail in order to avoid obscuring the present disclosure.

Reference throughout this specification to "one embodiment," "an embodiment," "one example," or "an example" means that a particular feature, structure or characteristic described in connection with the embodiment or example is included in at least one embodiment of the present invention. Thus, appearances of the phrases "in one embodiment," "in an embodiment," "one example," or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

In the context of the present application, when a transistor is in an "off-state" or "off" the transistor blocks current and/or does not substantially conduct current. Conversely, when a transistor is in an "on-state" or "on" the transistor is able to substantially conduct current. By way of example, in one embodiment, a high-voltage transistor comprises an N-channel metal-oxide-semiconductor (NMOS) field-effect transistor (FET) with the high-voltage being supported between the first terminal, a drain, and the second terminal, a source. In some embodiments an integrated controller circuit may be used to drive a power switch when regulating energy provided to a load. Also, for purposes of this disclosure, "ground" or "ground potential" refers to a reference voltage or potential against which all other voltages or potentials of an electronic circuit or integrated circuit (IC) are defined or measured.

As mentioned above one type of switched mode power converter is a resonant converter which uses a resonant circuit, also referred to as a "tank" circuit, having inductance(s) and capacitance(s) as part of the power conversion process. Resonant converters may have some advantages compared to non-resonant switched mode power converters, such as soft switching (e.g., zero-voltage switching), efficiency at higher frequency operation, and lower harmonic content in switching waveforms. These in turn can reduce packaging and component costs by allowing the use of smaller magnetic elements and smaller EMI filters.

Also as discussed above, an LLC converter is a subset of resonant converters. An LLC converter can be controlled to operate in zero voltage switching. Zero-voltage switching (ZVS) is a type of soft switching characterized by the turn-on and turn-off transitions of a switch (e.g., a power field effect transistor (FET) or semiconductor device) occurring at, or substantially near, zero crossings of a tank circuit voltage waveform. In this way a voltage across the switch (e.g., a power FET drain-to-source voltage), can be zero, or substantially zero during switching transitions thereby reducing capacitive switching losses.

Control of the switching and power conversion process may be based on how a controller is implemented with respect to a resonant component (i.e., an energy transfer device such as a transformer) which galvanically isolates signals at the primary (i.e., signals at the resonant transformer primary side) from signals at the secondary (i.e., signals at the resonant transformer secondary side). For instance, when the controller is implemented to control signals at the primary, it may be referred to as a primary side controller; and the type of control may be referred to as primary control. Alternatively, when a controller is implemented to control signals at the secondary, it may be referred to as a secondary side controller; and the type of control may be referred to as secondary control.

Control of the switching and power conversion process may also be determined and classified by the types of signals available to a controller within the LLC converter. In one example, when a feedback signal containing only output voltage information is available and implemented in a voltage feedback loop, the control may be further classified as voltage mode control. For instance, a divider feedback signal derived from the LLC converter output may be readily available to use in a voltage mode secondary side controller. Alternatively, and additionally, in one example when an additional feedback signal containing switch current information is available and used in a current feedback loop, the control may be implemented as current mode control. For instance, a sense resistor to measure the current in a resonant half-bridge may be readily available to use in a current mode primary side controller.

Apparatus and methods for sensing resonant circuit signals to enhance control in a resonant converter are described herein. A buffer circuit coupled in parallel with or across a resonant component (e.g., a transformer) input port avails a buffered primary port signal for use in resonant conversion. The buffered primary port signal is a comprehensive signal including information relating to both input voltage and input power; and it may be used to advantageously enhance switching and power conversion in an LLC converter. Additionally, the LLC converter uses a sense interface circuit to provide a scaled replica of the buffered primary port signal. In one example the scaled replica can advantageously be used with a secondary side controller to control output power based on the comprehensive information contained within the buffered primary port signal.

FIG. 1A illustrates an LLC converter 100a for delivering output power to a load 113 according to an embodiment. The LLC converter 100a includes a primary bridge circuit 103, a resonant transformer 107, a buffer circuit 116, a resonant capacitor $C_{RES}$, rectifiers 71 and 72, an output capacitor Co, a feedback network 112, and a controller 114. The primary bridge circuit 103 includes a switch driver 102 and a half bridge 104. Additionally, the half bridge 104 includes a high-side (HS) device 126 and a low-side (LS) device 128, both realized using power N-channel field effect transistors (NFETs). Also, the resonant transformer 107 includes a transformer 106, a leakage inductor $L_{LK}$, and a magnetizing inductor $L_M$; and the controller 114 includes a control module 70.

As illustrated a direct current (dc) input voltage $V_{IN}$, as referenced to ground GND, may be applied at a primary input of the LLC converter 100a. The LLC converter 100a may convert input power from the primary input into dc output power. The dc output power may be delivered to the load 113 connected at the secondary output of the LLC converter 100a. Additionally, the dc output power may be delivered with a regulated output voltage $V_O$, as referenced to a secondary ground RTN, and with output current $I_O$.

As illustrated, the leakage inductor $L_{LK}$, the magnetizing inductor $L_M$, and the resonant capacitor $C_{RES}$ are connected in series between an output of the primary bridge circuit 103 and ground GND. During operation, the controller 114 may provide a drive signal CLKD to the primary bridge circuit 103. The switch driver 102 may receive the drive signal CLKD, and in response, may provide a control signal (i.e., gate signal) GH to the HS device 126 and a control signal GL to the LS device 128. The control signals GH and GL may respectively drive HS device 126 and LS device 128 so that the half bridge provides a switched power signal $V_X$ to the resonant transformer; and as illustrated in FIG. 1A, the switched power signal $V_X$ can be provided from the output of the primary bridge circuit 103.

The transformer 106 includes a primary winding 120, a secondary winding 122, and a secondary winding 124. During operation, the transformer 106 may provide galvanic isolation between the primary side and the secondary side of the LLC converter 100a; in this way, signals on the primary side, referenced to ground GND, may be isolated from signals on the secondary side, referenced to a secondary ground RTN. The secondary ground RTN may also be referred to as a return ground RTN.

As illustrated, the primary winding 120 is electrically coupled in parallel with the magnetizing inductor $L_M$ so that the in-phase winding terminal, as indicated by the dot, connects to (i.e., the dot terminal) the leakage inductor $L_{LK}$. The secondary winding 122 is electrically connected in series with the rectifier 72 between the secondary ground RTN and the secondary output so that the in-phase winding terminal connects to secondary output. The secondary winding 123 is electrically connected in series with the rectifier 71 between the secondary ground RTN and the secondary output so that the in-phase winding terminal connects to the cathode of rectifier 71. Additionally, the anodes of rectifiers 71 and 72 both connect to the secondary ground RTN; and the output capacitor Co and the feedback network 112 are electrically coupled in parallel with the load 113 between the secondary output and secondary ground RTN. Although rectifiers 71 and 72 are shown as being connected to the secondary ground RTN, as one of ordinary skill in the art can appreciate, other rectifier configurations are possible. For instance, rectifier 72 may also operate as a rectifier when the anode of rectifier 72 is connected at the dot terminal of the secondary winding 122.

According to the teachings herein, the LLC converter 100a may use the buffer circuit 116, which is coupled in parallel with or across the input port of resonant transformer 107 as shown to receive a primary port signal $V_{PRI}$ and to provide a buffered primary port signal $S_{PRI}$. In some embodiments, the primary port signal $V_{PRI}$ can have large signal swing or dynamic voltage range (e.g., variations greater than plus and minus one-hundred volts), which may be too large for safe operation of the control module 70; the buffer circuit 116 can advantageously avail signal content from the primary port signal $V_{PRI}$ scaled to a lower signal swing or dynamic voltage range. The buffered primary port signal $S_{PRI}$ may include comprehensive signal content transferred from the primary port signal $V_{PRI}$; and the comprehensive signal content may then advantageously be used in the operation and/or control of the LLC converter 100a.

As shown in FIG. 1A, the controller 114 receives a feedback signal FB, which is representative of an output of the LLC converter 100a, from the feedback network 112 and receives the buffered primary port signal $S_{PRI}$. According to the teachings herein, the control module 70 can advantageously use comprehensive signal content derived from the buffered primary port signal $S_{PRI}$ to regulate and control voltage and power delivered to the load. Additionally, the control module 70 may use the feedback signal FB and the buffered primary port signal $S_{PRI}$ to generate the drive signal CLKD.

Figure 1B:
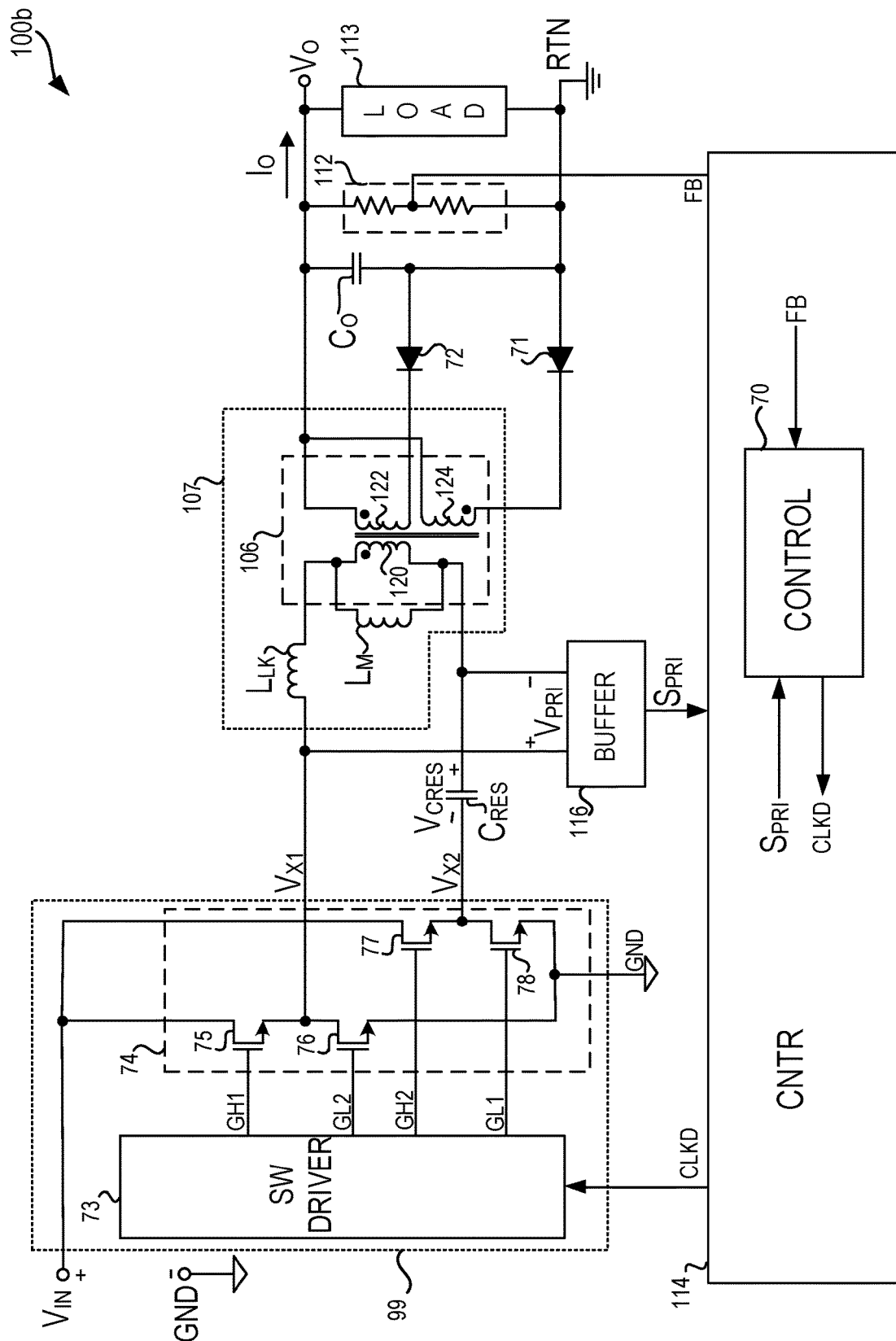
FIG. 1B illustrates an LLC converter for delivering output power to a load according to another embodiment.
Figure 1C:
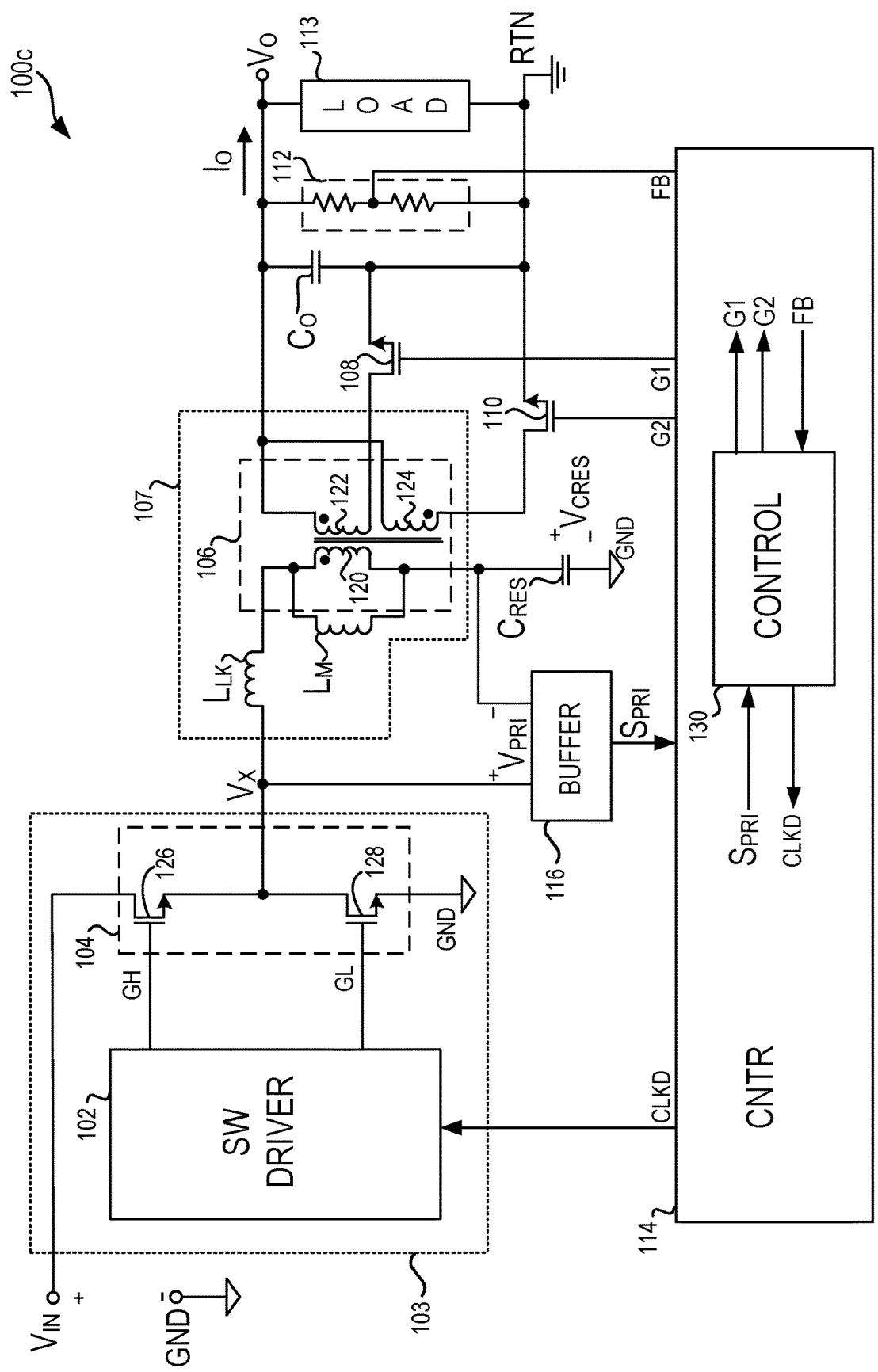
FIG. 1C illustrates an LLC converter for delivering output power to a load according to another embodiment.

Although FIG. 1A shows an LLC converter 100a using a half bridge 104 to provide the switched power signal $V_X$; other configurations using greater or fewer components as discussed regarding FIG. 1B and FIG. 1C are also possible.

FIG. 1B illustrates an LLC converter 100b for delivering output power to a load 113 according to another embodiment. The LLC converter 100b is similar to LLC converter 100a, except it uses primary bridge circuit 99. Unlike primary bridge circuit 103, primary bridge circuit 99 includes a switch driver 73 and a full bridge 74. The full bridge 74 includes a HS device 75, LS device 76, HS device 77, and LS device 78, each realized using power N-channel field effect transistors (NFETs).

As illustrated, the leakage inductor $L_{LK}$, the magnetizing inductor $L_M$, and the resonant capacitor $C_{RES}$ are connected in series between a first output of the primary bridge circuit 103 and a second output of the primary bridge. The control signals GH1, GL1, GH2, and GL2 may respectively control HS device 75, LS device 78, HS device 77, and LS device 76 so that a power signal $V_{X1}$ is provided to the resonant transformer at the first output and a power signal $V_{X2}$ is provided to the resonant capacitor $C_{RES}$ at the second output. In this way a switched power signal, determined by a difference of power signals $V_{X1}$ and $V_{X2}$, may be provided across the series connected leakage inductor $L_{LK}$, magnetizing inductor $L_M$, and resonant capacitor $C_{RES}$.

FIG. 1C illustrates an LLC converter 100c for delivering output power to a load 113 according to another embodiment. The LLC converter 100c is also similar to LLC converter 100a, except it replaces the rectifiers 71 and 72 with synchronous rectifiers 110 and 108, realized with power N-channel FETs, respectively; and it uses a control module 130 instead of control module 70. The control module 130 is similar to control module 70 except it generates control signals G1 and G2 to control synchronous rectifiers 108 and 110, respectively. Using synchronous rectifiers 108 and 110 may advantageously reduce a rectifier forward voltage drop.

Figure 1D:
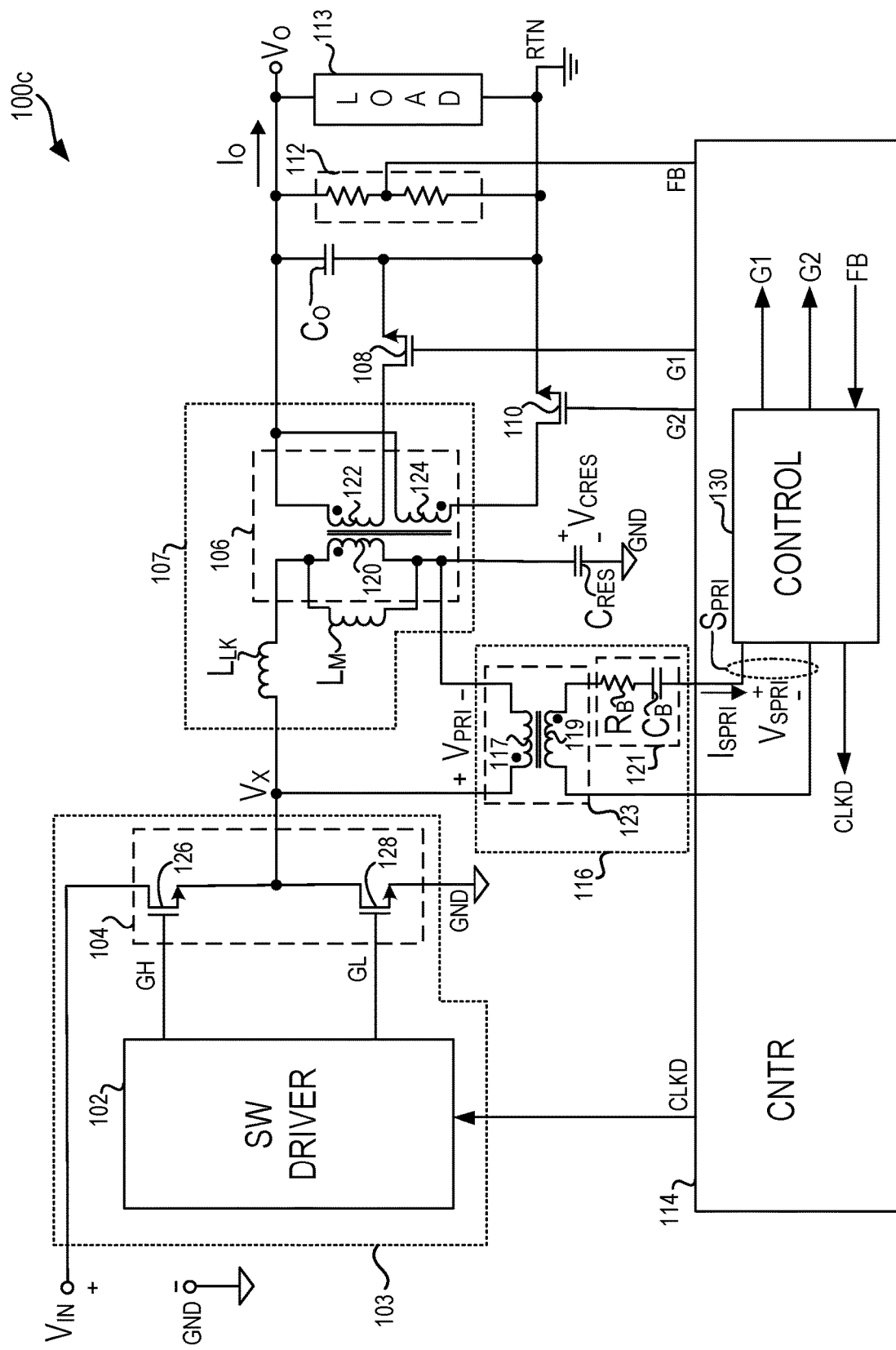
FIG. 1D illustrates additional circuit aspects of the LLC converter of FIG. 1C.

FIG. 1D illustrates additional circuit aspects of the LLC converter 100c of FIG. 1C. According to the embodiment of FIG. 1D, the buffer circuit 116 includes a transformer 123 and a coupling circuit 121. As shown in the example, transformer 123 includes a primary winding 117 and a secondary winding 119. Primary winding 117 is electrically connected in parallel with the series connected leakage inductor $L_{LK}$ and magnetizing inductor $L_M$ to receive a primary port signal $V_{PRI}$ having comprehensive signal content. Secondary winding 119 is coupled in series with the coupling circuit 121 and is electrically connected to the control module 130 to provide a buffered primary port signal $S_{PRI}$.

The primary port signal $V_{PRI}$ may also have large signal variations and dc voltage components (e.g., 380 volts) which are too high for safe operation of the control module 130. The transformer 123 may advantageously transfer the comprehensive signal content through the magnetic coupling of transformer 123; and the coupling circuit 121 may advantageously remove dc signal components and pass ac signal components. In this way the buffered primary port signal $S_{PRI}$ may be delivered to the control module 130 as a buffered primary port signal current $I_{SPRI}$ with a buffered primary port signal voltage $V_{SPRI}$. The buffered primary signal current $I_{SPRI}$ may be an ac current delivered to the control module 130; and the buffered primary port signal voltage $V_{SPRI}$ may advantageously have a dynamic voltage range of the control module 130 and/or of circuits within the control module 130.

Figure 1E:
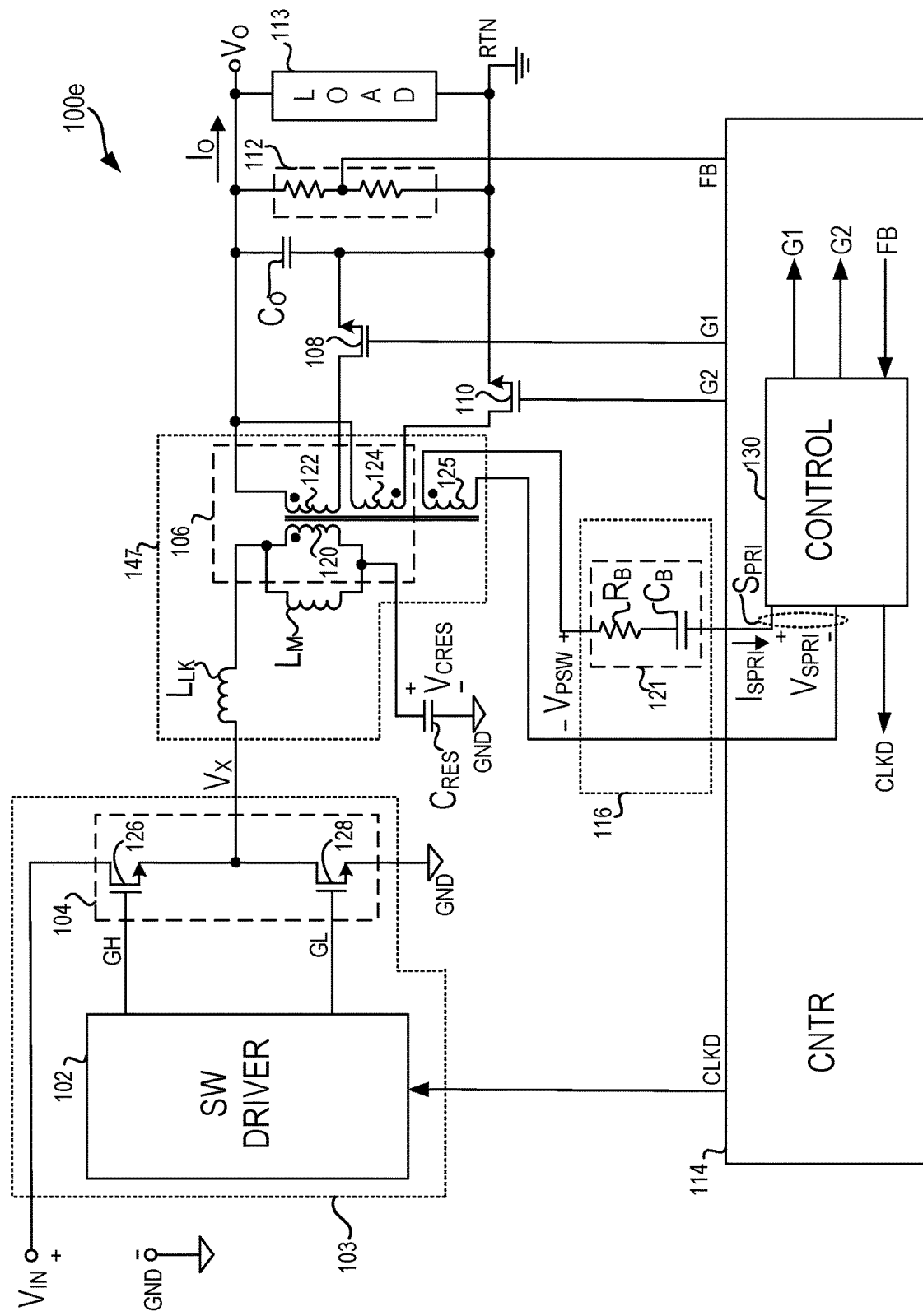
FIG. 1E illustrates an LLC converter using a resonant transformer according to another embodiment.

FIG. 1E illustrates an LLC converter 100e using a resonant transformer 147 according to another embodiment. The LLC converter 100e is similar to LLC converter 100c except it uses resonant transformer 147 to provide a primary port signal $V_{PSW}$; thus allowing the buffer circuit 116 to use fewer components (i.e., the coupling circuit 121). Resonant transformer 147 is similar to transformer 107 except it includes an auxiliary winding 125 magnetically coupled in parallel with or across the resonant transformer input end. As such, the auxiliary winding 125 is coupled in parallel with the series coupled leakage inductor $L_{LK}$ and magnetizing inductor $L_M$. The auxiliary winding 125 is also coupled in series with the coupling circuit 121.

Additionally, as discussed below regarding FIG. 2D, the auxiliary winding 125 can be physically wound to have a coupling with the series coupled leakage inductor $L_{LK}$ and magnetizing inductor $L_M$ so that it may be directly connected to the coupling circuit 121. In this way the auxiliary winding 125 with the coupling circuit 121 may be used to provide the buffered primary port signal $S_{PRI}$ to the control module 130; and the buffered primary port signal $S_{PRI}$ may be delivered as a buffered primary port signal current $I_{SPRI}$ with a buffered primary port signal voltage $V_{SPRI}$.

Figure 1F:
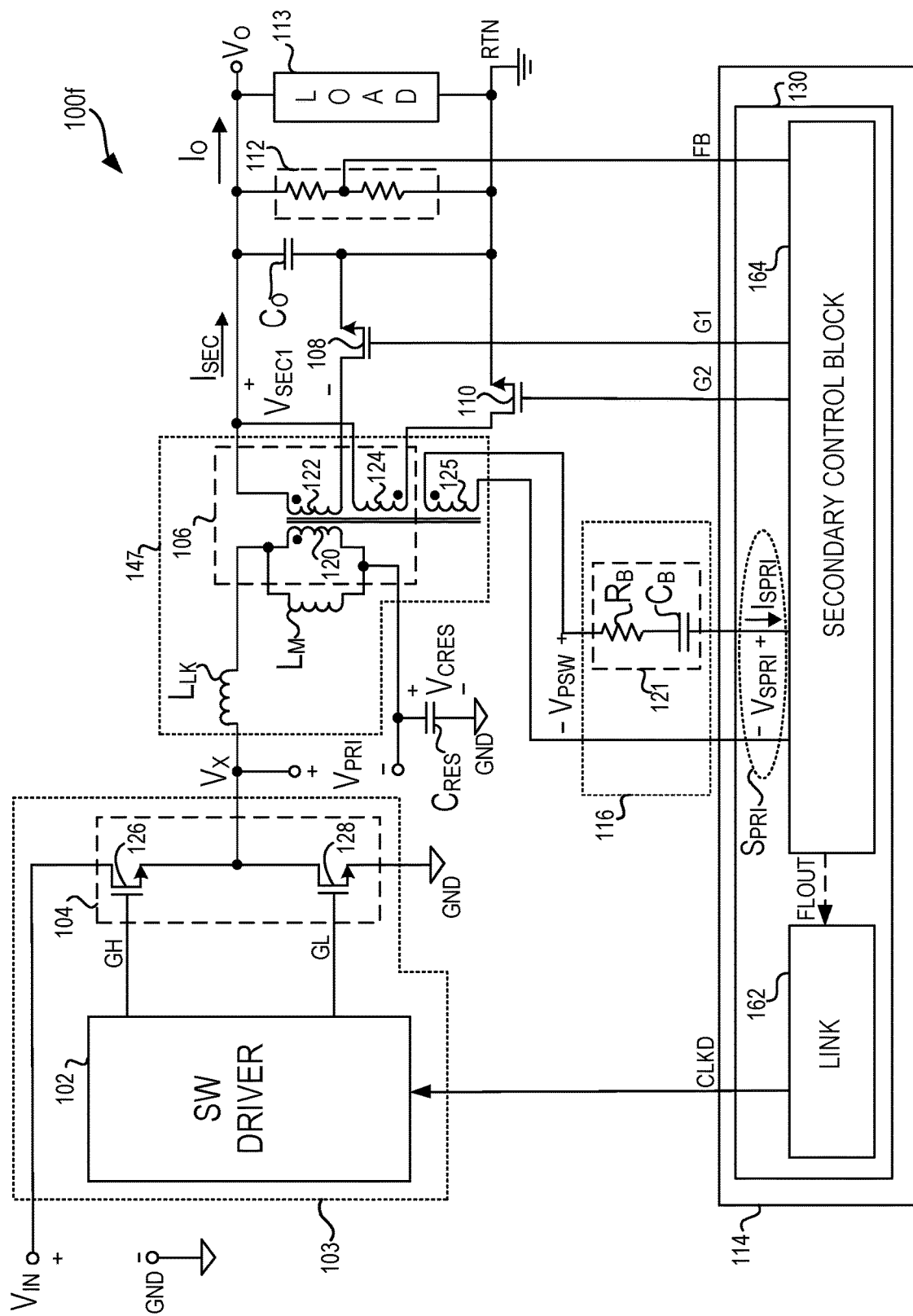
FIG. 1F illustrates an LLC converter according to another embodiment.

FIG. 1F illustrates an LLC converter 100f according to another embodiment. The control module 130 includes a secondary control block 164 and a link circuit 162. As illustrated the secondary control block 164 receives the buffered primary port signal $S_{PRI}$ as a buffered primary port signal current $I_{SPRI}$ with a buffered primary port signal voltage $V_{SPRI}$. The primary port signal voltage $V_{SPRI}$ may be level shifted to a voltage range of the secondary control block 164 relative to the secondary ground RTN. Also, the secondary control block 164 may provide and receive signals from the secondary side; for instance, the secondary control block 164 may receive the feedback signal FB and provide the control signals G1 and G2.

Additionally, the secondary control block 164 may be electrically referenced to the secondary ground RTN, thereby allowing the control module 130 to provide secondary side control and to operate at voltages relative to the secondary ground RTN. Also as shown, the secondary control block may communicate control information (e.g., information relating to the drive signal CLKD) via a linking signal FLOUT. The linking signal FLOUT may be transmitted by at least one of an opto-coupler, capacitive coupler, and/or by a magnetic interface so as to galvanically isolate the drive signal CLKD from the output side of the resonant converter and signals of the secondary control block 164 (e.g., the feedback signal FB and the control signals G1, G2). The drive signal CLKD may in turn be referenced to ground GND in the primary bridge circuit 103 and may be provided to the switch driver 102 to generate the control signals GH and GL.

Figure 1G:
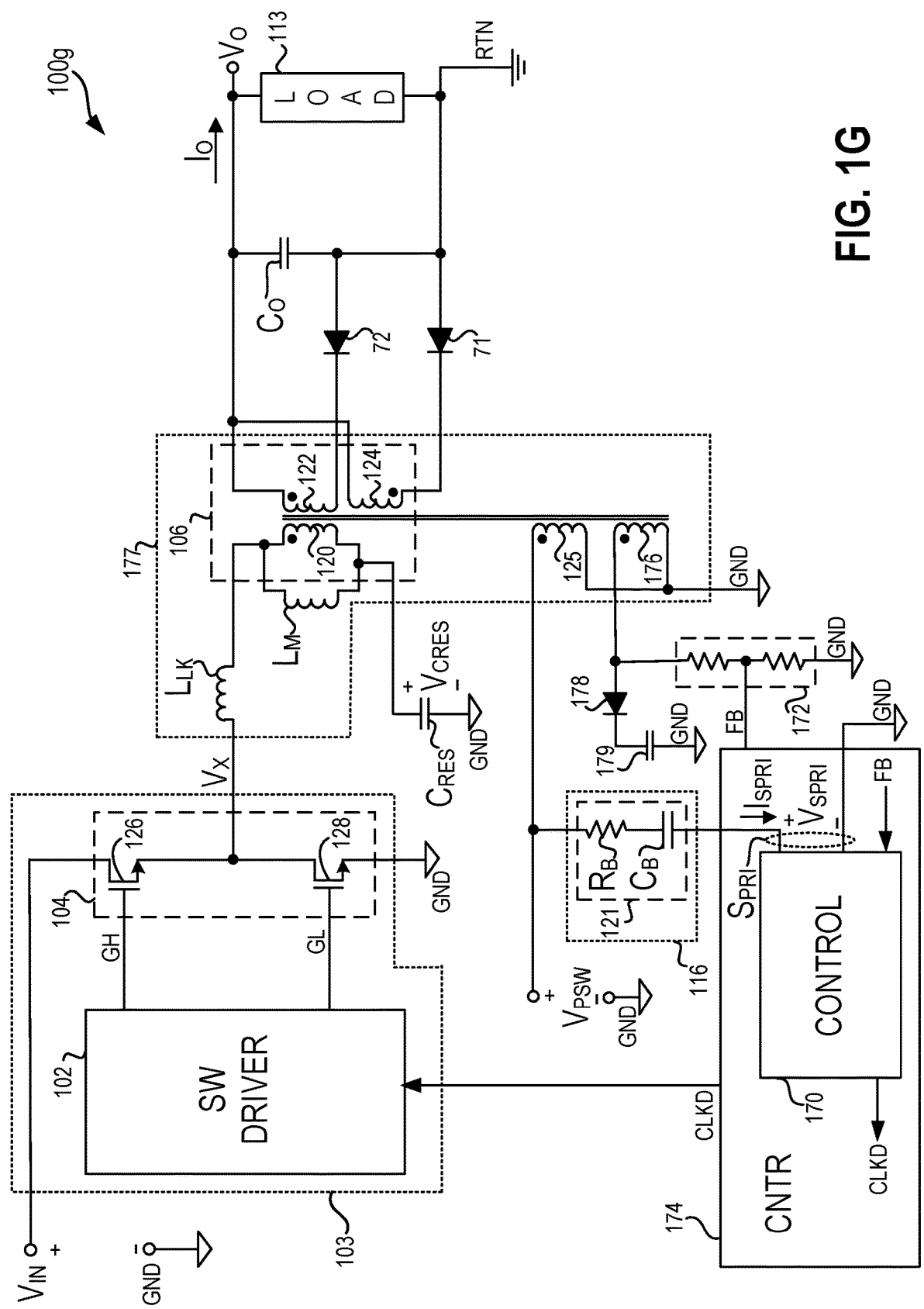
FIG. 1G illustrates an LLC converter with primary side control according to an embodiment.

Although FIG. 1F illustrates an LLC converter 100f using a secondary control block 164, other configurations using primary side control are possible. For instance, FIG. 1G illustrates an LLC converter 100g with primary side control according to an embodiment. The LLC converter 100g includes the primary bridge circuit 103, the buffer circuit 116, a resonant transformer 177, and a controller 174.

The resonant transformer 177 is similar to the resonant transformer 147, except it includes a primary bias winding 176. Also, the secondary side of LLC converter 100g is similar to that of LLC converter 100b with coupling to the secondary windings 122, 124. However, LLC converter 100g does not use a feedback network 112 on the secondary side; instead, LLC converter 100g uses a feedback network 172 referenced to ground GND on the primary side. The primary bias winding 176 is electrically connected with the feedback network 172 to provide the feedback signal FB to the controller 174. Additionally, the rectifier 178 and the capacitor 179 are electrically coupled to the primary bias winding 176 to reduce variation in the feedback signal FB.

The controller 174 includes the control module 170. Control module 170 may be configured to operate similar to control module 130, except control module 170 is electrically referenced to ground GND on the primary side (i.e., the primary ground) so as to provide primary side control. Accordingly, the auxiliary winding 125 may be magnetically coupled to provide the primary port signal $V_{PSW}$ relative to ground GND.

Compared to LLC converter 100f, LLC converter 100g may also be configured to operate at higher frequencies by virtue of using the control module 170 on the primary side. For instance, by having the control module 170 on the primary side, the controller 174 may advantageously provide the drive signal CLKD without requiring the linking signal FLOUT. In this way, delay within the control module 170 may be reduced. Reducing delay may, in turn, allow the drive signal CLKD of LLC converter 100g to have a higher frequency than that of LLC converter 100f.

Figure 1H:
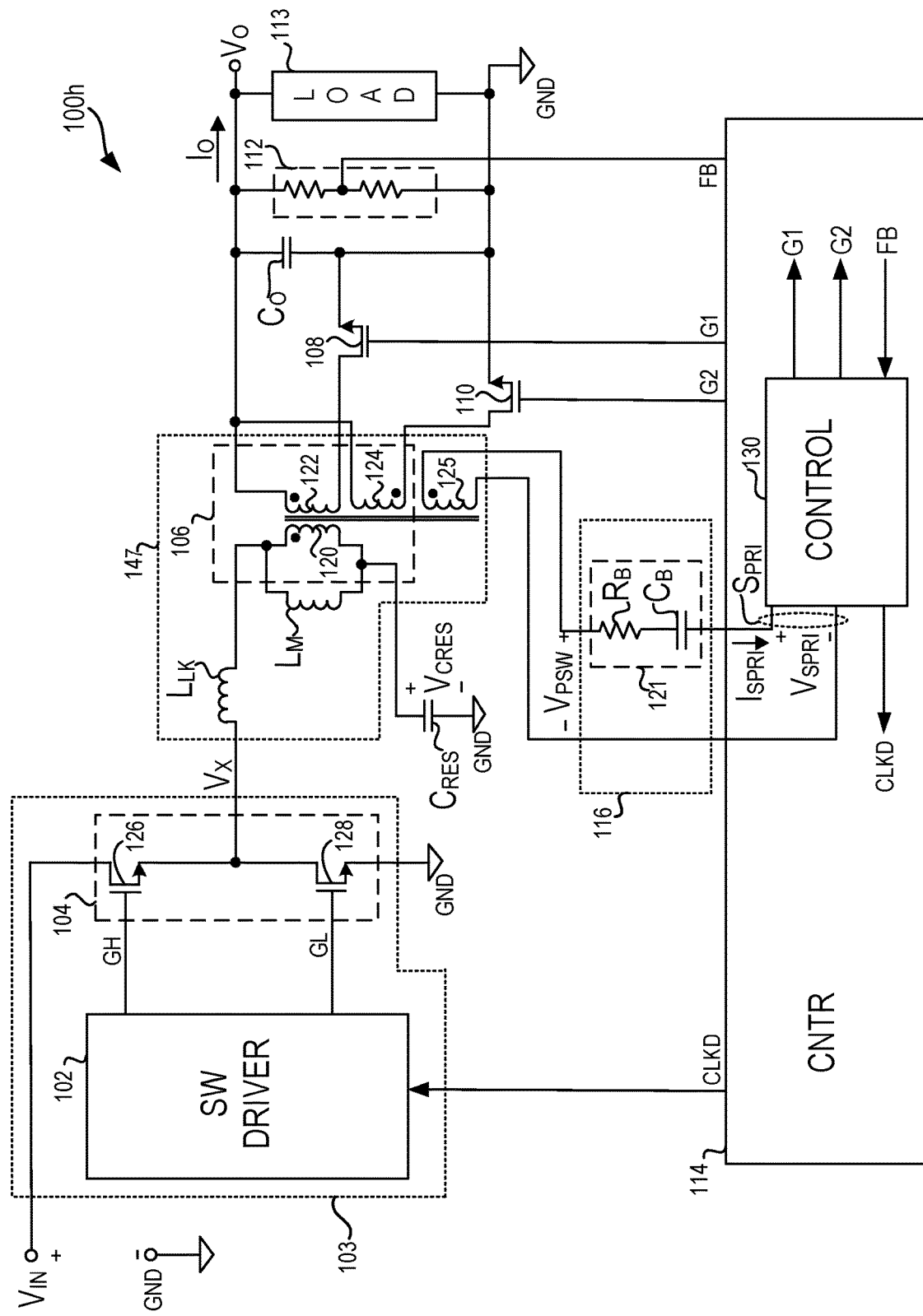
FIG. 1H illustrates a non-isolated LLC converter according to an embodiment.

Although FIGS. 1A-1G illustrate LLC converters having a primary side connected to ground GND and a secondary side connected to a secondary ground RTN; other converter configurations are possible. For instance, FIG. 1H illustrates a non-isolated LLC converter 100h according to an embodiment. The non-isolated LLC converter 100h is similar to LLC converter 100e, except it is configured as a non-isolated resonant converter with the primary side and the secondary side both connected to ground GND.

Figure 2A:
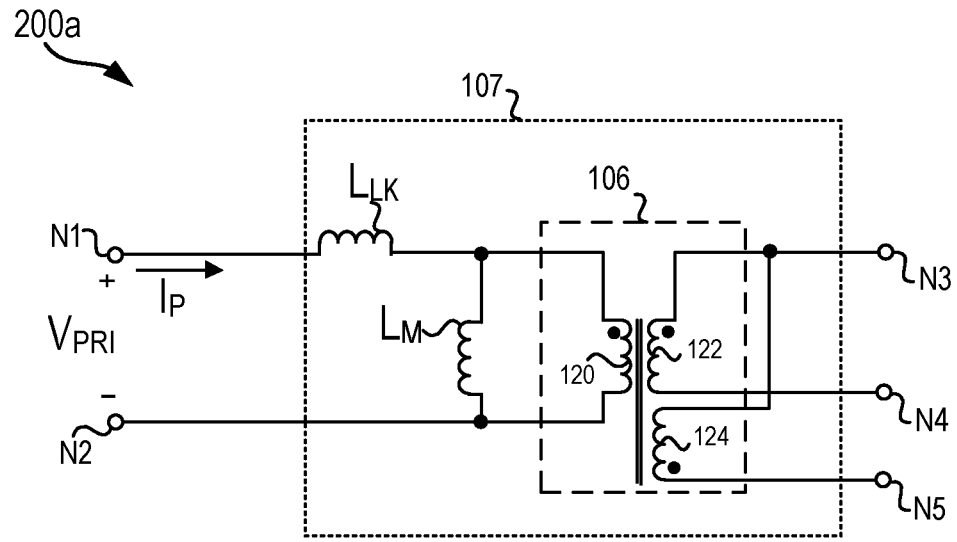
FIG. 2A illustrates a schematic diagram of a resonant transformer according to the teachings herein.

FIG. 2A illustrates a schematic diagram 200a of a resonant transformer 107 according to the teachings herein. The schematic diagram 200a illustrates the resonant transformer 107 as a multi-port network with port terminals N1-N5. As illustrated the leakage inductor $L_{LK}$ and magnetizing inductor $L_M$ are connected in series between port terminal N1 and port terminal N2 forming a resonant transformer input port. Also, secondary winding 122 of transformer 106 is connected between port terminal N3 and port terminal N4 forming a first output port; and secondary winding 124 is connected between port terminal N3 and N5 forming a second output port.

As illustrated, during operation the primary port signal $V_{PRI}$ may be a voltage provided at the input port with an input port current $I_P$. The primary port signal $V_{PRI}$ can have comprehensive signal content with large voltage variations (e.g., in one example variations between plus and minus 380 volts). According to the teachings herein the primary port signal $V_{PRI}$ may be buffered as described below.

Figure 2B:
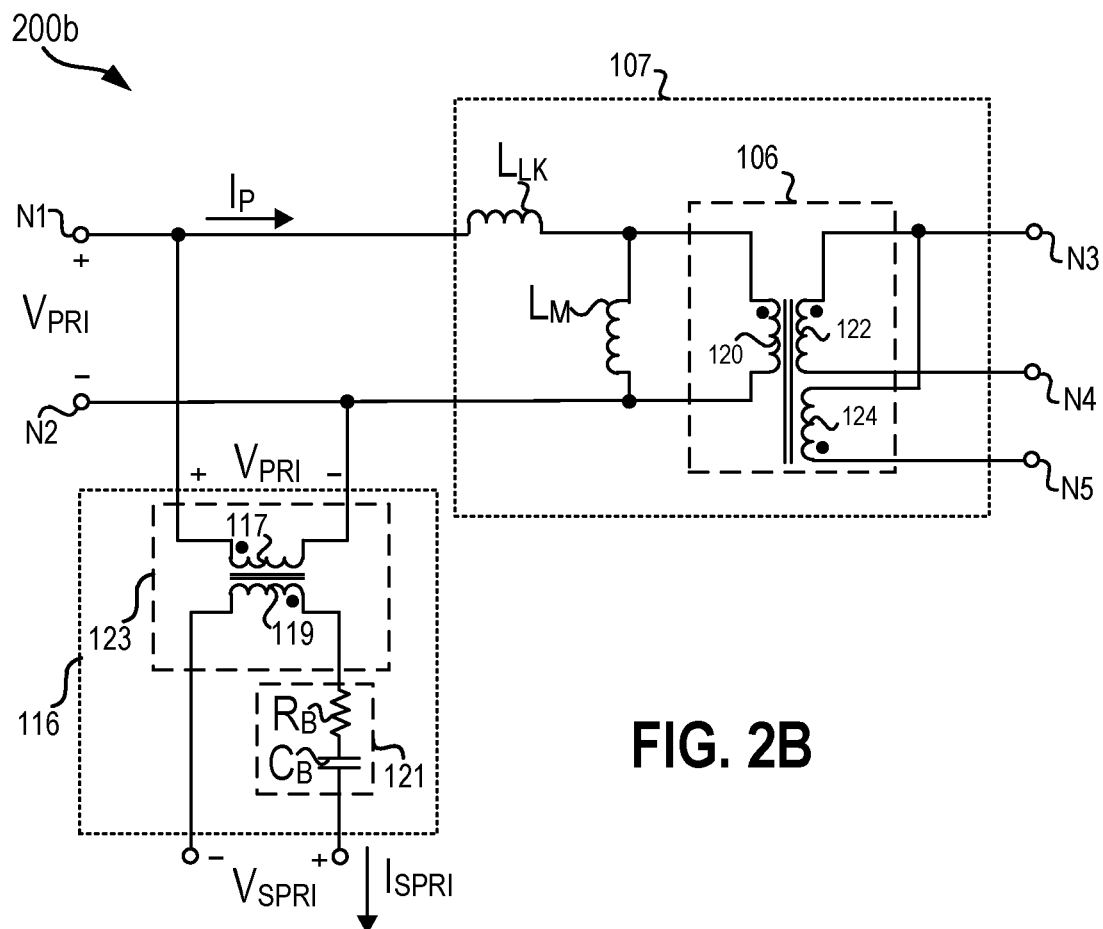
FIG. 2B illustrates a schematic diagram of a buffer circuit coupled to the resonant transformer according to an embodiment.

FIG. 2B illustrates a schematic diagram 200b of a buffer circuit 116 coupled to the resonant transformer 107 across or in parallel with the input port of resonant transformer 107 according to an embodiment. The buffer circuit 116 uses transformer 123 to sample the primary port signal $V_{PRI}$. The primary winding 117 is connected between the port nodes N1 and N2 in parallel with the resonant transformer input port so that the transformer 123 directly receives the primary port signal $V_{PRI}$. The transformer 123 may magnetically couple the primary port signal $V_{PRI}$ to the secondary winding 119; and the secondary winding 119 with coupling circuit 121 may provide the buffered primary port signal current $I_{SPRI}$ as an ac current. Advantageously, the buffered primary port signal current $I_{SPRI}$ may transfer the comprehensive signal content to the control module 130 with a buffered primary port signal voltage $V_{SPRI}$ having lower voltage (e.g., 5 volts).

As one of ordinary skill in the art can appreciate, the leakage inductor $L_{LK}$ shown in schematics 200a and 200b can be implemented in a resonant transformer 107 in different ways. For instance, the leakage inductor $L_{LK}$ may be a separate magnetic structure physically attached in series external to the magnetizing inductor $L_M$; alternatively, and additionally, the leakage inductor $L_{LK}$ can be an integrated magnetic structure physically wound in series inside with the magnetizing inductor $L_M$ as described regarding FIG. 2C and FIG. 2D.

Figure 2C:
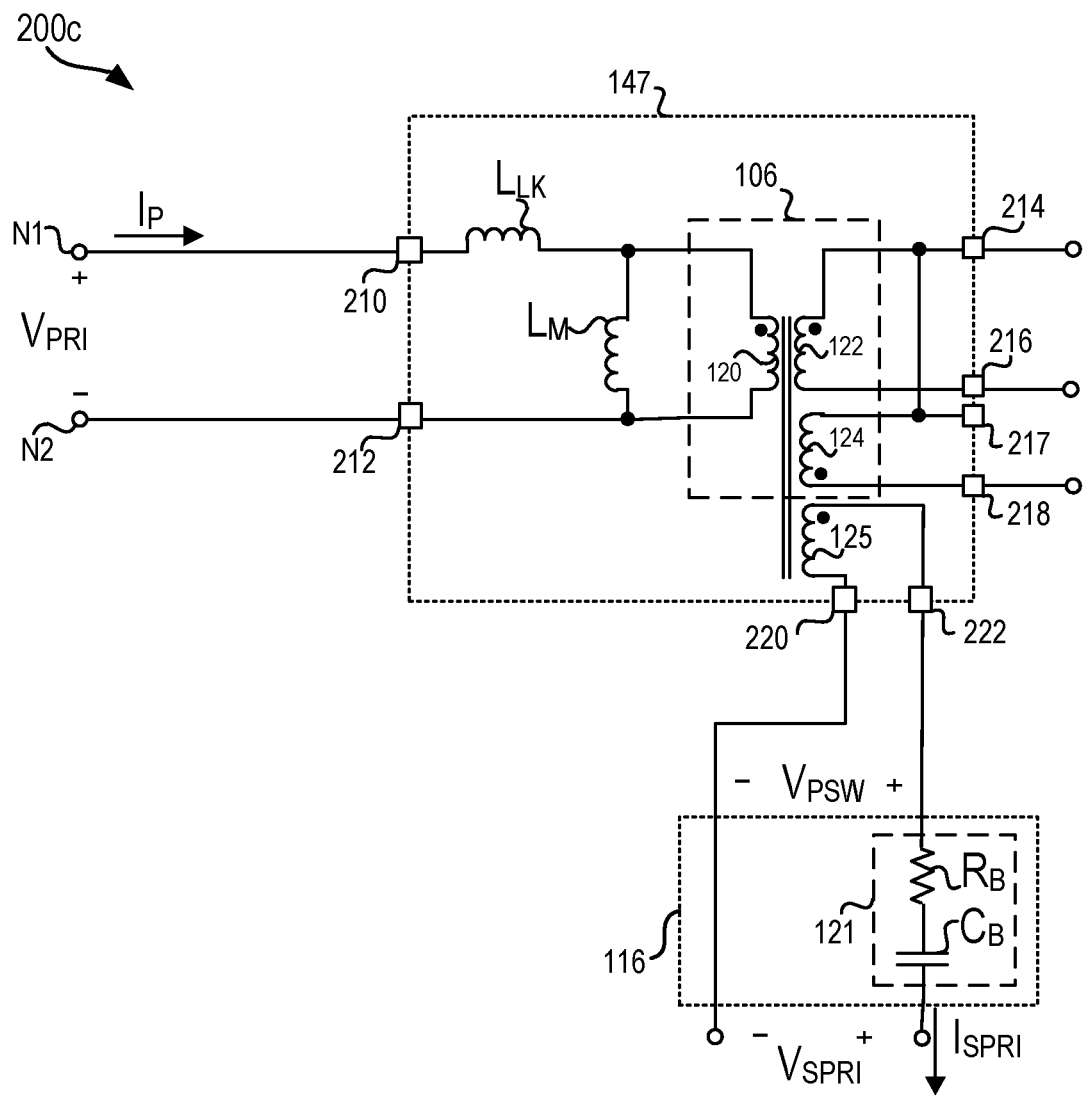
FIG. 2C illustrates a schematic diagram of a resonant transformer and filter according to another embodiment.
Figure 2D:
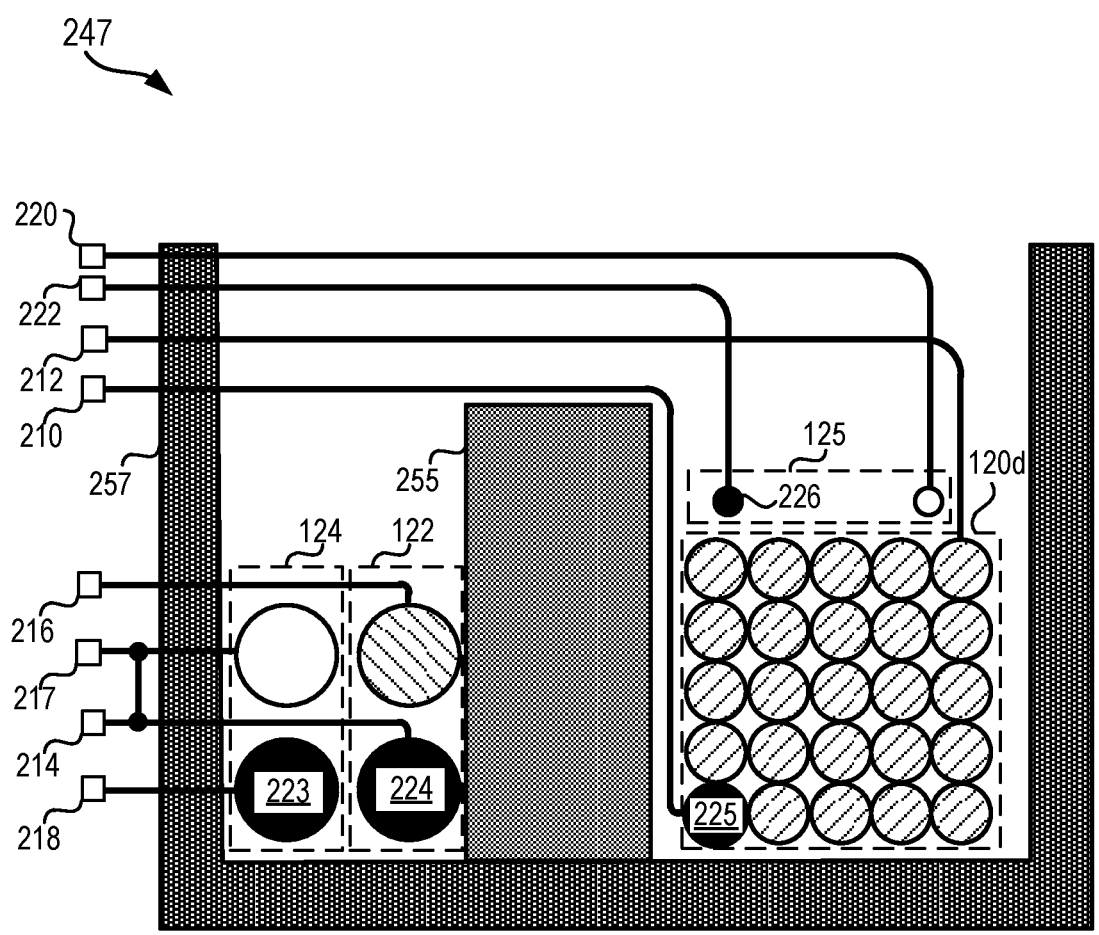
FIG. 2D illustrates a winding diagram for realizing the resonant transformer of FIG. 2C.

FIG. 2C illustrates a schematic diagram 200c of a resonant transformer 147 and coupling circuit 121 according to another embodiment; and FIG. 2D illustrates a winding diagram 247 for realizing the resonant transformer 147 of FIG. 2C. As shown in schematic diagram 200c of FIG. 2C, the resonant transformer 147 includes the auxiliary winding 125 to magnetically couple the primary port signal $V_{PRI}$ from the resonant transformer input port between port terminals N1 and N2. The resonant transformer 147 may be physically wound to have transformer winding terminals 210, 212, 214, 216, 217, 218, 220, and 222; and the leakage inductor $L_{LK}$ and the magnetizing inductor $L_M$ may be physically wound in an integrated magnetic structure, the resonant transformer 147 in a series connection between port terminals N1 and N2.

Also as shown in schematic 200c, the auxiliary winding 125 may be magnetically coupled to provide the primary port signal $V_{PSW}$. The primary port signal $V_{PSW}$ may be filtered by coupling circuit 121 to provide the buffered primary port signal current $I_{SPRI}$ with a buffered primary port signal voltage $V_{SPRI}$.

The winding diagram 247 in FIG. 2D shows the upper half of a cross section of a resonant transformer 147 realized with a winding 120d, an auxiliary winding 125, a secondary winding 122, and a secondary winding 124, each showing wire cross sections as wound inside a transformer bobbin 257. The wire cross sections of the winding 120d, auxiliary winding 125, and secondary windings 122, 124 are delineated with fill patterns and include solid filled cross sections 223-226 to delineate the start of a winding. For instance, cross section 223 may indicate where winding 124 begins while cross section 226 may indicate where winding 125 begins. Also, in the example of winding diagram 247, the wrapping directions of winding 120d, auxiliary winding 125, and secondary windings 122, 124 are the same. However, as one of ordinary skill in the art can appreciate, other wrapping configurations are possible. For instance, auxiliary winding 125 may be wrapped in an opposite direction to that of winding 120d.

In the embodiment shown in winding diagram 247, the secondary windings 122 and 124 are wrapped on one side of a bobbin separator 255. Secondary winding 122 is electrically connected by winding terminals 214 and 216; and secondary winding 124 is electrically connected by winding terminals 217 and 218. Also, consistent with FIG. 2C, winding terminal 214 is electrically connected to winding terminal 217.

Additionally, the primary winding 120, the magnetizing inductor $L_M$, and the leakage inductor $L_{LK}$ may be realized physically by winding 120d electrically connected between transformer winding terminals 210 and 212 on the other side of the bobbin separator 255. In this way the primary winding 120, magnetizing inductor $L_M$, and the leakage inductor $L_{LK}$ may represent a lumped model of winding 120d.

Also as illustrated, the auxiliary winding 125 is shown wrapping around winding 120d with fewer wraps (e.g., in one example shown using two wraps). In this way the auxiliary winding 125 may have magnetic coupling with the series connected leakage inductor $L_{LK}$ and magnetizing inductor $L_M$ to provide a scaled replica primary port signal $V_{PSW}$. For instance, in one example, the primary port signal $V_{PSW}$ output by auxiliary winding 125 is scaled with a coupling coefficient k relating to the auxiliary winding 125, where k may be a number between zero and one, or alternatively may be a number greater than one, depending upon the number of winding wraps. Thus, the primary port signal $V_{PSW}$ provided by auxiliary winding 125, in turn, may be scaled to a lower voltage (e.g., 30 volts) than primary port signal $V_{PRI}$.

Figure 2E:
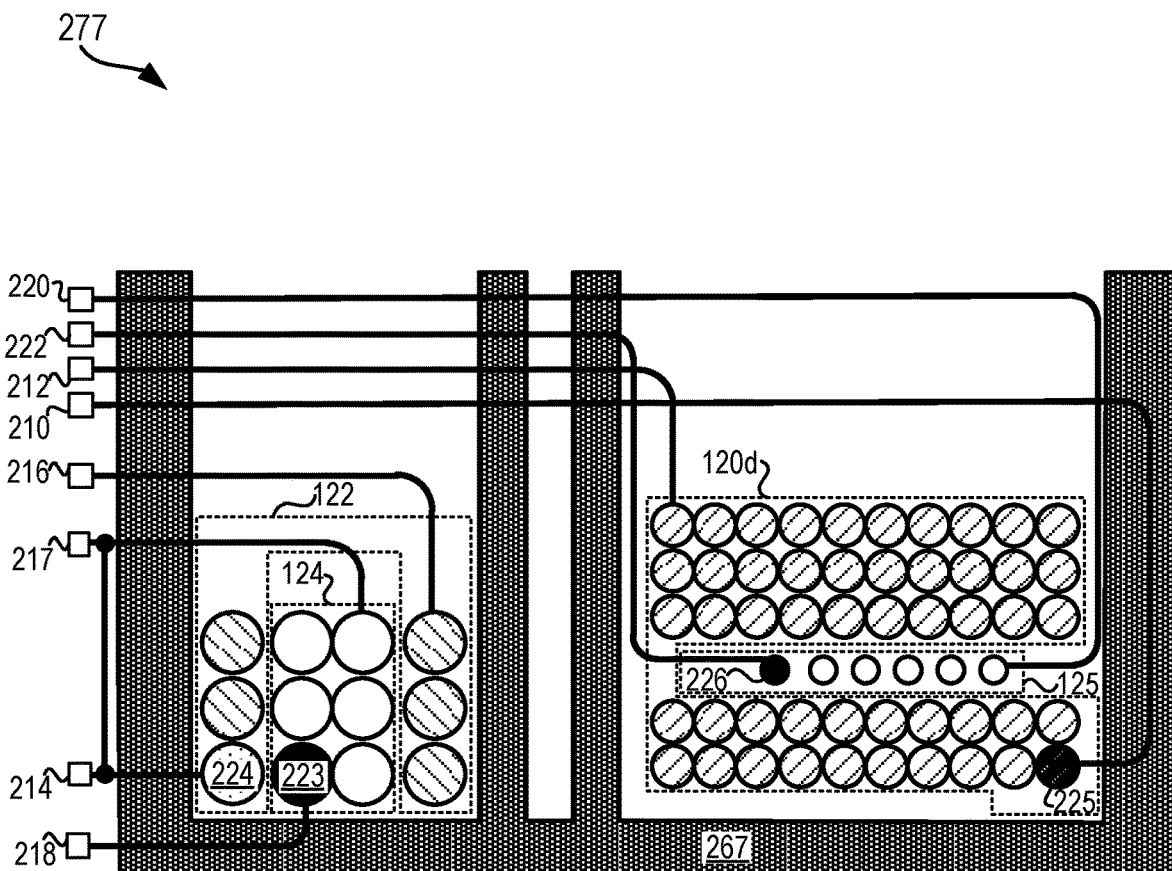
FIG. 2E illustrates another winding diagram for realizing the resonant transformer of FIG. 2C.

Although FIG. 2D shows a winding diagram 247 for realizing the resonant transformer of FIG. 2C with a transformer bobbin 257, other winding diagrams are possible. For instance, FIG. 2E illustrates another winding diagram 277 for realizing the resonant transformer of FIG. 2C. Winding diagram 277 is similar to winding diagram 247 except winding 120d, auxiliary winding 125, and secondary windings 122, 124 have a different wrapping configuration around a transformer bobbin 267. As illustrated in winding diagram 277, the secondary winding 124 may be wrapped to have winding wraps between those of the secondary winding 122. Similarly, the auxiliary winding 125 may be wrapped to have winding wraps between those of winding 120d.

Figure 3:
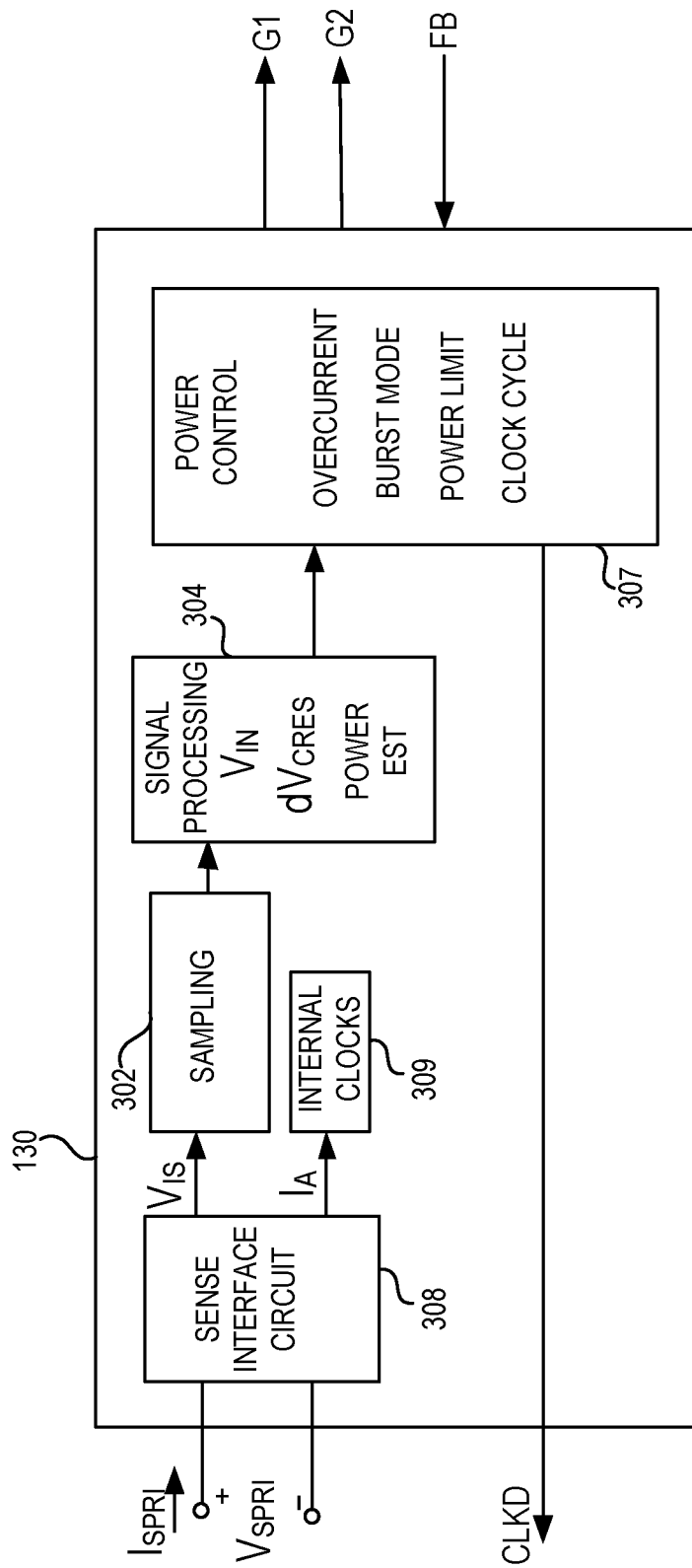
FIG. 3 illustrates a system diagram of the control module using a sense interface circuit according to the teachings herein.

FIG. 3 illustrates a system diagram of a control module 130 according to an embodiment. The control module 130 includes a sense interface circuit 308, a sampling block 302, internal clocks 309, a signal processing block 304, and a power control block 307. As described above the control module 130 receives the feedback signal FB, the buffered primary port signal current $I_{SPRI}$, and the corresponding buffered primary port signal voltage $V_{SPRI}$; the control module 130 provides the control signals G1, G2, and drive signal CLKD.

According to the teachings herein, the control module 130 can use the sense interface circuit 308 to receive the buffered primary port signal current $I_{SPRI}$ and the corresponding buffered primary port signal voltage $V_{SPRI}$ may be level shifted to a voltage range of the control module 130.

Additionally, the sense interface circuit 308 may convert the buffered primary port signal current $I_{SPRI}$ into sense interface signals $V_{IS}$ and $I_A$. The sense interface circuit 308 may provide the sense interface signal $V_{IS}$ to the sampling block 302 as a scaled replica of the primary port signal $V_{PRI}$ and/or primary port signal $V_{PSW}$. The sampling block 302 may in turn sample data points of the sensed interface signal $V_{IS}$ and provide the sampled data points to the signal processing block 304. Additionally the sense interface circuit may provide the sense interface signal $I_A$ to the internal clocks 309. The internal clocks 309 may advantageously use the sense interface signal $I_A$ for sampling and for creating delayed clock signals, representative of the switching of the HS device 126 and LS device 128, based on the primary port signal $V_{PRI}$ and/or primary port signal $V_{PSW}$.

As will be further discussed below with respect to the switching waveforms of FIGS. 4A-4E, the signal processing block 304 may extract comprehensive signal information from the sampled data points. For instance, the signal processing block 304 may use sampled data points from the sense interface signal $V_{IS}$ to calculate at least one of input voltage $V_{IN}$, an incremental resonant capacitor voltage change $dV_{CRES}$, and output power $P_{OUT}$. Also, the signal processing block 304 may provide one or more of the input voltage $V_{IN}$, incremental resonant capacitor voltage change $dV_{CRES}$, and an estimate of the output power $P_{OUT}$ to the power control block 307.

As illustrated the power control block 307 may in turn control power by providing the drive signal CLKD to the primary bridge circuit 103 based on one or more of the input voltage $V_{IN}$, incremental resonant capacitor voltage change $dV_{CRES}$, and output power $P_{OUT}$. Alternatively, and additionally the power control block 307 may also provide overcurrent protection, burst mode power level detection, power limit, and clock cycle control based, at least in part, on the estimated output power $P_{OUT}$.

Figure 4A:
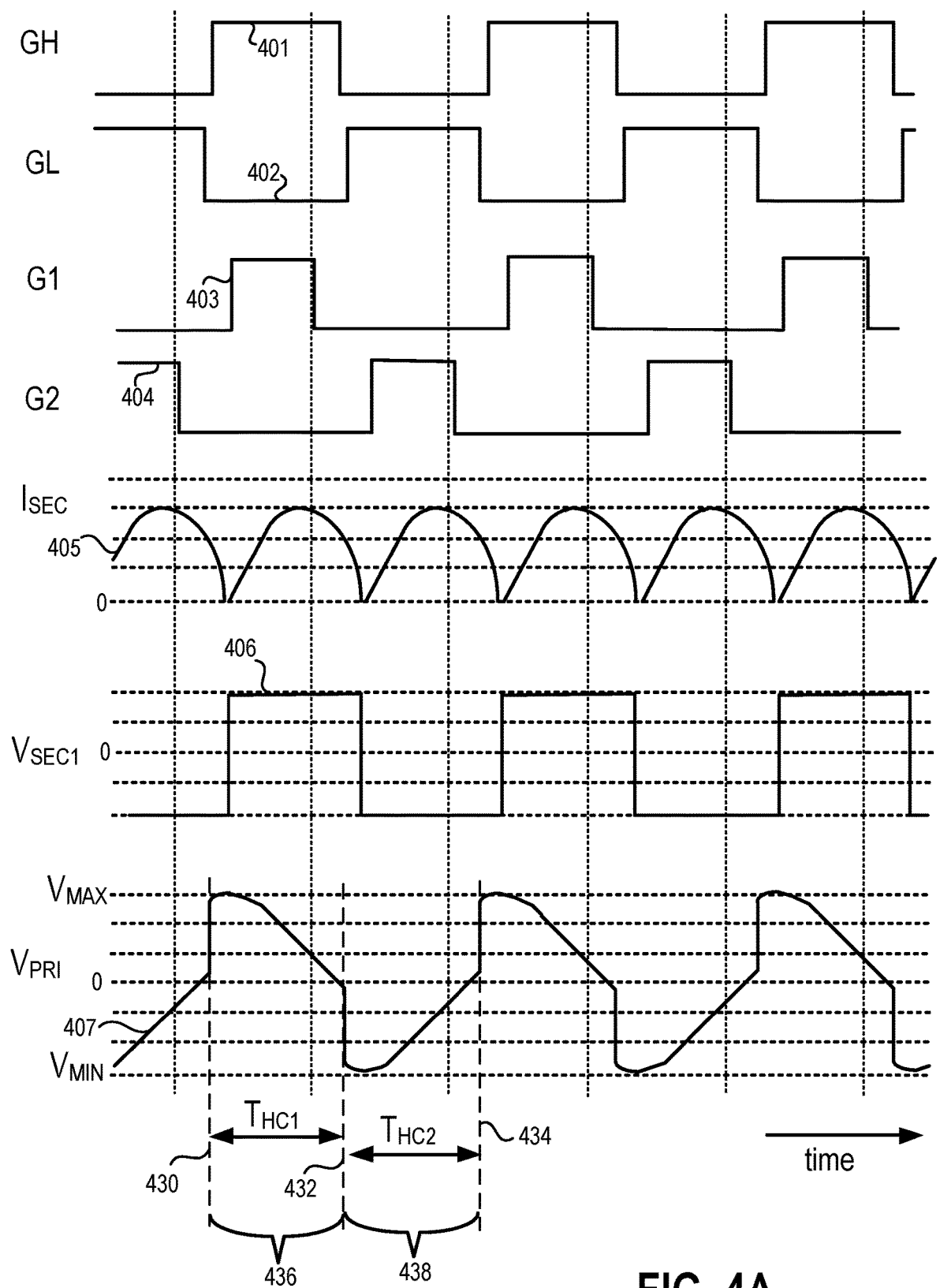
FIG. 4A illustrates switching signal waveforms of an LLC converter according to an embodiment.

FIG. 4A illustrates switching signal waveforms 401-407 of an LLC converter 400f according to an embodiment. Referring to FIG. 1F, waveforms 401, 402, 403, and 404 may correspond to waveforms of the control signals GH, GL, G1, and G2, in units of volts versus time, respectively; and waveforms 405 and 406 may correspond to a secondary current $I_{SEC}$ and a secondary voltage $V_{SEC1}$, respectively. With reference to FIG. 1F, the secondary voltage $V_{SEC1}$ is a voltage across the secondary winding 122; and the secondary current $I_{SEC}$ is a current delivered to the output capacitor Co from the secondary windings 122 and 124.

Also referring to FIG. 1F, waveform 407 is a waveform of the primary port signal $V_{PRI}$ versus time. In FIG. 4A waveform 407 exhibits a first half cycle 436 of duration $T_{HC1}$ between times 430 and 432 and also a second half cycle 438 of duration $T_{HC2}$ between times 432 and 434. Additionally, waveform 407 may have a period equal to or substantially equal to the sum of the durations $T_{HC1}$ and $T_{HC2}$. During the first half cycle 436, the HS device 126 may be on so that the primary port signal $V_{PRI}$ reaches a large maximum voltage $V_{MAX}$ (e.g., 380 volts). Accordingly, the first half cycle 436 may also be referred to as a "positive half cycle." During the second half cycle 438, the LS device 128 may be on so that the primary port signal $V_{PRI}$ reaches a large minimum voltage $V_{MIN}$ (e.g., minus 380 volts). Accordingly, the second half cycle 438 may be referred to as a "negative half cycle." Switching in this manner may continue during a continuous switching mode of the LLC converter 100f, and a switching frequency Fsw may be determined by the inverse of the period of waveform 407.

Primary Port Signal Characteristics

According to the teachings herein the primary port signal may include comprehensive signal information relating to both input power and output power.

Figure 4B:
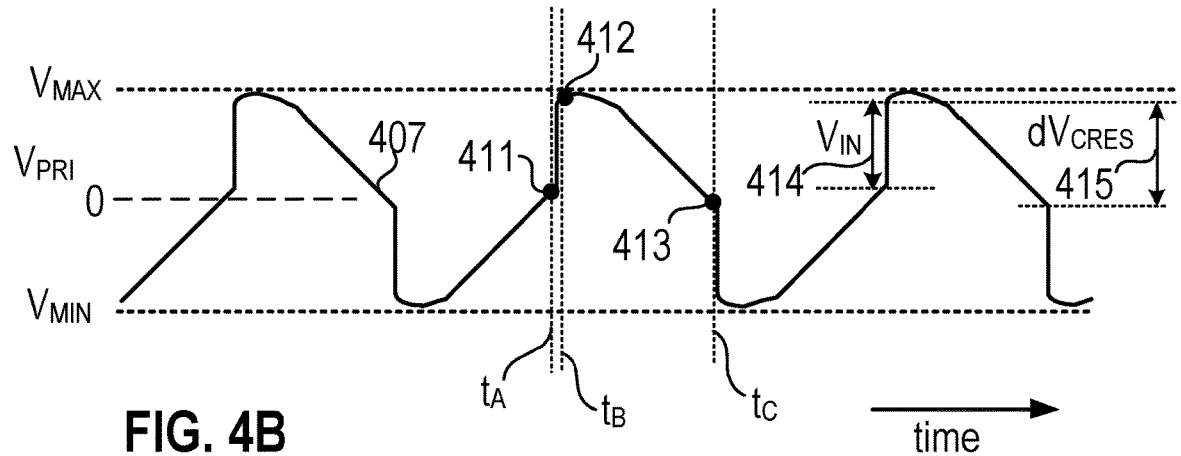
FIG. 4B illustrates a waveform of a primary port signal in an LLC converter according to an embodiment.

FIG. 4B illustrates a waveform 407 of a primary port signal $V_{PRI}$ in an LLC converter (e.g., any of LLC converters 100a-100f of FIGS. 1A-1F) according to an embodiment. Waveform 407 illustrates comprehensive signal content. For instance, during a positive half cycle, waveform 407 may undergo a step 414 of magnitude equal to and/or substantially equal to the input voltage $V_{IN}$. Additionally, during the positive half cycle, waveform 407 will decrease by a voltage difference 415 relating to an amount of power delivered to the load 113. The voltage difference 415 can have a magnitude equal to and/or substantially equal to the incremental resonant capacitor voltage change $dV_{CRES}$ of the voltage $V_{CRES}$ across the resonant capacitor $C_{RES}$.

Accordingly, three waveform data points 411, 412, and 413 at times $t_A$, $t_B$, and $t_C$, respectively, may also represent the comprehensive signal content. The data point 411 can include the value of the primary port signal $V_{PRI}$ just prior to a step (e.g., signal magnitude step 414) and the data point 412 can include the value of the primary port signal $V_{PRI}$ at or just following the magnitude step 414. Thus, a difference of the voltage values of data points 412 and 411 may equal and/or substantially equal the input voltage $V_{IN}$. Also, the time difference between times $t_A$ and $t_B$ represents the half bridge slew time. Similarly, the data point 413 can include the value of the primary port signal $V_{PRI}$ at or near the end of the positive half cycle so that a difference of the voltage values of data points 413 and 412 may equal and/or substantially equal the incremental resonant capacitor voltage change $dV_{CRES}$. From the switching frequency Fsw, the incremental resonant capacitor voltage change $dV_{CRES}$, the capacitance $C_R$ of the resonant capacitor $C_{RES}$, and the input voltage $V_{IN}$, the input power $P_{IN}$ may be calculated by equation 1.

$$P_{IN} = 0.5 \cdot C_R \cdot dV_{CRES} \cdot V_{IN}/(t_C - t_B) \qquad \text{EQ. 1}$$

Output power $P_{OUT}$ may, in turn, be calculated from equation 2 in terms of the input power $P_{IN}$ and the power conversion efficiency $\eta_{eff}$.

$$P_{OUT} = \eta_{eff} \cdot P_{IN} \qquad \text{EQ. 2}$$

Figure 4C:
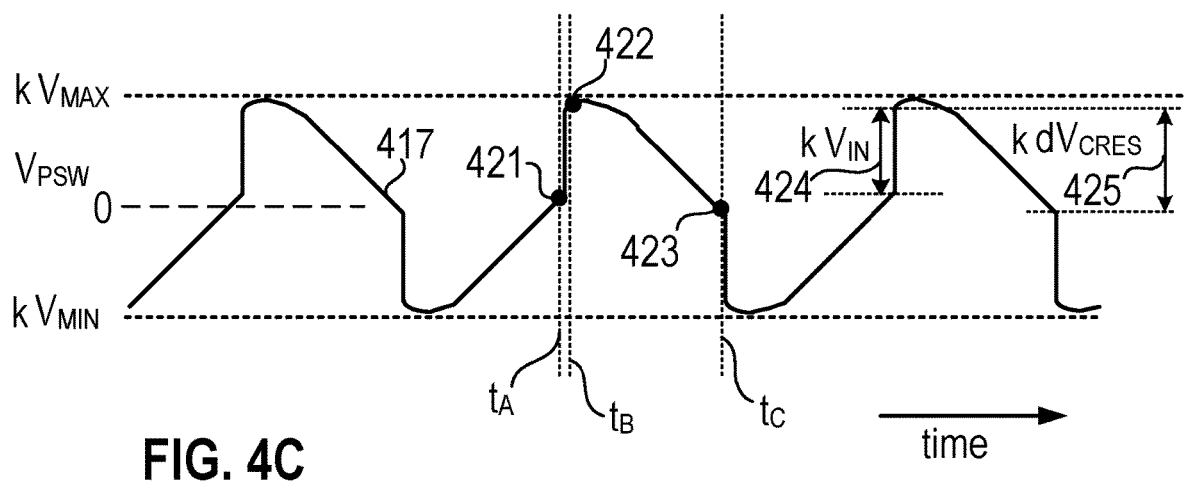
FIG. 4C illustrates another waveform of a primary port signal in an LLC converter according to an embodiment.

FIG. 4C illustrates another waveform 417 of a primary port signal $V_{PSW}$ in an LLC converter (e.g., LLC converter 100e and/or LLC converter 100f). Waveform 417 follows waveform 407 to provide comprehensive signal content, except the waveform 417 is scaled by a coupling coefficient k relating to the auxiliary winding 125. As discussed regarding FIG. 2D, the coupling coefficient k may be a number between zero and one, or alternatively may be a number greater than one, depending upon the number of winding wraps.

Thus, waveform 417 may undergo a step 424 of magnitude equal to and/or substantially equal to the input voltage $V_{IN}$ scaled by the coupling coefficient k; and during the positive half cycle, waveform 417 will decrease by a voltage difference 425 having a magnitude equal to and/or substantially equal to the incremental resonant capacitor voltage change $dV_{CRES}$ also scaled by the coupling coefficient k. Additionally, the three waveform data points 421, 422, and 423 at times $t_A$, $t_B$, and $t_C$, respectively, may also represent the comprehensive signal content like data points 411, 412, and 413; except data points 421, 422, and 423 are also scaled in voltage by the coupling coefficient k.

As illustrated by waveforms 407 and 417 both primary port signal $V_{PRI}$ and $V_{PSW}$ may exhibit large positive voltage and negative voltage variation (e.g., in one example 400V). According to the teachings herein, the sense interface circuit 308 may convert a buffered primary port signal current $I_{SPRI}$ into the sense interface signal $V_{IS}$ as a scaled replica of the primary port signal $V_{PRI}$ and/or primary port signal $V_{PSW}$ so that it may be used by control module 130.

Figure 4D:
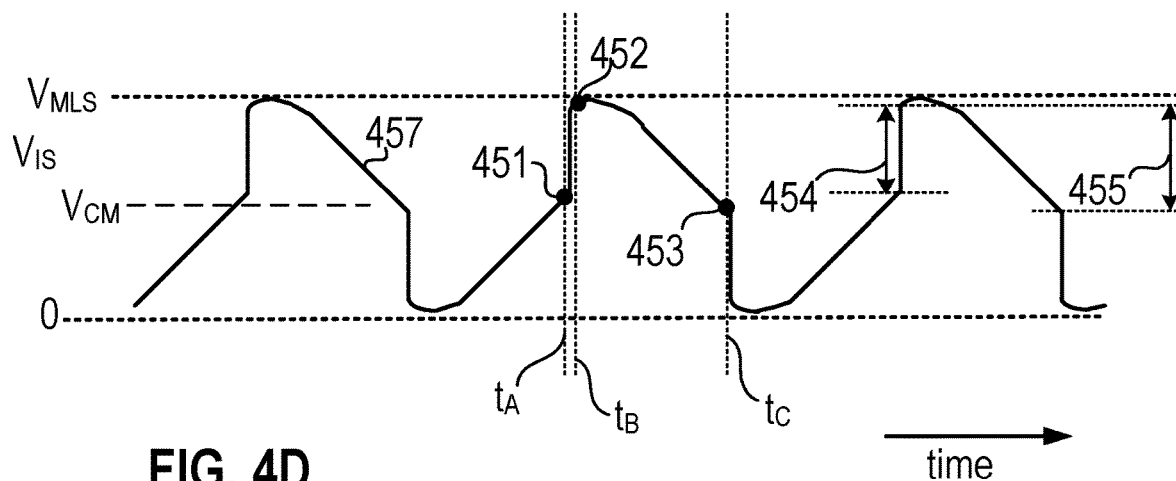
FIG. 4D illustrates a waveform of a sense interface signal in an LLC converter according to an embodiment.

FIG. 4D illustrates a waveform 457 of a sense interface signal $V_{IS}$ in an LLC converter (e.g., any of LLC converters 100a-100f) according to an embodiment. As illustrated by waveform 457 the sense interface signal $V_{IS}$ may be level shifted to a common mode voltage $V_{CM}$ with signal swings (i.e., dynamic range) between a peak voltage $V_{MLS}$ (e.g., in one example 4.5 volts) and a minimum voltage of zero relative to a secondary ground RTN. By using the sense interface circuit 308 to linearly replicate waveform 407 and/or 417, the sense interface signal $V_{IS}$ may preserve the comprehensive content scaled to a smaller magnitude by a linear constant α (e.g., a constant less than one).

Thus, waveform 457 may undergo a step 454 of magnitude equal to and/or substantially equal to the input voltage $V_{IN}$ scaled by a linear constant α; and during the positive half cycle, waveform 457 will decrease by a voltage difference 455 having a magnitude equal to and/or substantially equal to the incremental resonant capacitor voltage change $dV_{CRES}$ also scaled by a linear constant α. Additionally, the three waveform data points 451, 452, and 453 at times $t_A$, $t_B$, and $t_C$, respectively, may also represent the comprehensive signal content like data points 411, 412, and 413; except data points 451, 452, and 453 are also scaled in voltage by a linear constant α.

Referring to FIG. 3, the sampling block 302 may sample data points 451, 452, and 453 during a positive half cycle and provide the sampled data points 451, 452, and 453 to the signal processing block 304 to estimate power. For instance, the sampling block 302 may sample data points 451, 452, and 453 having a first voltage sample VP1, a second voltage sample VP2, and a third voltage sample VP3, respectively. Accordingly, the signal processing block 304 may estimate the input voltage $V_{IN}$, the incremental resonant capacitor voltage change $dV_{CRES}$, and the input power $P_{IN}$ from equations 3-5, as follows:

$$V_{IN} = (VP2 - VP1)/\alpha \quad \text{EQ. 3}$$

$$dV_{CRES} = (VP3 - VP2)/\alpha \quad \text{EQ. 4}$$

$$P_{IN} = 0.5 \cdot C_R \cdot (VP3 - VP2) \cdot (VP2 - VP1)/[(t_C - t_B) \cdot \alpha^2] \quad \text{EQ. 5}$$

Although FIGS. 4A-4D illustrate sampling data points during a positive half cycle to calculate power information, data points may also be sampled during the negative half cycle to accomplish the same. Sampling during the negative half cycle and/or during both the positive and negative half cycles may provide additional signal information and may be used to provide further power control.

For instance, FIG. 4E delineates additional aspects of a waveform 407 of a primary port signal $V_{PRI}$ in an LLC converter (e.g., any of LLC converters 100a-100f) according to an embodiment; and FIG. 4F delineates additional aspects of a waveform 457 of a sense interface signal $V_{IS}$ corresponding to the primary port signal $V_{PRI}$ of FIG. 4E. Waveforms 407 and 457 illustrate sampling during a negative half cycle to calculate power.

As illustrated, during a negative half cycle, waveform 407 of FIG. 4E may undergo a step 466 of magnitude equal to and/or substantially equal to the input voltage $V_{IN}$. Additionally, waveform 407 will increase by a voltage difference 467 relating to an amount of power delivered to the load 113; and the voltage difference 467 can have a magnitude equal to and/or substantially equal to the incremental resonant capacitor voltage change $dV_{CRES}$.

Accordingly, the three waveform data points 461, 462, and 463 at times $t_D$, $t_E$, and $t_F$, respectively, may also represent the comprehensive signal content. The data point 411 can include the value of the primary port signal $V_{PRI}$ just prior to a step (e.g., step 466) and the data point 462 can include the value of the primary port signal $V_{PRI}$ at or just following the step. Thus, a difference of the voltage values of data points 462 and 461 may equal and/or substantially equal the input voltage $V_{IN}$. Similarly, the data point 463 can include the value of the primary port signal $V_{PRI}$ at or near the end of the negative half cycle so that a difference of the voltage values of data points 463 and 462 may equal and/or substantially equal the incremental resonant capacitor voltage change $dV_{CRES}$.

Also, as discussed above, waveform 457 of FIG. 4F shows a scaled replica of waveform 407 by the linear constant α. Thus, waveform 457 may undergo a step 476 of magnitude equal to and/or substantially equal to the input voltage $V_{IN}$ scaled by the linear constant α; and during the negative half cycle, waveform 457 will increase by a voltage difference 477 having a magnitude equal to and/or substantially equal to the incremental resonant capacitor voltage change $dV_{CRES}$ also scaled by a linear constant α. Additionally, the three waveform data points 471, 472, and 473 at times $t_D$, $t_E$, and $t_F$, respectively, may also represent the comprehensive signal content scaled in voltage by the linear constant α.

In addition to having comprehensive signal content as described above, the waveforms 407, 417, 457 may also comprise additional content relating to operating conditions. For instance, FIG. 4G illustrates a magnified section 459 of the waveform 457 of the sense interface signal $V_{IS}$ of FIG. 4D; and FIG. 4H illustrates a magnified section 460 of the waveform 457 of the sense interface signal $V_{IS}$ of FIG. 4F. The magnified section 459 magnifies waveform 457 between times $t_A$ and $t_B$ showing the behavior of the sense interface signal $V_{IS}$ to have a slew time $dt_{AB}$ (i.e., the time difference between times $t_B$ and $t_A$). Similarly, the magnified section 460 magnifies waveform 457 between times $t_D$ and $t_E$ showing the behavior of the sense interface signal $V_{IS}$ to have a slew time $dt_{DE}$ (i.e., the time difference between times $t_E$ and $t_D$). The slew times $dt_{AB}$, $dt_{DE}$ may be determined, at least in part, by monitoring slew rate (i.e., the slope of waveform 457); and as illustrated by magnified sections 459, 460, the slew rate during the slew times $dt_{AB}$, $dt_{DE}$ can have a distinctive gradient (i.e., a distinguishable slew rate) relative to other time periods (e.g., a time period between time $t_E$ and time $t_F$).

Determination of the slew times $dt_{AB}$, $dt_{DE}$ may advantageously provide information relating to operating conditions. For instance, slew times $dt_{AB}$, $dt_{DE}$ and slew rate may relate to a loading condition (e.g., an overload condition). The slew times $dt_{AB}$, $dt_{DE}$ and slew rate may also be indicative of resonant conditions, zero-voltage switching conditions, and/or zero-current switching conditions. Additionally, as will be discussed with regards to FIG. 7A, estimating and/or determining the slew times can allow for the generation of a sampling clock.

Figure 5A:
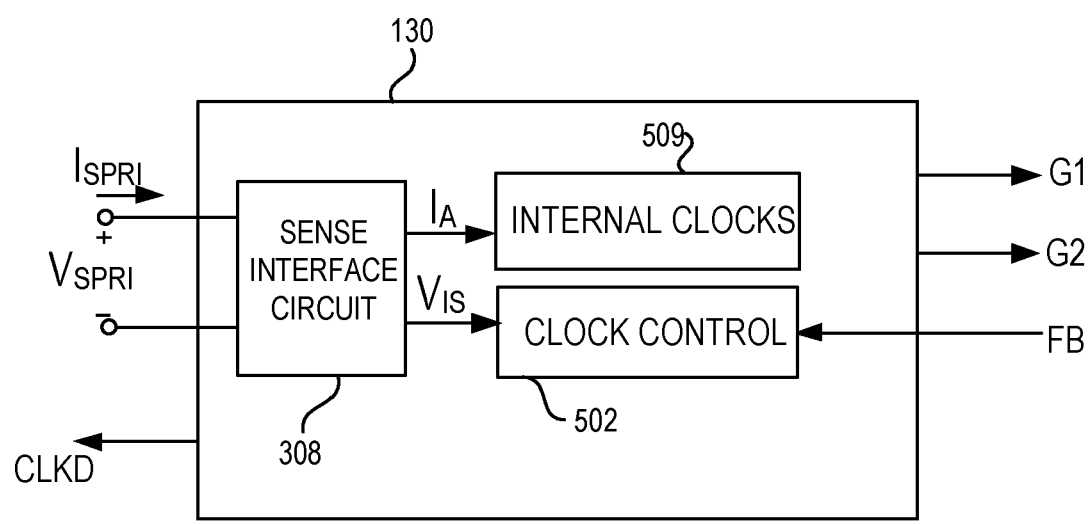
FIG. 5A illustrates a system diagram of a control module including a clock control module according to the teachings herein.

FIG. 5A illustrates a system diagram of a control module 130 including a clock control module 502 according to the teachings herein. Additionally, the control module 130 includes the sense interface circuit 308 and the internal clocks 509. The sense interface circuit 308 receives the buffered primary port signal current $I_{SPRI}$ level shifted to a common mode range of buffered primary port signal voltage $V_{SPRI}$; and in response the sense interface circuit 308 provides the sense interface signals $V_{IS}$ and/or $I_A$ to the clock control module 502 and the internal clocks 509, respectively. The internal clocks 509 may be used for internal clocking purposes including, but not limited to, sampling and/or generating delayed clock signals; and as described herein, the clock control module 502 may use the feedback signal FB and the sense interface signal $V_{IS}$ in generating drive signals.

Figure 5B:
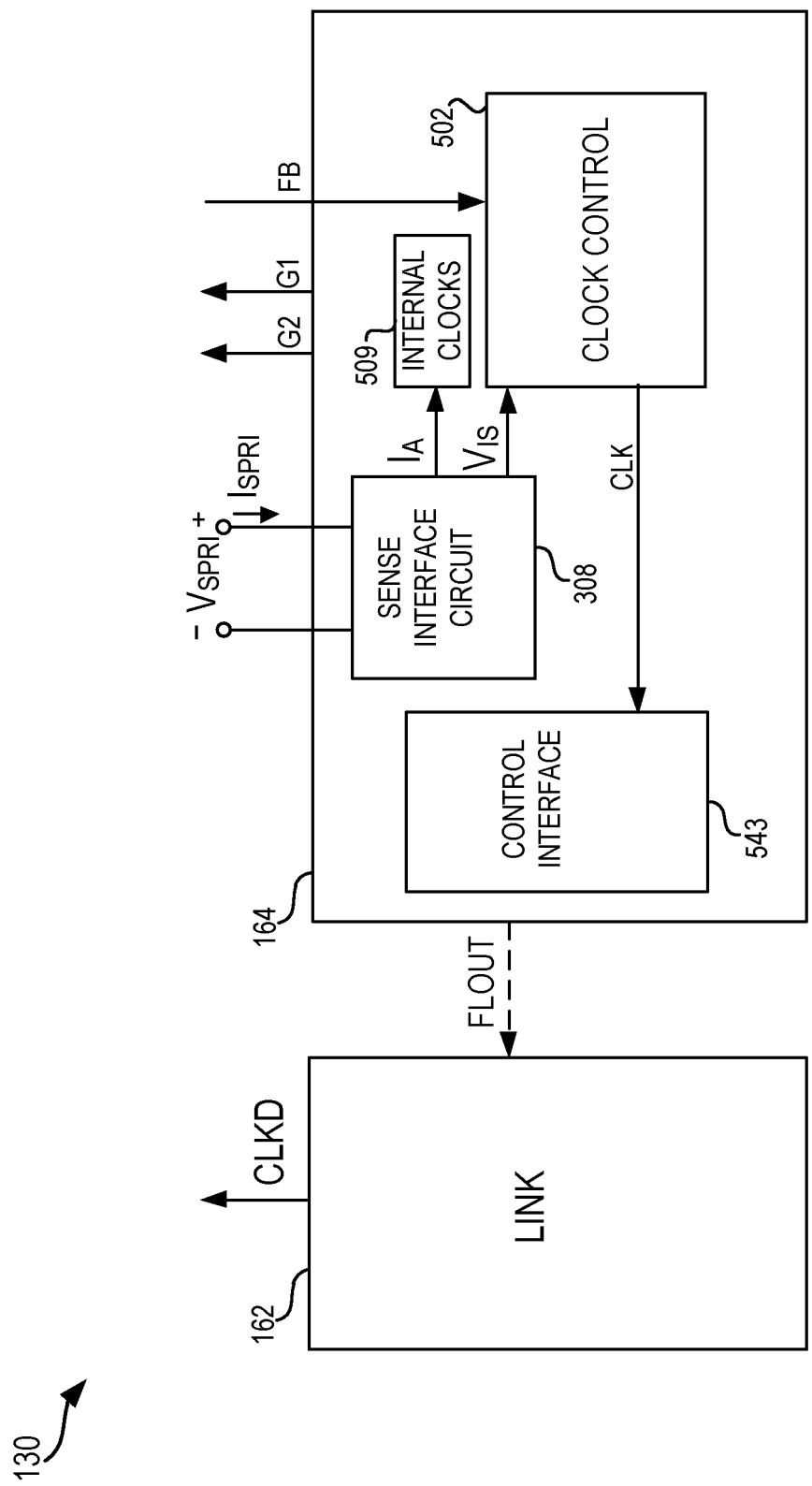
FIG. 5B illustrates a system diagram of the control module according to another embodiment.

FIG. 5B illustrates a system diagram of the control module 130 according to another embodiment. The control module 130 uses the secondary control block 164 and is coupled with the link circuit 162 to provide the drive signal CLKD as used by LLC controller 100f. As shown, the clock control module 502 receives the feedback signal FB and the sense interface signal $V_{IS}$, and in response, the clock control module 502 may generate a switch signal CLK. The switch signal CLK may be provided to a control interface 543 which may transmit the switch signal CLK via the linking signal FLOUT. The link circuit 162 may provide the drive signal CLKD based on the switch signal CLK. For instance, the drive signal CLKD may be provided to have a similar waveform (e.g., frequency and duty cycle) but delayed with respect to the switch signal CLK. Also, the drive signal CLKD may be referenced to a primary ground GND in the primary bridge circuit 103.

Figure 6A:
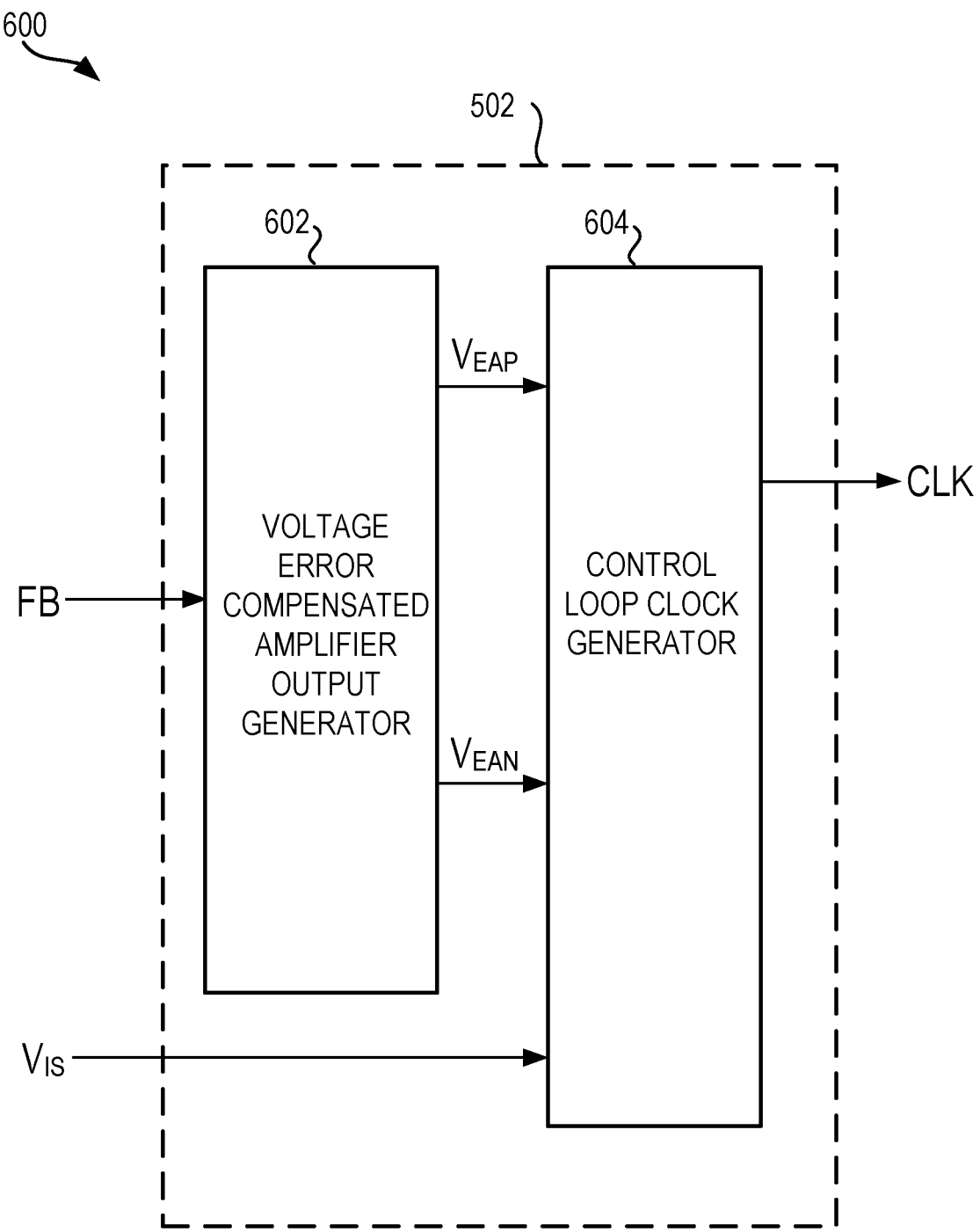
FIG. 6A illustrates a system diagram of a clock control module according to an embodiment.

FIG. 6A illustrates a system diagram 600 of a clock control module 502 according to an embodiment. The clock control module 502 includes a voltage error compensated amplifier output generator 602 and a control loop clock generator 604. The voltage error compensated amplifier output generator 602 receives the feedback signal FB and in response provides an error amplifier signal $V_{EAP}$ and a complementary error amplifier signal $V_{EAN}$. The control loop clock generator 604 receives the error amplifier signal $V_{EAP}$, the complementary error amplifier signal $V_{EAN}$, and the sense interface signal $V_{IS}$; and in response the control loop clock generator 604 provides the switch signal CLK.

Figure 6B:
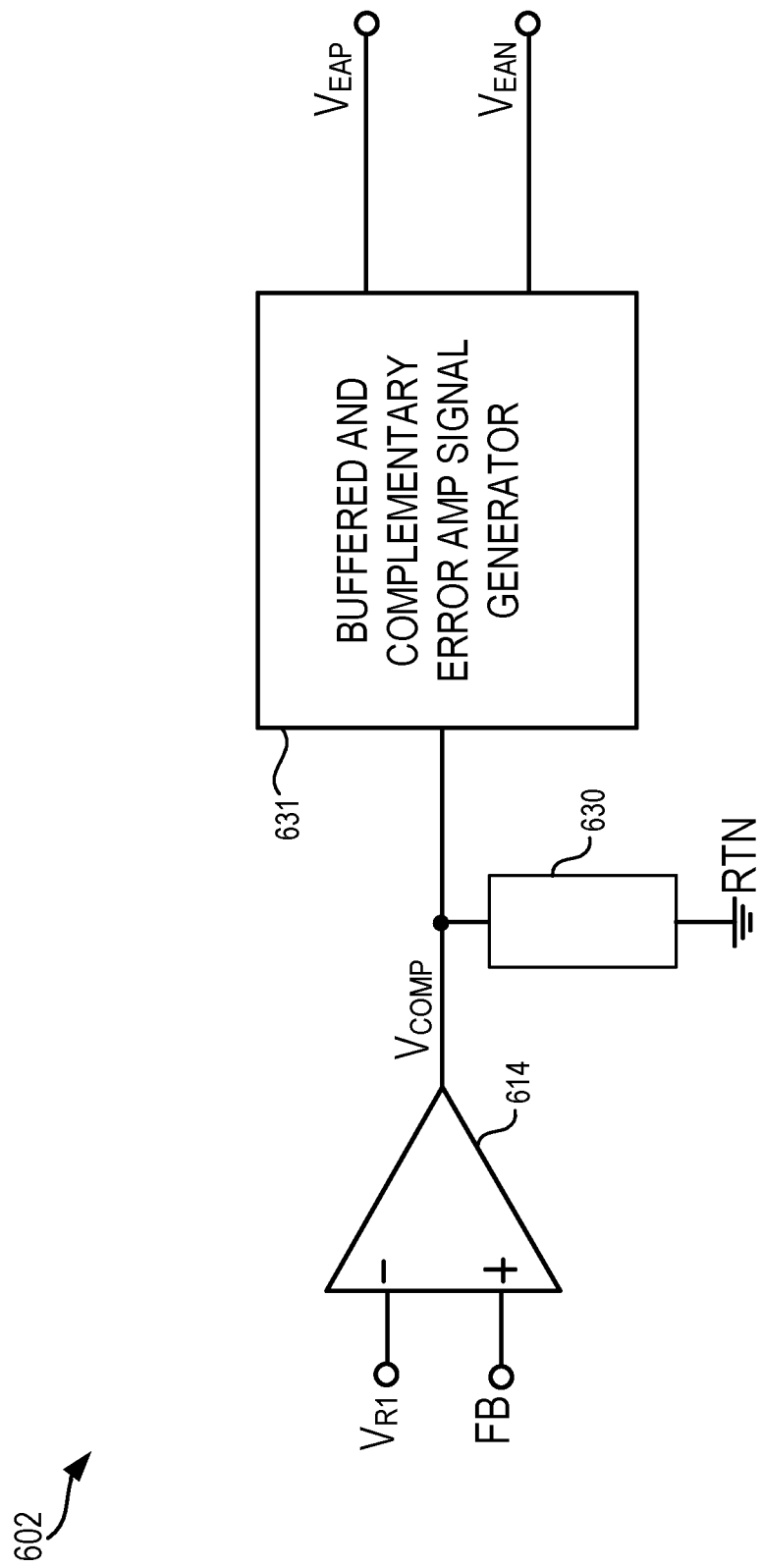
FIG. 6B illustrates a schematic diagram of a voltage error compensated amplifier output generator according to an embodiment.

FIG. 6B illustrates a schematic diagram of a voltage error compensated amplifier output generator 602 according to an embodiment. The voltage error compensated amplifier output generator 602 includes an amplifier 614, a compensation network 630, and a buffered and complementary error amp signal generator 631. The voltage error compensated amplifier output generator 602 may operate as part of a voltage control loop within an LLC converter (e.g., any of LLC converters 100a-100f) to regulate output voltage $V_O$. The amplifier 614 receives the feedback signal FB at its noninverting input and a reference $V_{R1}$ at its inverting input. The compensation network 630 may include passive components (e.g., capacitors and/or resistors) and is attached to the output of the amplifier to stabilize the amplifier output signal $V_{COMP}$. As illustrated, the amplifier 614 may provide the amplifier output signal $V_{COMP}$ and may operate as an error amplifier causing the feedback signal FB to approach the value of the reference $V_{R1}$. For instance, if the reference $V_{R1}$ is half a volt, then the amplifier output signal $V_{COMP}$ may vary to cause the feedback signal FB to become equal to and/or approximately equal to half a volt.

The buffered and complementary error amp signal generator 631 receives the amplifier output signal $V_{COMP}$, and in response it generates the error amplifier signal $V_{EAP}$ and the complementary error amplifier signal $V_{EAN}$.

Figure 6C:
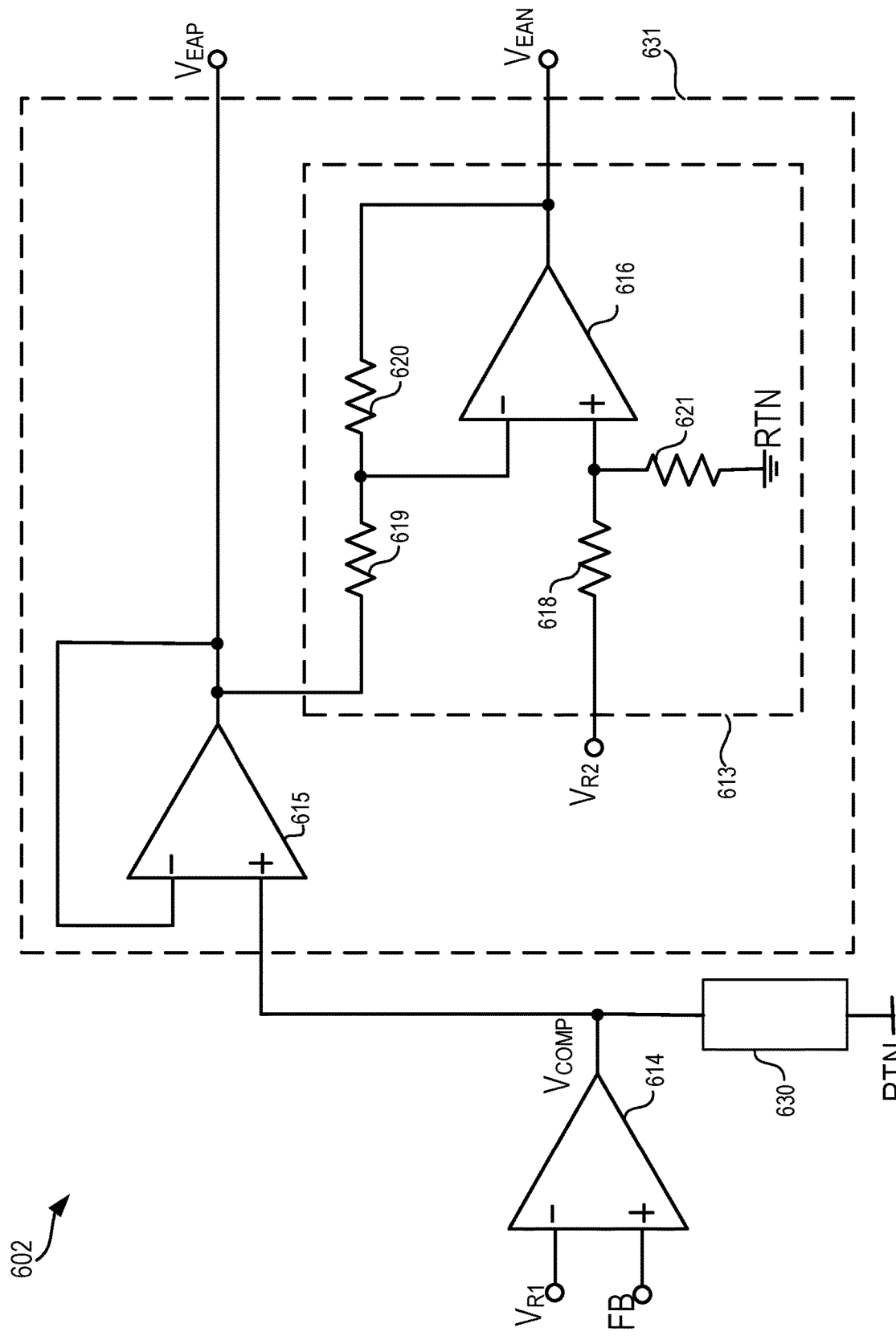
FIG. 6C is a schematic diagram showing additional circuit details of the buffered and complementary error amp signal generator of FIG. 6B.

FIG. 6C is a schematic diagram showing additional circuit details of the buffered and complementary error amp signal generator 631 of FIG. 6B. The buffered and complementary error amp signal generator 631 includes an amplifier 615 and an amplifier circuit 613. The inverting input of amplifier 615 is electrically connected to an output of amplifier 615 to buffer the amplifier output signal $V_{COMP}$ from the noninverting input. In this way the error amplifier signal $V_{EAP}$ may be buffered to be equal to, substantially equal to, and/or approximately equal to the amplifier output signal $V_{COMP}$.

The amplifier circuit 613 operates to generate the complementary error amplifier signal $V_{EAN}$ to be level shifted and complementary in value with respect to the error amplifier signal $V_{EAP}$. The amplifier circuit 613 includes an amplifier 616 and resistors 618, 619, 620, and 621 as shown. Resistor 619 is electrically connected between the output of amplifier 615 and the inverting input of the amplifier 616; and resistor 620 is electrically connected between the inverting input and the output of amplifier 616. Resistor 618 is electrically connected to the noninverting input of amplifier 616; and resistor 621 is electrically connected between the noninverting input of amplifier 616 and ground RTN. A second reference $V_{R2}$ is applied to the resistor 618; and resistors 618 and 621 may operate as a resistor divider to apply a fractional value of the second reference $V_{R2}$ at the noninverting input of amplifier 616.

Although the buffered and complementary error amp signal generator 631 shows a circuit realization having amplifier 615 and amplifier circuit 613, other configurations having greater or fewer components can be possible. In some embodiments one or more of the amplifiers 615, 616 can include features to adjust offset; alternatively, and additionally, one or more of the resistors 618-621 may be adjustable. For instance, resistor 618 may be a trim (i.e., variable) resistor implemented to compensate for offset. In other embodiments the amplifier circuit 613 may be realized with an operational amplifier and employ offset cancellation techniques including, but not limited to, chopper stabilization and auto-zero.

Figure 6D:
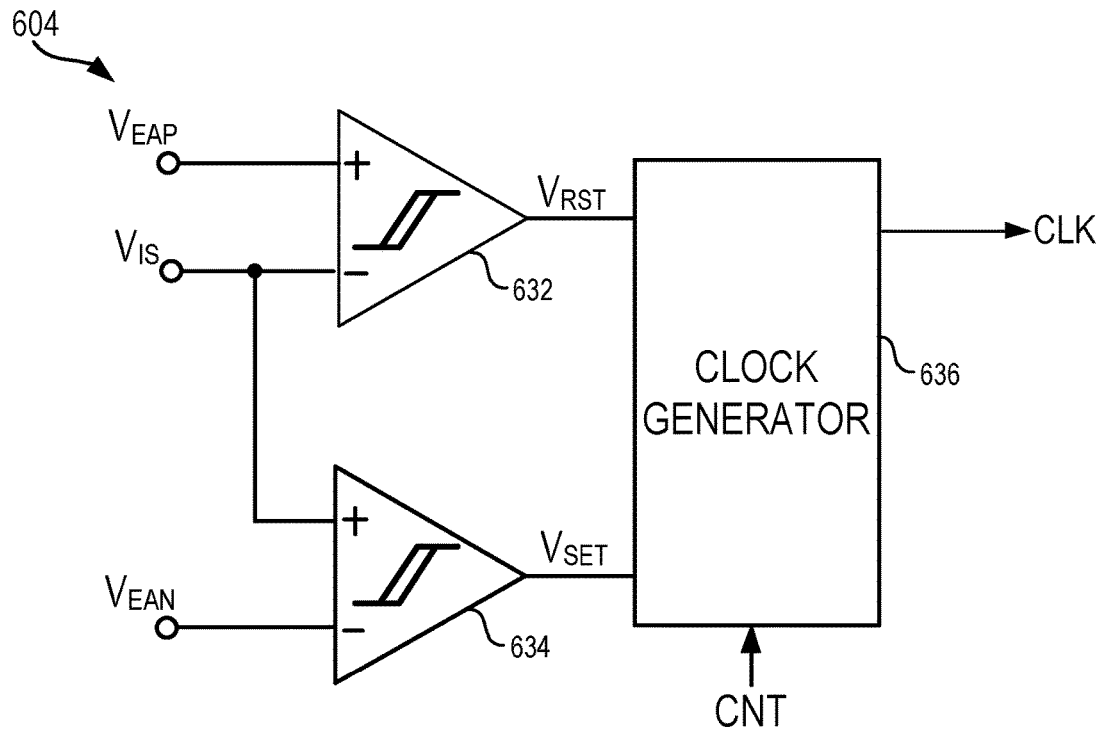
FIG. 6D illustrates a schematic diagram of a control loop clock generator according to an embodiment.
Figure 6E:
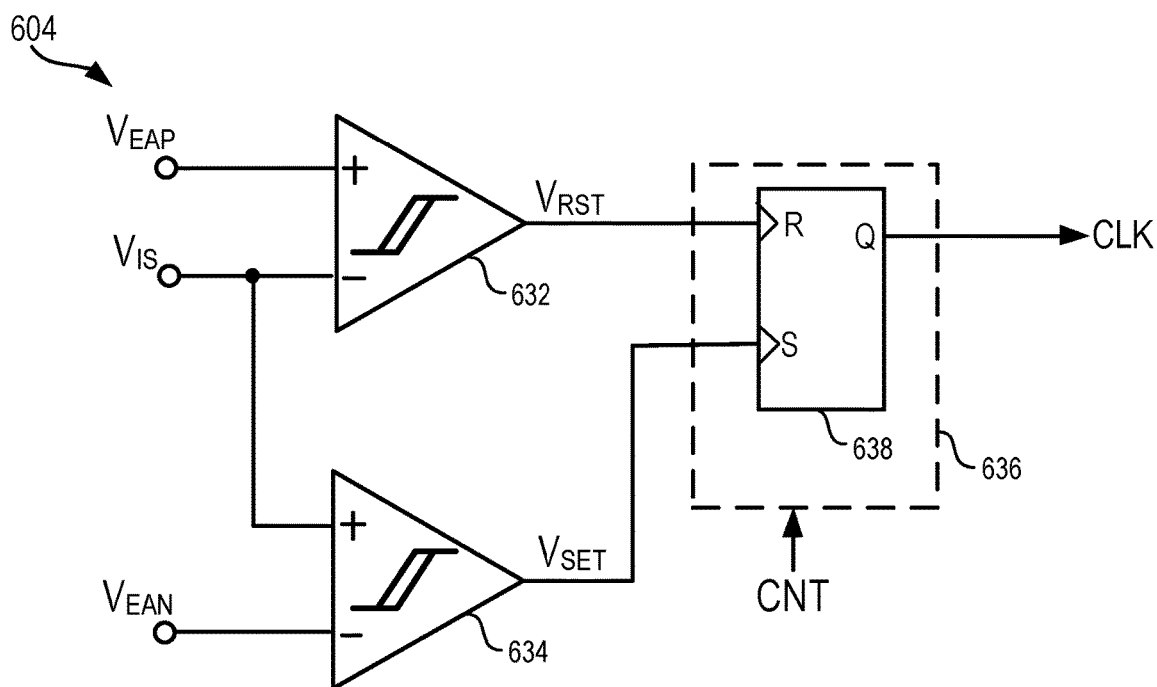
FIG. 6E is a schematic diagram showing additional circuit details of the clock generator of FIG. 6D.

FIG. 6D illustrates a schematic diagram of a control loop clock generator 604 according to an embodiment; and FIG. 6E is a schematic diagram showing additional circuit details of the clock generator 636 of FIG. 6D. The control loop clock generator 604 includes a comparator 632, a comparator 634, and a clock generator 636. The control loop clock generator 604 receives the error amplifier and the complementary error amplifier signals $V_{EAP}$, $V_{EAN}$ and compares them with the sense interface signal $V_{IS}$ using comparators 632 and 634.

As illustrated, comparator 632 receives the error amplifier signal $V_{EAP}$ at its noninverting input and the sense interface signal $V_{IS}$ at its inverting input to provide a logic high reset signal $V_{RST}$ when the sense interface signal $V_{IS}$ falls below the error amplifier signal $V_{EAP}$. Additionally, comparator 634 receives the complementary error amplifier signal $V_{EAN}$ at its inverting input and the sense interface signal $V_{IS}$ at its noninverting input to provide a logic high set signal $V_{SET}$ when the sense interface signal $V_{IS}$ exceeds the complementary error amplifier signal $V_{EAN}$.

The clock generator 636 may generate the switch signal CLK in response to the reset signal $V_{RST}$ and the set signal $V_{SET}$. Additionally, the clock generator 636 may receive a control signal CNT. In some embodiments the control signal CNT may be used to perform a reset function and/or to limit a switching period of the switch signal CLK. For instance, the control signal CNT may be used to limit a minimum cycle width (e.g., minimum switching cycle period) and/or a maximum cycle width (e.g., maximum switching cycle period).

As illustrated in FIG. 6E, the clock generator 636 may include a set reset (SR) latch 638 to generate the switch signal CLK. The SR latch 638 can receive the reset signal $V_{RST}$, the set signal $V_{SET}$, and/or the control signal CNT.

Figure 7A:
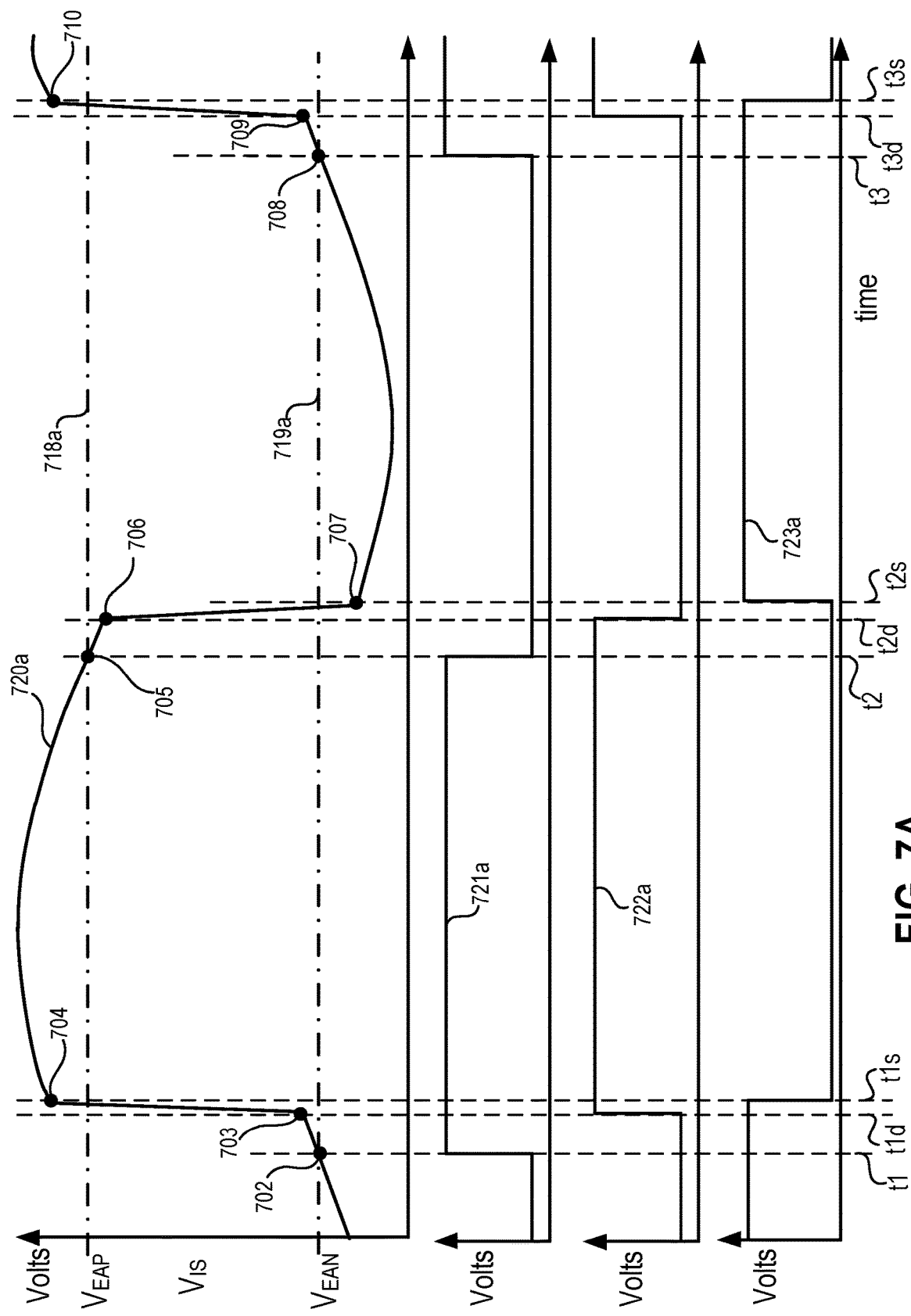
FIG. 7A illustrates switching signal waveforms of an LLC converter according to an embodiment.

FIG. 7A illustrates switching signal waveforms 718a-723a of an LLC converter (e.g., any of LLC converters 100a-100f) according to an embodiment. Waveforms 718a and 719a may respectively illustrate error amplifier signal $V_{EAP}$ and complementary error amplifier signal $V_{EAN}$ superimposed with waveform 720a of the sense interface signal $V_{IS}$. An operating condition may correspond to a high input voltage and a medium load; and the error amp signal $V_{EAP}$ may be provided at a voltage higher than the complementary error amp signal $V_{EAN}$ so that the sense interface signal $V_{IS}$ and waveform points 702-710 may be consistent with medium output power.

Waveform 721a may illustrate switch signal CLK generated by the clock control module 502 in response to the signal crossing points (i.e., intersections) at waveform points 702, 705, and 708. For instance, at times t1 and t3 corresponding to waveform points 702 and 708, the sense interface signal $V_{IS}$ crosses (i.e., intersects) the complementary error amplifier signal $V_{EAN}$, and in response to the sense interface signal $V_{IS}$ crossing and exceeding the complementary error amplifier signal $V_{EAN}$, the switch signal CLK (i.e., waveform 721a) changes state (i.e., transitions from low to high). Additionally, at time t2 corresponding to waveform point 705, the sense interface signal $V_{IS}$ crosses (i.e., intersects) the error amplifier signal $V_{EAP}$, and in response to the sense interface signal $V_{IS}$ crossing and becoming less than the error amplifier signal $V_{EAP}$, the switch signal CLK (i.e., waveform 721a) changes state (i.e., transitions from high to low).

Waveform 722a may illustrate drive signal CLKD delayed with respect to the switch signal CLK and/or alternatively a delayed drive signal within a primary bridge circuit (e.g., primary bridge circuit 103 or 99). For instance, waveform 722a may correspond to a drive signal within the primary bridge circuit 103 used to generate the control signals GH and GL delayed with respect to the switch signal CLK. As illustrated, at time t1d waveform 722a, changes state from low to high. Accordingly, a drive signal CLKD and/or a drive signal within the primary bridge circuit 103 may cause the control signal GH to drive the HS device 126 on; and in response, the sense interface signal $V_{IS}$ begins a positive half cycle at waveform point 703. At time t2d waveform 722a again changes state from high to low during and the drive signal CLKD may cause the control signal GL to drive the LS device 128 on. In response the sense interface signal $V_{IS}$ begins a negative half cycle at waveform point 706. At time t3d the waveform 722a again changes state from low to high beginning a next positive half cycle at waveform point 709.

Waveform 723a may illustrate an internal clock generated to coincide or to substantially coincide with end of cycle times t1s-t3s. As discussed above with regards to the FIG. 4G and FIG. 4H, slew characteristics may be measured to determine slew times (e.g., times $dt_{AB}$, $dt_{DE}$). End of cycle times t1s-t3s may in turn be determined and/or estimated from the slew times. In some embodiments waveform 723a may function as a sampling clock which may advantageously be synchronized with the end of cycle times t1s-t3s and with sample points (e.g., waveform points 704, 707, 710).

Although not illustrated, the sense interface signal $I_A$ may have the same and/or a similar waveform as 720a except in units of current (e.g., µA) versus time. In this way the sense interface signal $I_A$ may also have positive and negative half cycles coincident with the positive and negative half cycles of the sense interface signal $V_{IS}$; and the transitions of waveform 723a may correspond with the end of cycle times t1s, t2s, and t3s as indicated by waveform points 704, 707, and 710. For instance, in response to the sense interface signal $I_A$ at end of cycle times t1s and t3s, waveform 723a changes state from high to low. Similarly, at end of cycle time t2s, waveform 723a changes state from low to high.

Figure 7B:
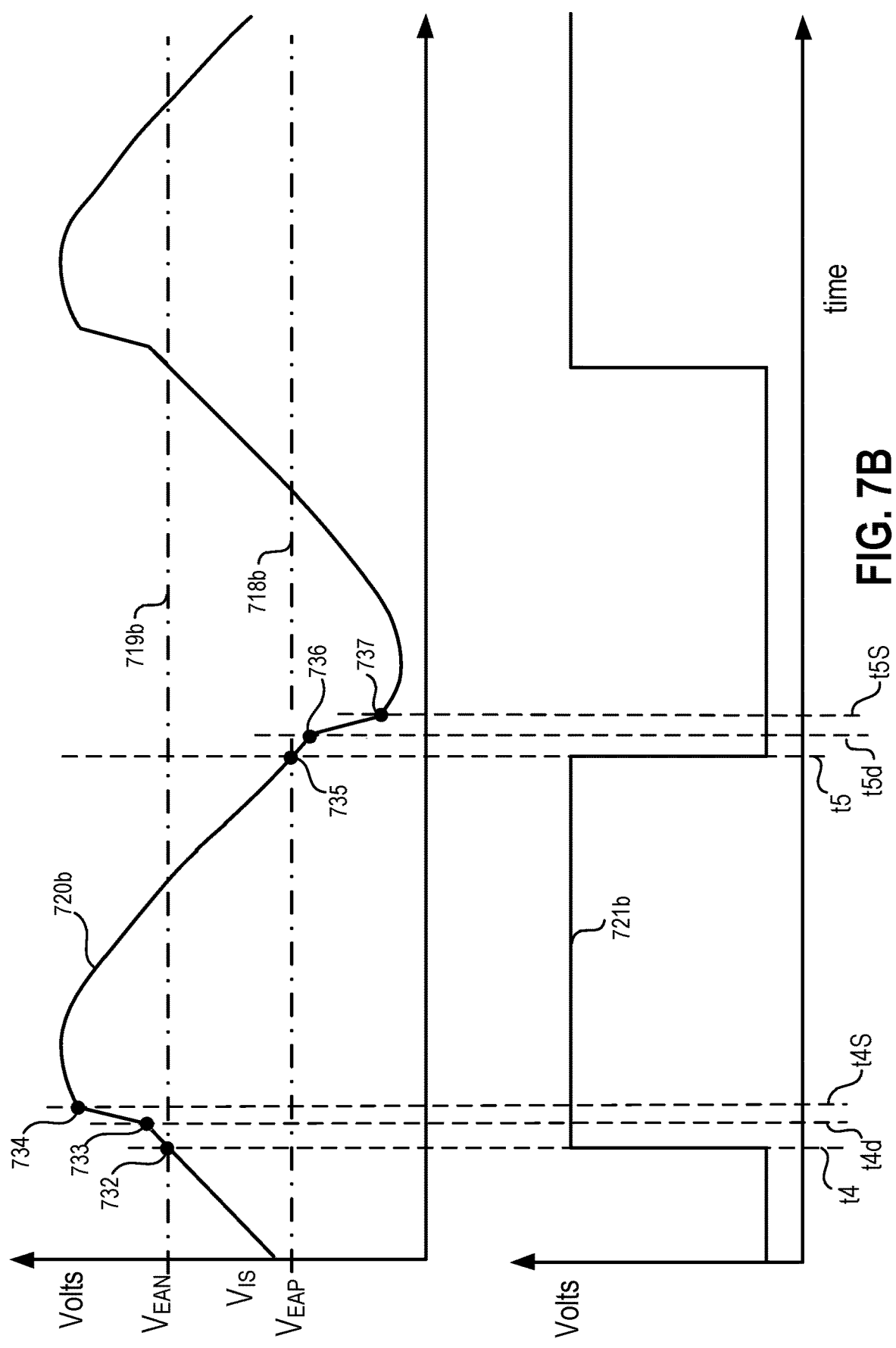
FIG. 7B illustrates switching signal waveforms according to a first operating condition.

FIG. 7B illustrates switching signal waveforms 718b-721b according to a first operating condition. Waveforms 718b and 719b may respectively illustrate error amplifier signal $V_{EAP}$ and complementary error amplifier signal $V_{EAN}$ superimposed with waveform 720b of the sense interface signal $V_{IS}$. An operating condition may correspond to a lower input voltage and a moderate to heavy load (i.e., large output power); and the error amp signal $V_{EAP}$ may be provided at a voltage lower than the complementary error amp signal $V_{EAN}$ so that the sense interface signal $V_{IS}$ and waveform points 732-737 may be consistent with higher output power (i.e., large output power).

Waveform 721b may illustrate switch signal CLK generated by the clock control module 502 in response to the signal crossing points (e.g., waveform points 732 and 735). For instance, at time t4 switch signal CLK changes state from low to high when the sense interface signal $V_{IS}$ crosses (i.e., rises above) the complementary error amp signal $V_{EAN}$; and at time t5 switch signal CLK changes state from high to low when the sense interface signal $V_{IS}$ crosses (i.e., descends below) the error amp signal $V_{EAP}$. Waveform points 733 and 736 may correspond to transitions of a delayed signal (e.g., drive signal CLKD) occurring at times t4d and t5d, respectively; and waveform points 734 and 737 may correspond to transitions of an internal clock occurring at times t4s and t5s, respectively.

FIG. 7C illustrates switching signal waveforms 718c-721c according to a second operating condition. Waveforms 718c and 719c may respectively illustrate error amplifier signal $V_{EAP}$ and complementary error amplifier signal $V_{EAN}$ superimposed with waveform 720c of the sense interface signal $V_{IS}$. An operating condition may correspond to higher input voltage and a light load (i.e., low output current $I_O$) having burst on and burst off periods of operation; and the error amp signal $V_{EAP}$ may be provided at a voltage higher than the complementary error amp signal $V_{EAN}$ so that the sense interface signal $V_{IS}$ may be consistent with light load conditions.

For instance, the period of time prior to time tx may be a burst off period during which there is no switching; thus, the sense interface signal $V_{IS}$ may fluctuate without crossing (i.e., intersecting) the complementary error amplifier signal $V_{EAP}$ and/or the error amplifier signal $V_{EAN}$. Accordingly, waveform 721c of switch signal CLK remains in a single (i.e., low) state during the burst off period.

The period of time after time tx may be a burst on period during which there is switching; thus, the sense interface signal $V_{IS}$ may transition with positive half cycles and negative half cycles. Accordingly, waveform 721c may undergo transitions (i.e., switch) in response to crossing points (i.e., intersection points) of the sense interface signal $V_{IS}$ with the complementary error amplifier signal $V_{EAN}$ and the error amplifier signal $V_{EAP}$.

Figure 7D:
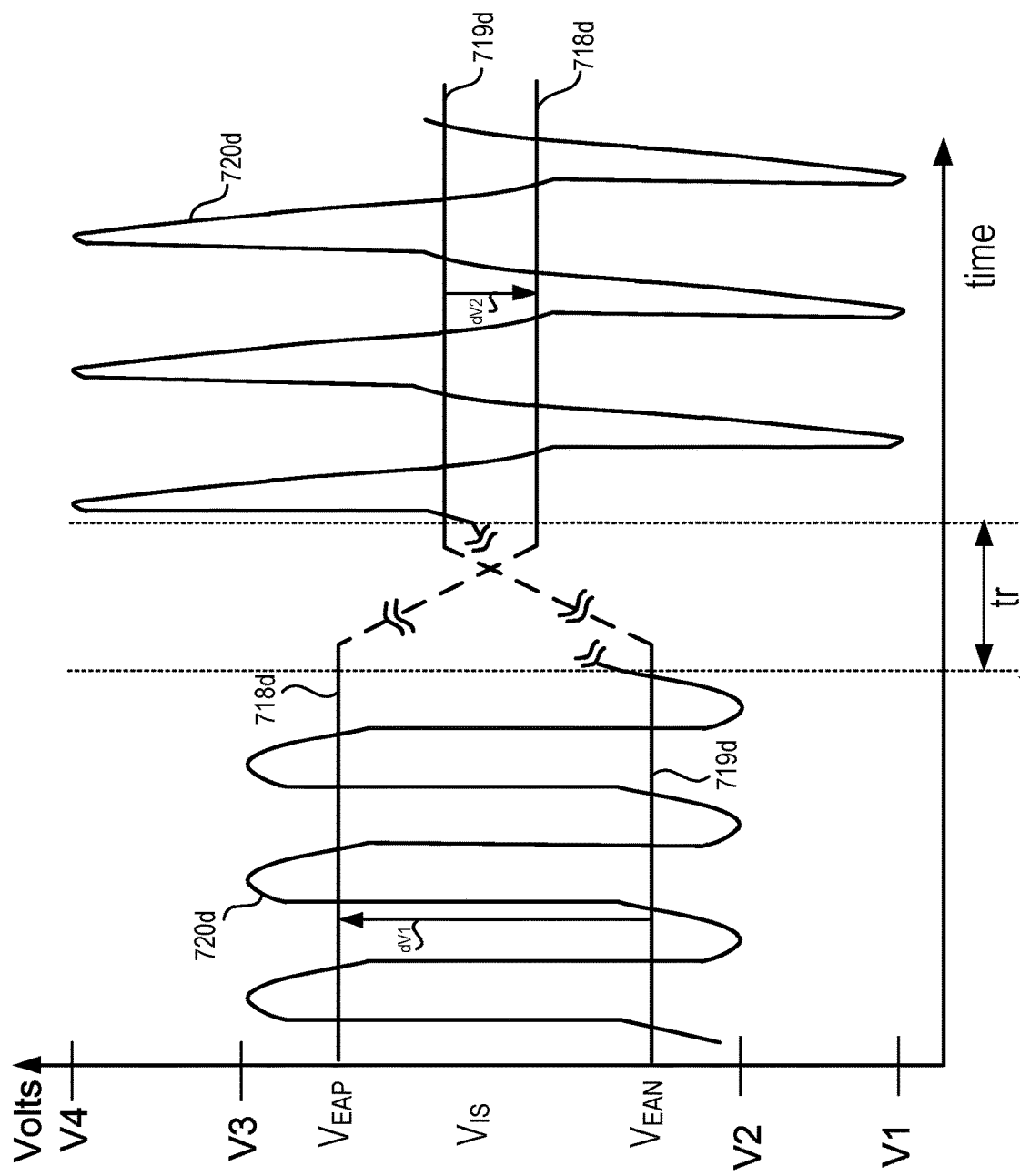
FIG. 7D illustrates switching signal waveforms according to a variable operating condition.

FIG. 7D illustrates switching signal waveforms 718d-720d according to a variable operating condition. Waveforms 718d and 719d may respectively illustrate error amplifier signal $V_{EAP}$ and complementary error amplifier signal $V_{EAN}$ superimposed with waveform 720d of the sense interface signal $V_{IS}$. The operating conditions may vary from moderate to light load conditions for prior to time ty to heavy load conditions for times after time tz.

Thus, for times prior to time ty, the error amplifier signal $V_{EAP}$ may be provided at a voltage higher than the complementary error amplifier signal $V_{EAN}$ by a voltage difference of magnitude dV1; and for times after time tz, the error amplifier signal $V_{EAP}$ may be provided at a voltage lower than the complementary error amplifier signal $V_{EAN}$ by a voltage difference of magnitude dV2.

During the transition time tr between times ty and tz, the clock control module 502 may operate in a transitory state while the waveforms 718d-720d fluctuate outside of steady state.

Figure 7E:
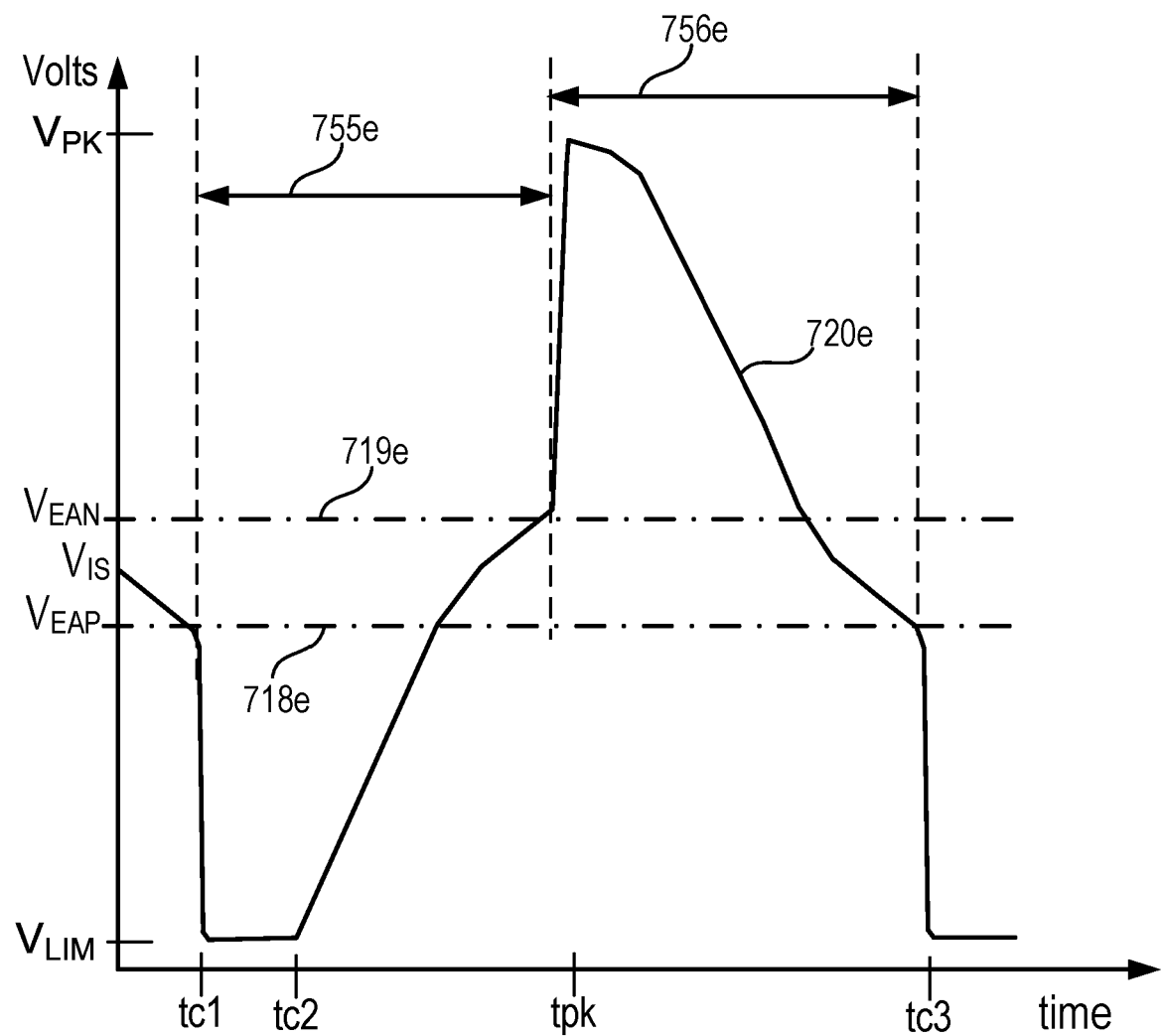
FIG. 7E illustrates switching signal waveforms with clipping according to a third operating condition.

FIG. 7E illustrates switching signal waveforms 718e-720e with clipping according to a third operating condition. Waveforms 718e and 719e may respectively illustrate error amplifier signal $V_{EAP}$ and complementary error amplifier signal $V_{EAN}$ superimposed with waveform 720e of the sense interface signal VB. The third operating condition may correspond to an operating condition whereby the output current and/or operating voltage(s) of the LLC converter cause the sense interface signal $V_{IS}$ to become asymmetrically clipped. As shown in FIG. 7E, under the third operating condition, during a negative half cycle 755e the sense interface signal $V_{IS}$ may become limited (i.e., clipped) to a value $V_{LIM}$ between times tc1 and tc2; while during a positive half cycle 756e the sense interface signal $V_{IS}$ may remain undistorted (i.e., not exhibit clipping) to reach an undistorted peak value $V_{PK}$ at time tpk.

In some embodiments it may be desirable to intentionally configure a sense interface circuit 308 to provide the interface signal $V_{IS}$ with half cycle asymmetry as shown in FIG. 7E. For instance, the interface signal $V_{IS}$ may be tailored to be more pronounced during a select half cycle; while redundant signal information during the remaining half cycle may be discarded or ignored by the controller (e.g., controller 114 and/or controller 174). In this manner, the sense interface signal $V_{IS}$ may advantageously have a greater signal to noise ratio during the positive half cycle 756e; and the control module (e.g., control module 70, 130, and/or 170) may selectively ignore duplicated signal content during the negative half cycle 755e.

Sense Interface Circuit

Figure 8A:
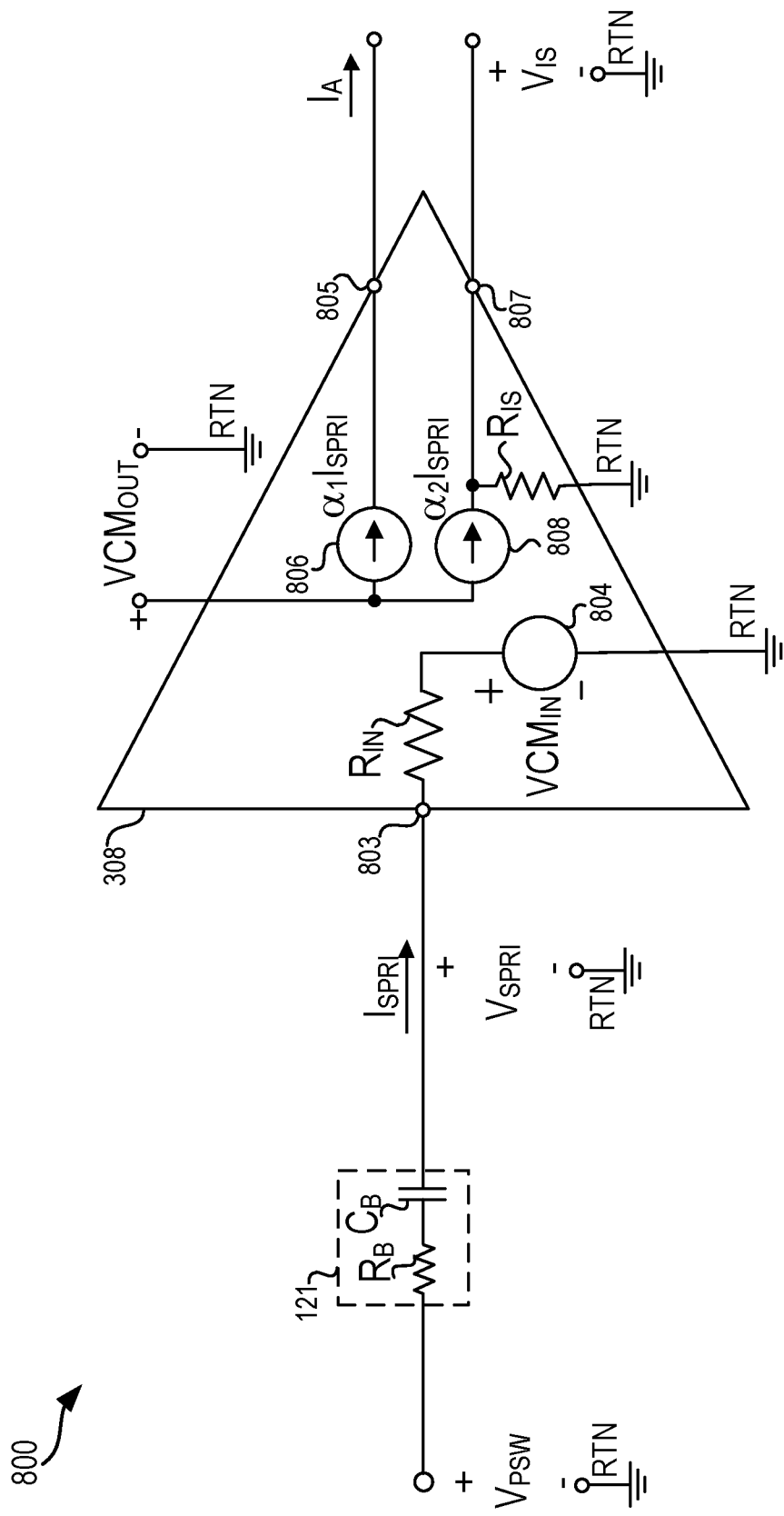
FIG. 8A illustrates a system diagram of a sense interface circuit according to the teachings herein.

FIG. 8A illustrates a system diagram 800 of a sense interface circuit 308 according to the teachings herein. The sense interface circuit 308 receives the buffered primary port signal current $I_{SPRI}$ and level shifts the buffered primary port signal voltage $V_{SPRI}$ at input 803 via the coupling circuit 121. As described above the coupling circuit 121 can block dc components from the primary port signal $V_{PSW}$ (and/or from primary port signal $V_{PRI}$); and an objective of the sense interface circuit 308 can be to enhance a dynamic range (e.g., a voltage amplitude dynamic range) of the buffered primary port signal current $I_{SPRI}$. In meeting this objective, the buffered primary port signal current $I_{SPRI}$ may be an ac signal with substantially zero dc current; and the buffered primary port signal voltage $V_{SPRI}$ may have a dc level (e.g., $VCM_{IN}$) different from that of the primary port signal $V_{PSW}$. Also as illustrated in FIG. 8A, the sense interface circuit 308 can provide a sense interface signal $I_A$ from the output 805 and/or a sense interface signal $V_{IS}$ from the output 807.

The system diagram 800 conceptually models the sense interface circuit 308 with an input resistor $R_{IN}$, a common mode input voltage source 804, a current dependent current source 806, a current dependent current source 808, and a resistor $R_{IS}$. The input resistor $R_{IN}$ is connected in series with the common mode input voltage source 804 to functionally model input impedance and common mode input biasing. The sense interface circuit 308 receives the buffered primary port signal current $I_{SPRI}$ and provides a dc common mode voltage $VCM_{IN}$ (i.e., a dc level $VCM_{IN}$) at the input 803. In this way the buffered primary port signal voltage $V_{SPRI}$ may be level shifted to the common mode range of the sense interface circuit 308 to have dc common mode voltage $VCM_{IN}$.

The input resistor $R_{IN}$ can model input impedance including ac input impedance; and a function of the sense interface circuit 308 can be to enhance input dynamic range at the input 803. In this endeavor, the sense interface circuit 308 may be configured to reduce ac variations of the buffered primary port signal voltage $V_{SPRI}$ by reducing the ac input impedance at the input 803. Reducing the ac input impedance can advantageously enhance a dynamic range of the buffered primary port signal current $I_{SPRI}$ by reducing ac variations of the buffered primary port signal voltage $V_{SPRI}$ relative to its dc common mode voltage (i.e., $VCM_{IN}$).

Also, the current dependent current source 806 can model a relationship between the buffered primary port signal current $I_{SPRI}$ at the input 803 and the sense interface signal $I_A$ from the output 805. A function of the sense interface circuit 308 can be to provide the sense interface signal $I_A$ as a scaled replica of the buffered primary port signal current $I_{SPRI}$ with good output dynamic range (e.g., with reduced output distortion). In this regard the current dependent current source 806 may provide the sense interface signal $I_A$ from a dc common mode output voltage $VCM_{OUT}$; and as illustrated, the sense interface signal $I_A$ may be provided proportional to the buffered primary port signal current $I_{SPRI}$ by a scale factor $\alpha_1$. In some embodiments, the scale factor $\alpha_1$ can be a positive or negative number with a magnitude substantially equal to, greater than, or less than unity.

Also as illustrated, the current dependent current source 808 and the resistor $R_{IS}$ can model a relationship between the buffered primary port signal current $I_{SPRI}$ at the input 803 and the sense interface signal $V_{IS}$ from the output 807. A function of the sense interface circuit 308 can be to provide the sense interface signal $V_{IS}$ as a scaled replica of the buffered primary port signal current $I_{SPRI}$ also with good output dynamic range (e.g., with reduced output distortion). In this regard a current from the current dependent current source 808 may flow through the resistor $R_{IS}$ to provide the sense interface signal $V_{IS}$ from the output 807. As illustrated, the current from the current dependent current source 808 may be provided at the dc common mode output voltage $VCM_{OUT}$. Additionally, the sense interface signal $V_{IS}$ may be proportional to a product of the resistance of resistor $R_{IS}$ and a scale factor $\alpha_2$, and the scale factor $\alpha_2$ can be a positive or negative number with a magnitude substantially equal to, greater than, or less than unity.

As described above with regards to the sense interface signal $V_{IS}$ of FIG. 7E, in some embodiments it may also desirable to introduce a half cycle asymmetry. The current dependent current source 808 and the resistor $R_{IS}$ may also be selected so that the dc common mode output voltage $VCM_{OUT}$ causes the half cycle asymmetry. In this way, during one half cycle (e.g., the positive half cycle), the sense interface signal $V_{IS}$ may have enhanced signal to noise ratio at the expense of clipping redundant signal information during the other half cycle (e.g., the negative half cycle).

Figure 8B:
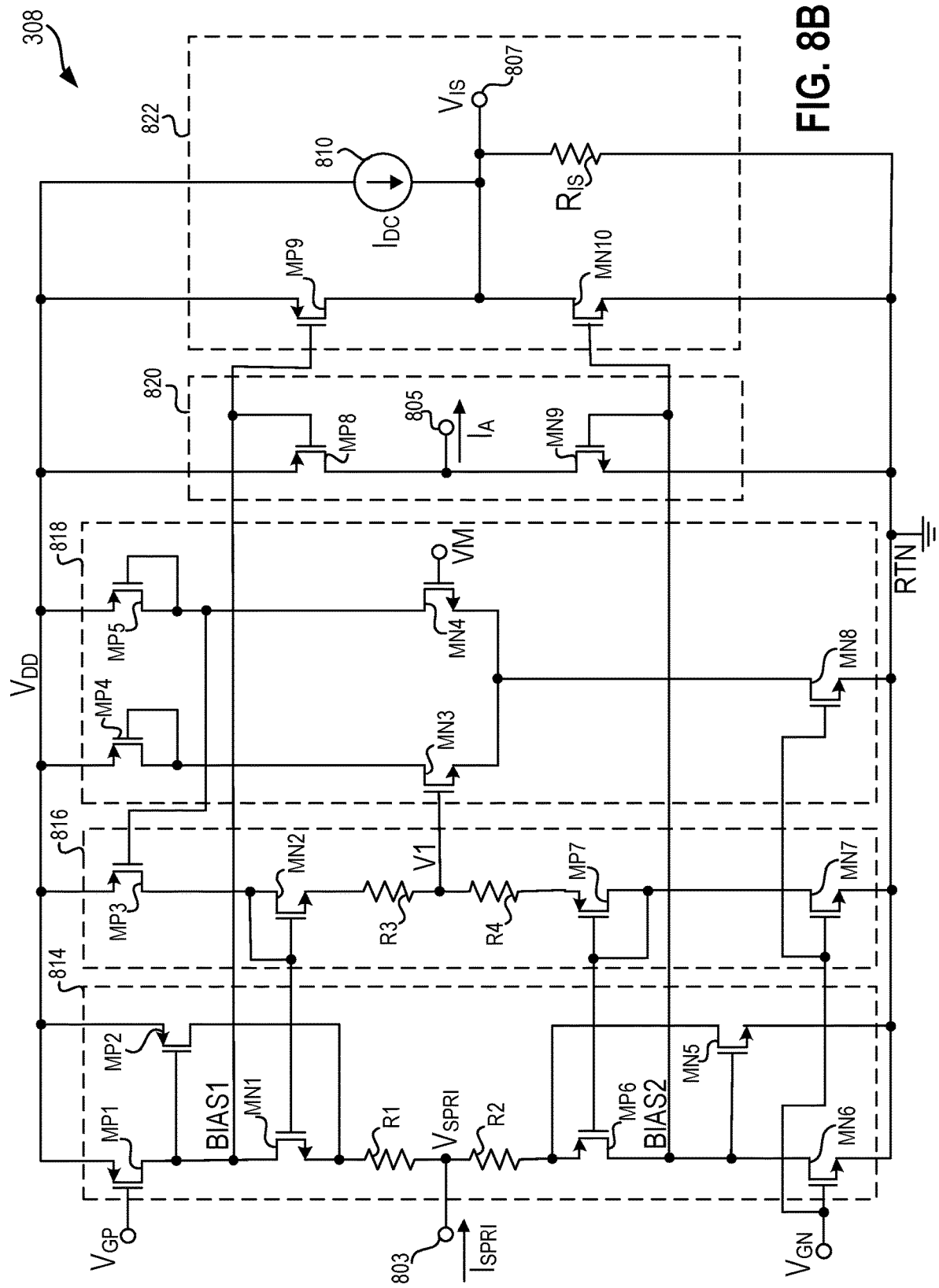
FIG. 8B illustrates a schematic diagram of a sense interface circuit according to an embodiment.

FIG. 8B illustrates a schematic diagram of a sense interface circuit 308 according to an embodiment. The sense interface circuit 308 includes an input stage 814, an input biasing stage 816, a differential stage 818, an output stage 820, and an output stage 822.

The input stage 814 includes n-type metal oxide semiconductor (NMOS) transistors MN1, MN5, MN6, p-type metal oxide semiconductor (PMOS) transistors MP1, MP2, MP6, and resistors R1 and R2. The drain of PMOS transistor MP1 is electrically connected to the drain of NMOS transistor MN1 and to the gate of PMOS transistor MP2. The drain of PMOS transistor MP2 is electrically connected to the source of NMOS transistor MN1. The drain of NMOS transistor MN6 is electrically connected to the drain of PMOS transistor MP6 and to the gate of NMOS transistor MN5. The drain of NMOS transistor MN5 is electrically connected to the source of PMOS transistor MP6. Resistors R1 and R2 are electrically connected in series, between the sources of NMOS transistor MN1 and PMOS transistor MP6, and also electrically connected together to the input 803 of the sense interface circuit 308.

The input biasing stage 816 includes PMOS transistors MP3 and MP7, NMOS transistors MN2 and MN7, and resistors R3 and R4. The drain of PMOS transistor MP3 is electrically connected to the drain and the gate of NMOS transistor MN2. The drain of NMOS transistor MN7 is electrically connected to the drain and the gate of PMOS transistor MP7. Resistors R3 and R4 are electrically connected in series, between the sources of NMOS transistor MN2 and PMOS transistor MP7.

The differential stage 818 includes NMOS transistors MN3, MN4, and MN8, and PMOS transistors MP4 and MP5. The drain of NMOS transistor MN8 is electrically connected to the sources of NMOS transistors MN3 and MN4. The drain of NMOS transistor MN3 is electrically connected to the gate and the drain of PMOS transistor MP4; and the drain of NMOS transistor MN4 is electrically connected to the gate and the drain of PMOS transistor MP5.

The output stage 820 includes an NMOS transistor MN9 and a PMOS transistor MP8. The drains of NMOS transistor MN9 and PMOS transistor MP8 are electrically connected together at the output 805 of the sense interface circuit 308.

The output stage 822 includes an NMOS transistor MN10, a PMOS transistor MP9, a resistor $R_{IS}$, and a current source 810. The drains of NMOS transistor MN10 and PMOS transistor MP9 are electrically connected together at the output 807 of the sense interface circuit 308. The resistor $R_{IS}$ is electrically connected between the drain and the source of NMOS transistor MN10, and the current source 810 is electrically connected to source a dc current Inc to the output 807.

The sense interface circuit 308 is coupled to operate from a secondary supply VDD relative to a secondary ground RTN. The sources of PMOS transistors MP1, MP2, MP3, MP4, MP5, MP8, and MP9 are electrically connected together to the secondary supply VDD; and the sources of NMOS transistors MN5, MN6, MN7, MN8, MN9, and MN10 are electrically connected together to the secondary ground RTN.

Also, the gates of NMOS transistors MN6, MN7, and MN8 are electrically connected together and are biased at a gate potential $V_{GN}$ so that NMOS transistors MN6, MN7, and MN8 may operate as NMOS current sources. The gate of PMOS transistor MP1 is biased to a potential $V_{GP}$ and can operate as a PMOS current source.

The differential stage 818 may control the input biasing stage 816 by virtue of the feedback connection to the gate of NMOS transistor MN3. As illustrated, the drain of PMOS transistor MP5 is electrically connected to the gate of PMOS transistor MP3 where it may exert control to the input biasing stage 816. Additionally, NMOS transistors MN3 and MN4 can operate as a differential pair receiving a tail current from NMOS transistor MN8. As shown, a gate of NMOS transistor MN3 is electrically connected to resistor R3 and to resistor R4; and a gate of NMOS transistor MN4 receives a reference voltage VM. In this way the gate of NMOS transistor MN3 receives a feedback voltage V1 via its coupling to resistors R3 and R4; and the differential stage 818 may adjust a potential at the gate of PMOS transistor MP5 so that the feedback voltage V1 becomes substantially equal to and/or approximately equal to the reference voltage VM.

The reference voltage VM can be provided to enhance dynamic range. For instance, in some embodiments the reference voltage VM can be selected to be substantially equal to half of a voltage of the secondary supply $V_{DD}$.

The input biasing stage 816 may control a dc bias of the input stage 814 so that the dc common mode voltage at the input 803 is proportional or relates to the feedback voltage V1. In this regard, NMOS transistors MN1 and MN2 are connected in a common gate configuration (i.e., the gates of NMOS transistors MN1 and MN2 are electrically connected together); and PMOS transistors MP6 and MP7 are connected in a common gate configuration. In this way the input biasing stage 816 can provide dc bias to the input stage 814 so that the dc voltage at the input 803 (i.e., the buffered primary port signal voltage $V_{SPRI}$) has a dc common mode value (e.g., $VCM_{IN}$) in proportion to the feedback voltage V1. Additionally, one or more of resistors R1, R2, R3, and R4 can be implemented as a trim network to adjust the dc common mode value (e.g., $VCM_{IN}$) to a specified tolerance.

As illustrated, input stage 814 can provide bias signals BIAS1 and BIAS2 to output stages 820 and 822 so that a dc common mode output voltage $VCM_{OUT}$ is provided at the outputs 805 and 807, respectively. The gate of PMOS transistor MP2 is electrically connected to the gates of PMOS transistors MP8 and MP9 to provide bias signal BIAS1; and the gate of NMOS transistor MN5 is electrically connected to the gates of NMOS transistors MN9, MN10 to provide bias signal BIAS2. The PMOS transistor MP8 and NMOS transistor MN9 can be selected (e.g., a device width and length may be selected) so that a dc voltage (i.e., dc common mode voltage) at output 805 is equal to $VCM_{OUT}$ when a drain current of PMOS transistor MP8 substantially equals a drain current of NMOS transistor MN9. In this way the sense interface signal $I_A$ may be provided as an ac current from the output 805 with dc common mode output voltage $VCM_{OUT}$.

The output stage 822 can use the current source 810 so that the sense interface signal $V_{IS}$ is provided as an ac voltage from the output 807 with dc common mode output voltage $VCM_{OUT}$. In this regard, the PMOS transistor MP9, the NMOS transistor MN10, and the dc current $I_{DC}$ from the current source 810 can provide offset so that a dc voltage (i.e., dc common mode voltage) across the resistor $R_{IS}$ is equal to $VCM_{OUT}$. By selecting the dc common mode output voltage $VCM_{OUT}$ to be equal to or substantially equal to half of a voltage of the secondary supply $V_{DD}$, the sense interface signal $V_{IS}$ may advantageously replicate the buffered primary port signal current signal current $I_{SPRI}$ for both positive and negative ac variations.

In addressing ac dynamic range, the input stage 814 may be configured to provide bias signals BIAS1 and BIAS2 in response to ac variations of buffered primary port signal current signal current $I_{SPRI}$ while offering low ac input impedance. In this regard the drain of PMOS transistor MP2 is connected to the source of the NMOS transistor MN1 to source current for negative ac excursions of the buffered primary port signal current $I_{SPRI}$ flowing out from input 803; and the drain of NMOS transistor MN5 is connected to the source of PMOS transistor MP6 to respond to positive ac excursions of the buffered primary port signal current $I_{SPRI}$ flowing into input 803.

As ac current increases in magnitude flowing out of input 803 (i.e., corresponding to a negative ac excursion of the buffered primary port signal current $I_{SPRI}$), the bias signal BIAS1 decreases accordingly. Also, as ac current increases in magnitude and flows into input 803 (i.e., corresponding to a positive ac excursion of the buffered primary port signal current $I_{SPRI}$) increases, the bias signal BIAS2 increases accordingly. Additionally, in order to offer low ac input resistance, resistors R1 and R2 may be selected to have a resistance (e.g., 10-100 kΩ) so that the ac current (i.e., the buffered primary port signal current $I_{SPRI}$) does not present a relatively ac large voltage variation (i.e., compared to a dc bias current) across the resistors R1 and R2, respectively.

The bias signals BIAS1 and BIAS2 are provided to the output stages 820 and 822 so that the sense interface signals $I_A$ and $V_{IS}$ can faithfully replicate the buffered primary port signal current $I_{SPRI}$. As shown the gate of PMOS transistor MP8 can receive the bias signal BIAS1 and the gate of NMOS transistor MN9 can receive the bias signal BIAS2. The PMOS transistor MP8 and the NMOS transistor MN9 can be selected and/or sized (e.g., a device width and length may be selected) such that the sense interface signal $I_A$ is an ac current that replicates or varies proportionally to the buffered primary port signal current $I_{SPRI}$. As the bias signals BIAS1 and BIAS2 vary in response to the buffered primary port signal current $I_{SPRI}$, the sense interface signal $I_A$ may replicate the port current signal $I_{SPRI}$ in proportion to a scale factor cu. Thus, the PMOS transistor MP8 and NMOS transistor MN9 may realize, in part, the current dependent current source 806. In some embodiments, the scale factor $\alpha_1$ can be a number substantially equal to, greater than, or less than unity as determined, in part, by the selection and/or sizing of the PMOS transistor MP8 and the NMOS transistor MN9.

Also as illustrated, the gate of PMOS transistor MP9 can receive the bias signal BIAS1 and the gate of NMOS transistor MN10 can receive the bias signal BIAS2. The PMOS transistor MP9 and the NMOS transistor MN10 can be selected and/or sized (e.g., a device width and length may be selected) such that the sense interface signal $V_{IS}$ varies proportional to the buffered primary port signal current $I_{SPRI}$. As the bias signals BIAS1 and BIAS2 vary in response to the buffered primary port signal current $I_{SPRI}$, the sense interface signal $V_{IS}$ is an ac voltage across resistor $R_{IS}$ that replicates the buffered primary port signal current $I_{SPRI}$ in proportion to a scale factor $\alpha_2$ times the resistance of the resistor $R_{IS}$. In this way, the PMOS transistor MP9 and NMOS transistor MN10 may realize, in part, the current dependent current source 808; and in some embodiments, the scale factor $\alpha_2$ may also be a number substantially equal to, greater than, or less than unity.

Although the embodiment of FIG. 8B illustrates a sense interface circuit realized with NMOS and PMOS transistors, other configurations are possible. As one of ordinary skill in the art can appreciate, a sense interface circuit may be realized with greater or fewer transistors having various shapes and sizes and using similar and/or alternative configurations. For instance, in one configuration a differential pair may be configured using PMOS transistors instead of NMOS transistors MN3 and MN4. In another configuration, bipolar junction transistors (i.e., BJTs) may be used to realize one or more of the circuit stages (e.g., input stage 814, input biasing stage 816, differential stage 818, and output stages 820 and 822). Additionally, and alternatively, the sense interface circuit may be realized using discrete and/or integrated circuit components.

Figure 8C:
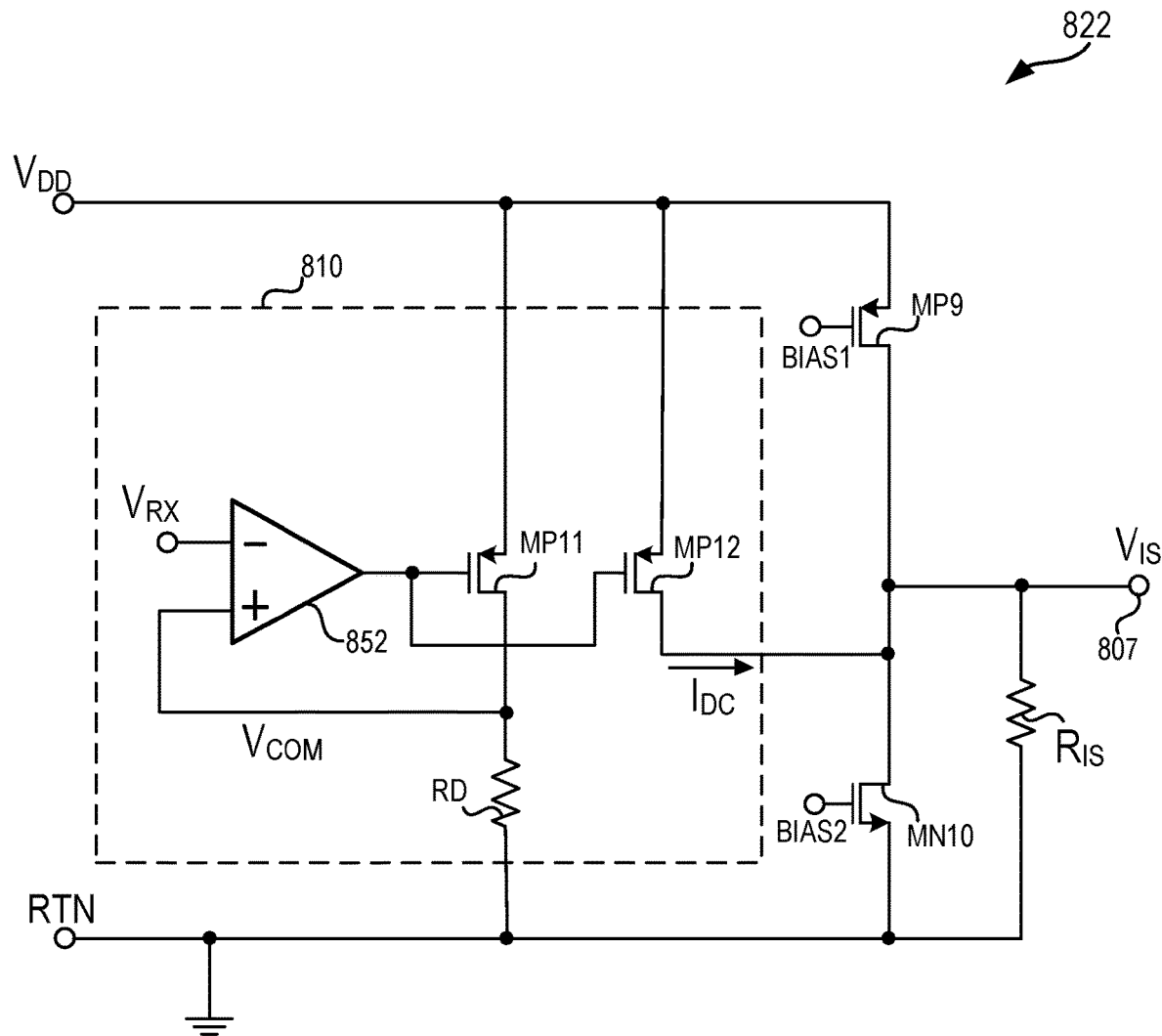
FIG. 8C illustrates a schematic diagram of a sense interface circuit output stage according to a first embodiment.

FIG. 8C illustrates a schematic diagram of the sense interface circuit output stage 822 according to a first embodiment. The sense interface circuit output stage 822 shows a circuit realization of the current source 810 for providing a dc current $I_{DC}$. The current source 810 includes an operational amplifier 852, a resistor RD, and PMOS transistors MP11 and MP12. The operational amplifier 852 with PMOS transistor MP11 and resistor RD is configured as a current source to cause the drain current of PMOS transistor MP11 to equal a voltage $V_{COM}$ divided by the resistance of resistor RD. Additionally, by virtue of the current source configuration, the voltage $V_{COM}$ may be equal to and/or approximately equal to a reference voltage $V_{RX}$ applied to the inverting terminal of the operational amplifier 852. The gates of PMOS transistors MP11 and MP12 are connected to an output of the operational amplifier 852 so that the dc current $I_{DC}$ relates to the drain current of PMOS transistor MP11 by a scale factor. For instance, if the PMOS transistors MP11 and MP12 are matched to have equal device width and length, then to a zeroth order, the dc current $I_{DC}$ can be made to be equal or approximately equal to the reference voltage $V_{RX}$ divided by the resistance of resistor RD.

Figure 8D:
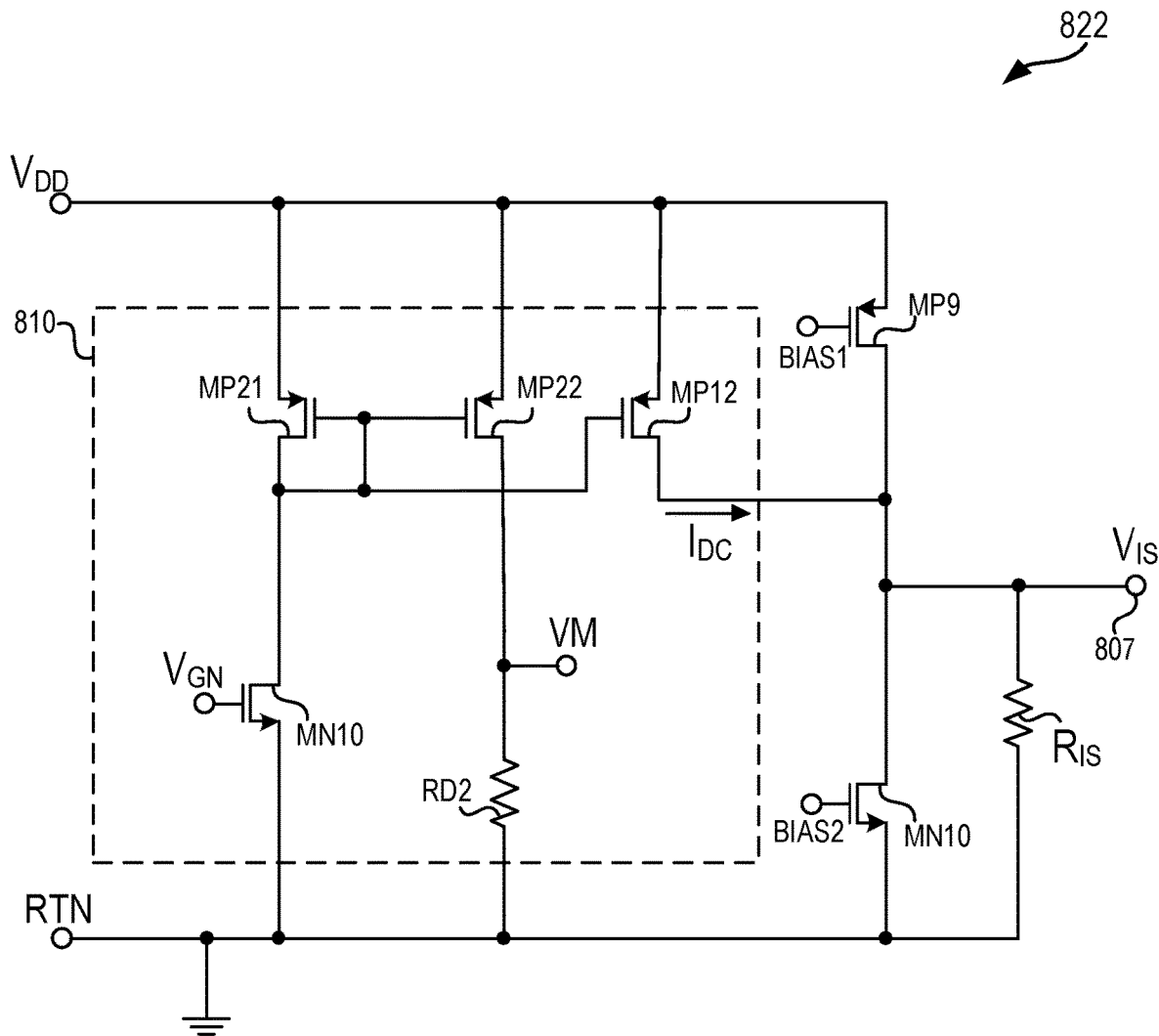
FIG. 8D illustrates a schematic diagram of a sense interface circuit output stage according to a second embodiment.

FIG. 8D illustrates a schematic diagram of the sense interface circuit output stage 822 according to a second embodiment. The sense interface circuit output stage 822 of FIG. 8D is similar to the interface circuit output stage of FIG. 8C, except for the circuit realization of the current source 810. Instead of using an operational amplifier 852, the current source 810 of FIG. 8D includes a PMOS transistor MP21, a PMOS transistor MP22, an NMOS transistor MN10, and a resistor RD2. As illustrated NMOS transistor MN10 receives the gate potential $V_{GN}$ to operate as an NMOS current source. Additionally, PMOS transistors MP21 and MP22 may be configured as a current mirror or a current multiplier to receive current via the drain of NMOS transistor MN10. The gate of PMOS transistor MP12 is electrically coupled to the gate of PMOS transistors MP21 and MP22 so that the dc current Inc can be proportional to and/or approximately equal to a drain current of PMOS transistor MP21. Also as shown in FIG. 8D, the drain of PMOS transistor MP22 is electrically connected to resistor RD to provide the reference voltage VM.

Figure 9:
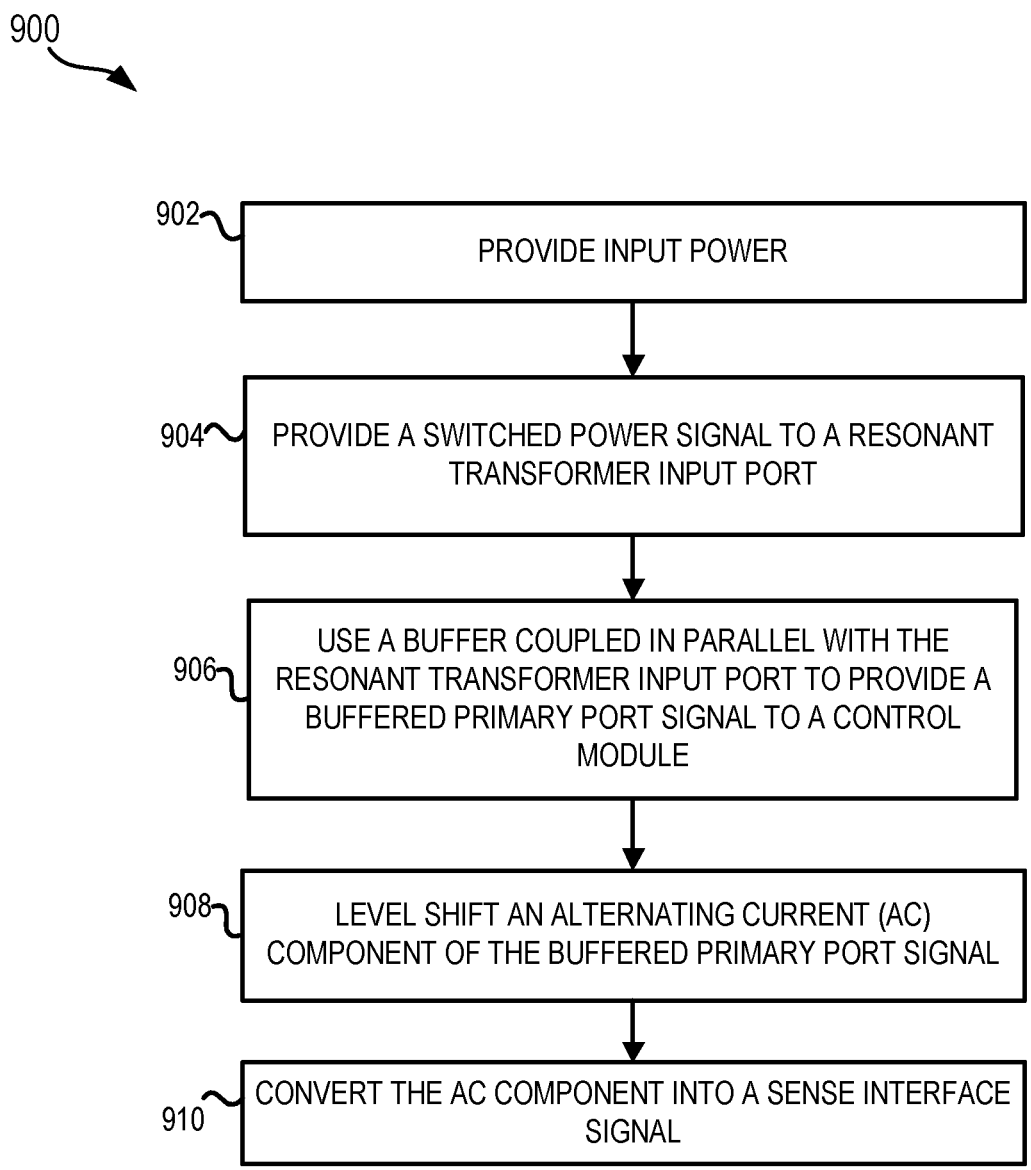
FIG. 9 illustrates a flow diagram of a method for sensing switching signals in an LLC converter according to an embodiment.

FIG. 9 illustrates a flow diagram 900 of a method for sensing switching signals in an LLC converter according to an embodiment. With reference to preceding figures, step 902 may refer to providing input power at a primary input of an LLC converter (e.g., LLC converter 100a) with a dc input voltage $V_{IN}$. Step 904 may refer to providing a switched power signal $V_X$ to a resonant transformer 107 (147) input port. Step 906 may refer to using buffer circuit 116 to provide buffered primary port signal $S_{PRI}$ to control module 130. Step 908 may refer to providing the buffered primary port signal $S_{PRI}$ filtered to have the buffered primary port signal current $I_{SPRI}$, an ac current, and level shifted to a common mode voltage of the control module 130. Step 910 may refer to converting the ac component (e.g., the buffered primary port signal current $I_{SPRI}$) into a sense interface signal (e.g., one or more of sense interface signals $V_{IS}$, $I_A$).

Figure 10:
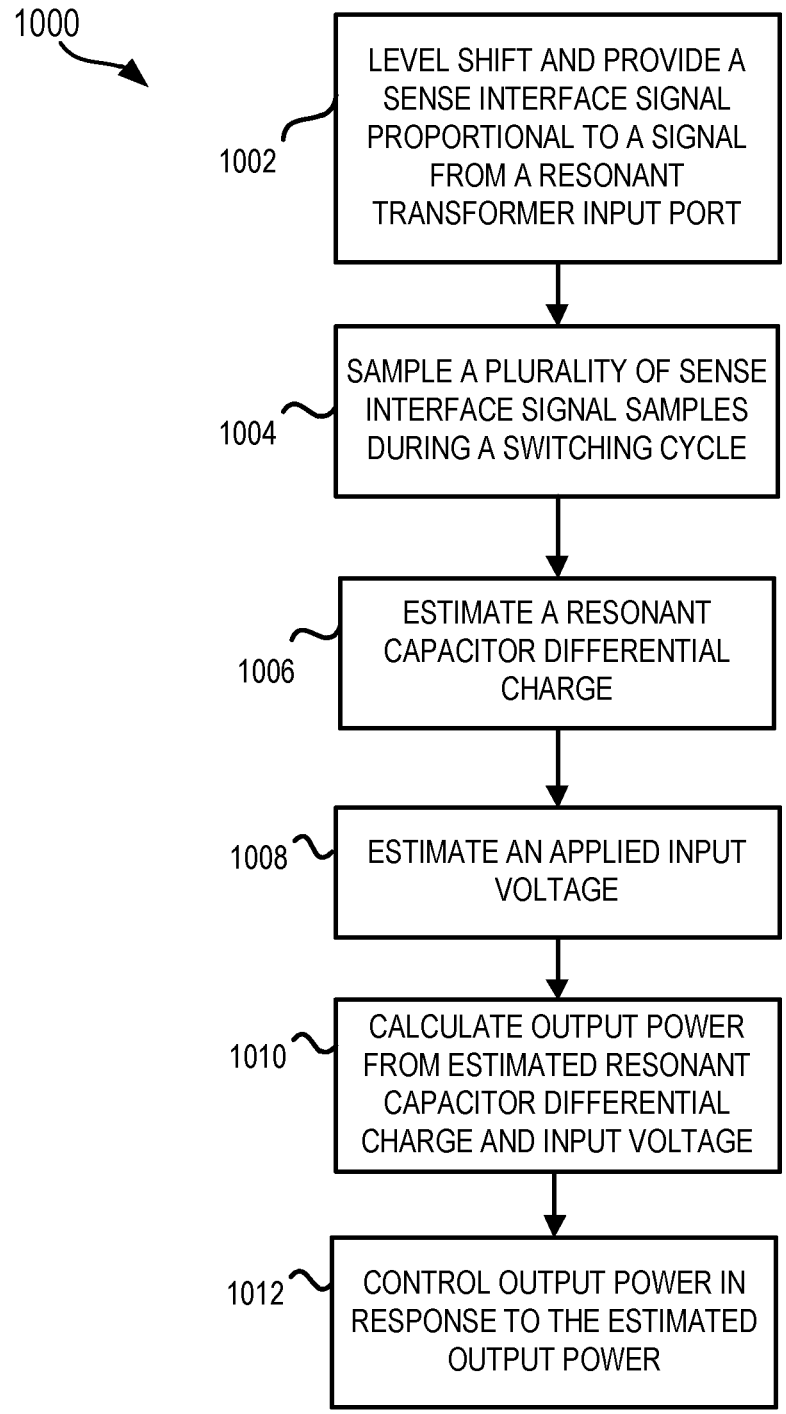
FIG. 10 illustrates a flow diagram of a control method in an LLC converter according to an embodiment.

FIG. 10 illustrates a flow diagram 1000 of a control method in an LLC converter according to an embodiment. Again referring to previous figures, the first step 1002 may refer to providing a sense interface signal (e.g., sense interface signal $V_{IS}$) using a sense interface circuit 308. The sense interface signal may be level shifted to have a common mode voltage. The next step 1004 may refer to sampling data from sense interface signal $V_{IS}$ during a switching cycle (e.g., FIG. 4D sampling sense interface signal $V_{IS}$ data at times $t_A$, $t_B$, $t_C$). Additionally, in some embodiments, sampling clocks may be generated based, at least in part, upon characteristics of the sampling sense interface signal $V_{IS}$. For instance, as described above with respect to waveform 723a of FIG. 7A, a sampling clock coincident with end of cycle times (e.g., end of cycle times t1s-t3s) may be generated by measuring slew characteristics (e.g., slew times).

The following step 1006 may refer to estimating the resonant capacitor differential charge using equation 2; and step 1008 may refer to estimating the input voltage $V_{IN}$ based on equation 2. Step 1010 may refer to estimating output power based on equation 4; and step 1012 may refer to controlling output power based on the estimated value of output power. For instance, control module 130 may adjust switching frequency in response to an output power estimate in order to increase and/or decrease power delivery to the load 113.

Figure 11A:
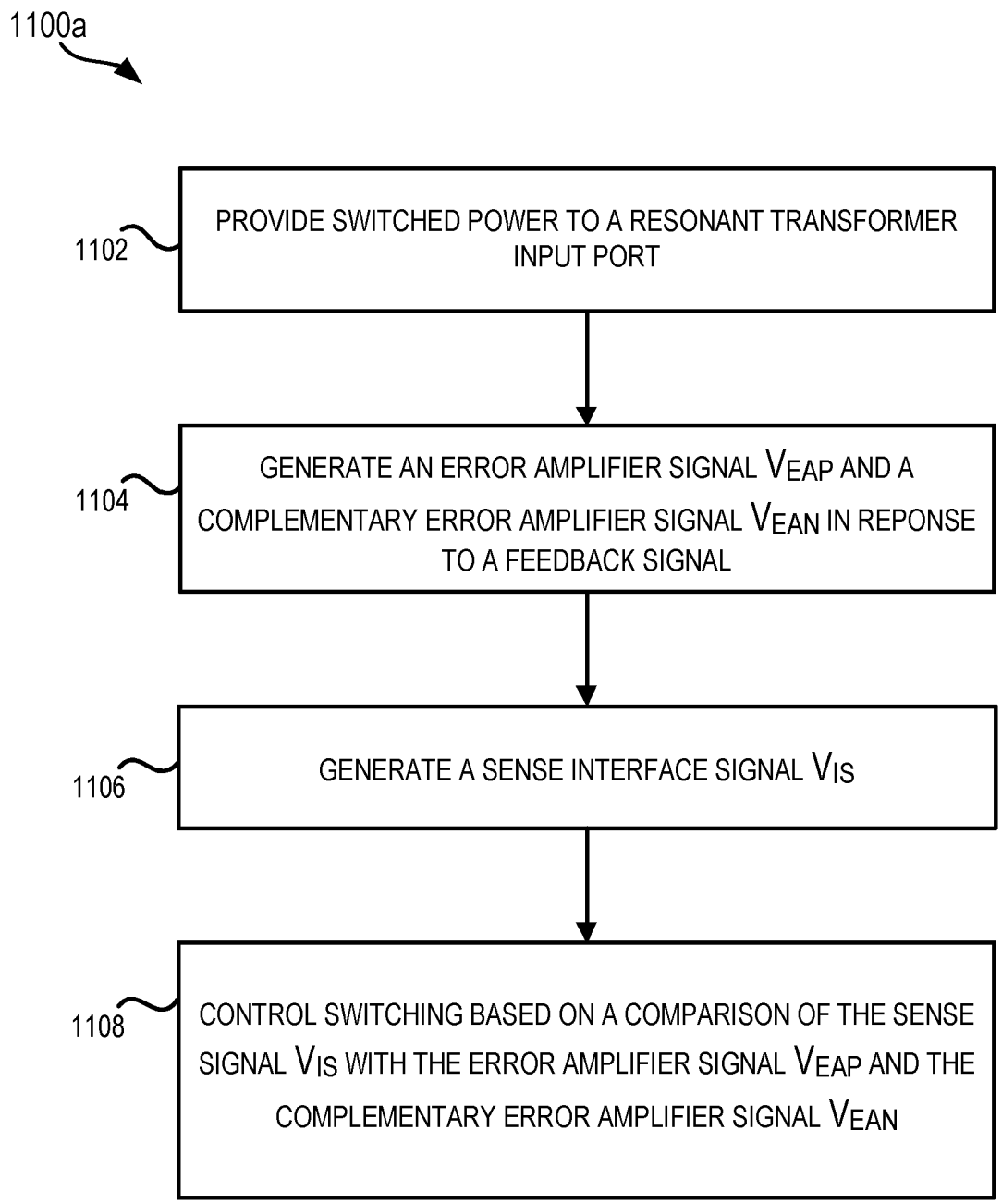
FIG. 11A illustrates a flow diagram of a control method in an LLC converter according to another embodiment.

FIG. 11A illustrates a flow diagram 1100a of a control method in an LLC converter according to another embodiment. With reference to preceding figures, the first step 1102 may refer to providing a switched power signal $V_X$ to the resonant transformer input port. The next step 1104 may refer to generating the error amplifier and complementary error amplifier signals $V_{EAP}$, $V_{EAN}$, in response to feedback signal FB. Step 1106 may refer to generating the sense interface signal $V_{IS}$ using the sense interface circuit 308. Step 1108 may refer to controlling switching (e.g., controlling drive signal CLKD) by comparing the sense interface signal $V_{IS}$ with the error amplifier and complementary error amplifier signals $V_{EAP}$, $V_{EAN}$ as discussed with respect to FIGS. 6A-6E and to FIGS. 7A-7D.

Figure 11B:
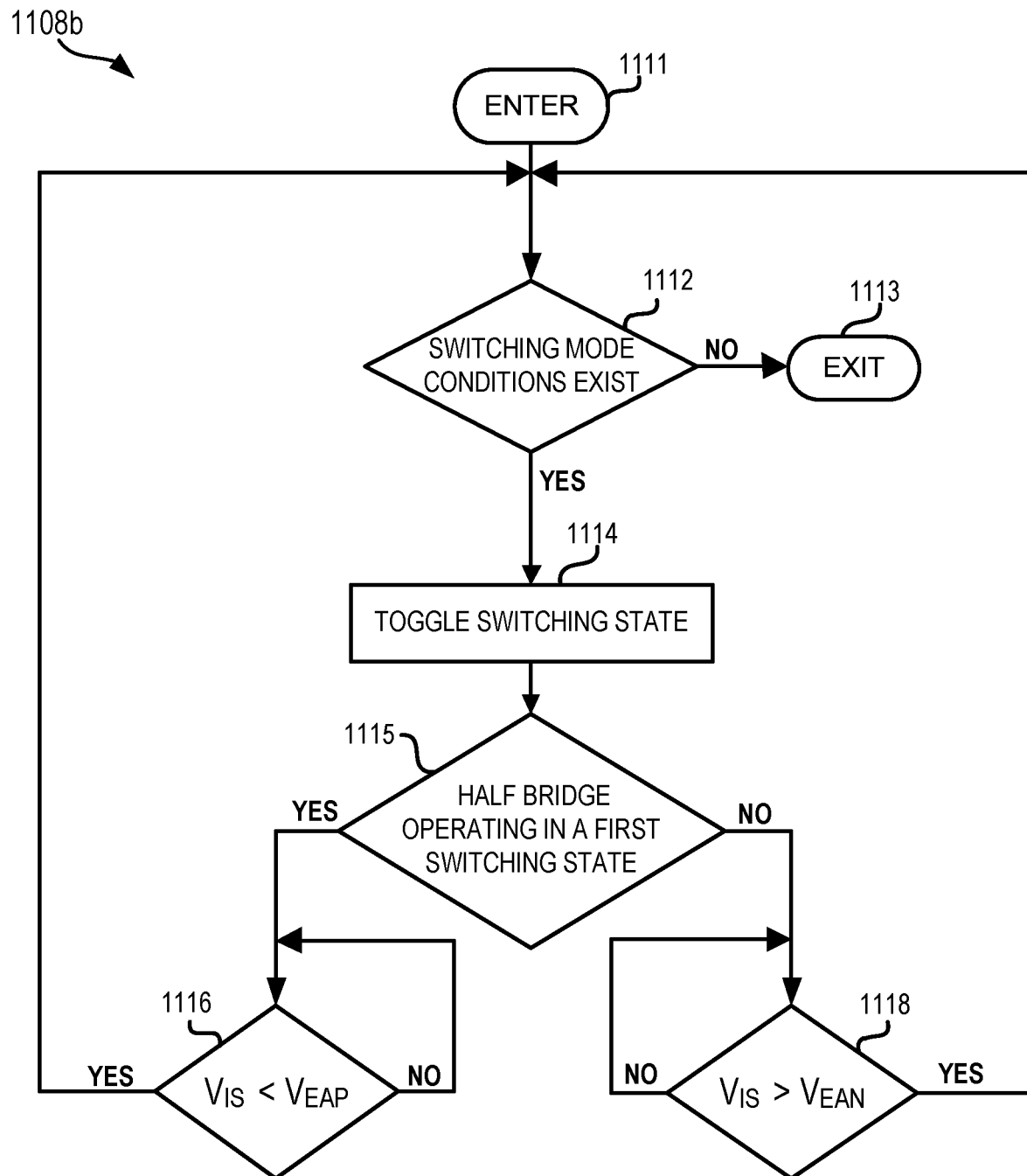
FIG. 11B illustrates a flow diagram of continuous mode switching in an LLC converter according to a half-bridge embodiment.

FIG. 11B illustrates a flow diagram 1108b of continuous mode switching in an LLC converter according to a half-bridge embodiment. The conceptual flow diagram 1108b may correspond to controlling drive signal CLKD in a half bridge configuration (e.g., LLC converter 100f) based on step 1108 of FIG. 11A and during continuous switching conditions beginning with a routine entry step 1111. Step 1112 is a decision step. If continuous switching conditions exist, then the decision step 1112 may proceed to step 1114; and if continuous switching conditions do not exist, then the routine may proceed to step 1113 to exit. At step 1114 the switching state toggles the half bridge 104 to its next switching state. For instance, referring to FIG. 1F, if the present switching state controls the HS device 126 to be on and the LS device 128 to be off, then the next switching state toggles to control the LS device 128 to be on and the HS device 126 to be off. Additionally, if the present switching state controls the HS device 126 to be off and the LS device 128 to be on, then the next switching state toggles to control the LS device 128 to be off and the HS device 126 to be on.

The routine next continues to decision step 1115. Decision step 1115 may determine the operational state the half bridge. For instance, a first half bridge switching state may be defined by the switching state with the LS device 128 off while the HS device 126 is on; accordingly the second half bridge switching state may be defined by the switching state with the HS device 126 off while the LS device 128 is on.

If the half bridge is operating in the first switching state (i.e., the HS device 126 is on and the LS device 128 is off), then the routine proceeds to decision step 1116. During decision step 1116 the half bridge will remain in the first switching state while the sense interface signal $V_{IS}$ is greater than the error amplifier signal $V_{EAP}$. When the sense interface signal $V_{IS}$ crosses (i.e., becomes less than) the error amplifier signal $V_{EAP}$, then the routine will loop back to decision step 1112.

If the half bridge is operating in the second switching state (i.e., the HS device 126 is off and the LS device 128 is on), then the routine proceeds to decision step 1118. During decision step 1118, the half bridge will remain in the second switching state while the sense interface signal $V_{IS}$ is less than the complementary error amplifier signal $V_{EAN}$. When the sense interface signal $V_{IS}$ crosses (i.e., becomes greater than) the error amplifier signal $V_{EAN}$, then the routine will loop back to decision step 1112.

Figure 11C:
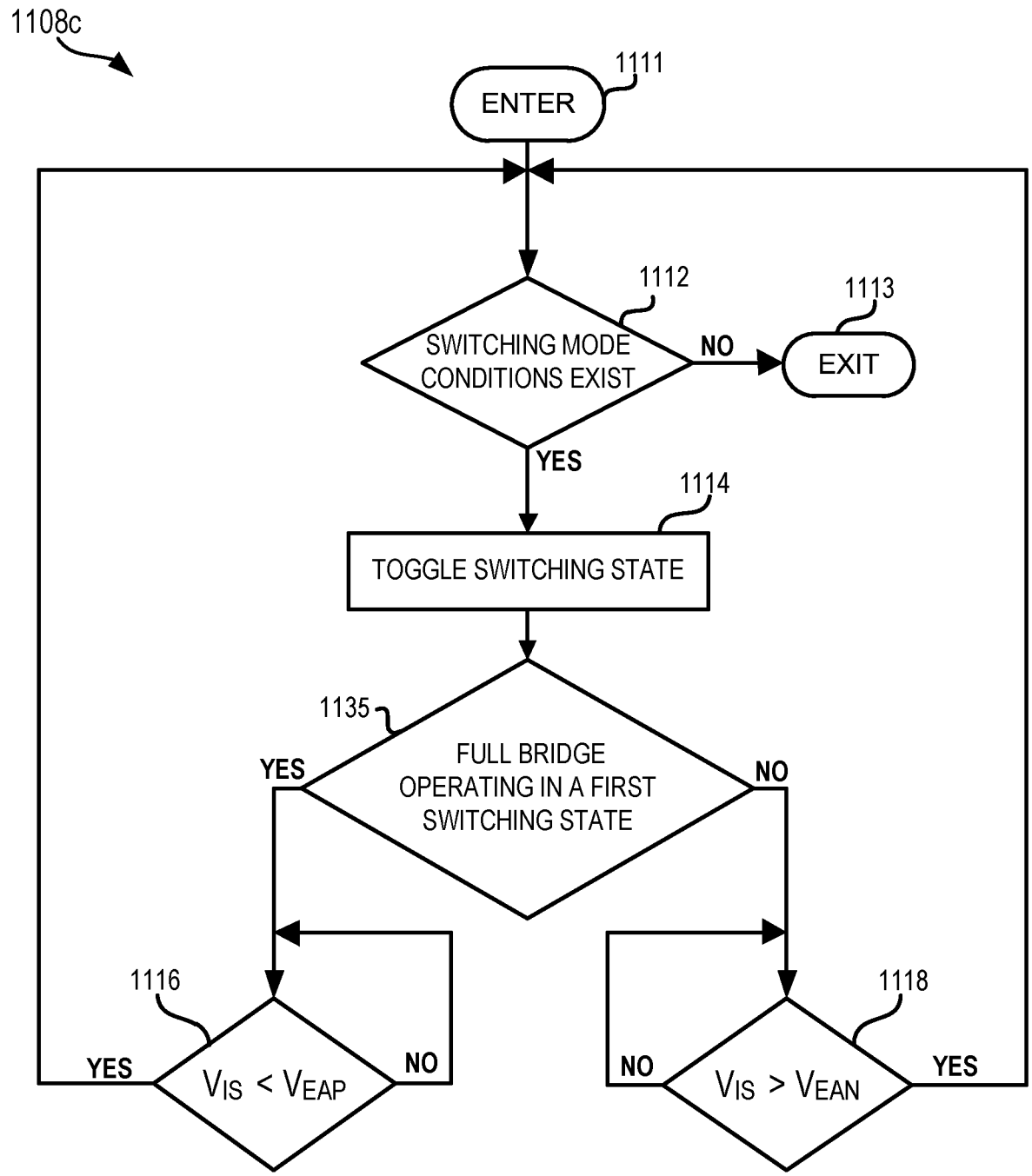
FIG. 11C illustrates a flow diagram of continuous mode switching in an LLC converter according to a full-bridge embodiment.

FIG. 11C illustrates a flow diagram 1108c of continuous mode switching in an LLC converter according to a full-bridge embodiment. The conceptual flow diagram 1108c may correspond to controlling drive signal CLKD in a full bridge configuration (e.g., LLC converter 100b) based on step 1108 of FIG. 11A and during continuous switching conditions beginning with a routine entry step 1111. In this regard conceptual flow diagram 1108c is similar to conceptual flow diagram 1108b except decision step 1115 is replaced with decision step 1135.

Decision step 1135 may determine an operational state of the full bridge embodiment. For instance, a first full bridge switching state may be defined by the switching state with HS device 75 and LS device 78 operating in the on state while HS device 77 and LS device 76 operate in the off state. Accordingly, the second full bridge switching state may be defined by the switching state with HS device 75 and LS device 78 operating in the off state while HS device 77 and LS device 76 operate in the on state.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

The invention claimed is:

1. A resonant converter, comprising:
   a resonant transformer comprising an input port and configured to provide an output power to a load;

a primary bridge circuit configured to provide an input power to the input port;

a buffer circuit coupled in parallel with the input port; and a control module configured to receive a buffered primary port signal from the buffer circuit and to control the primary bridge circuit to control the output power to the load in response to the buffered primary port signal, the buffered primary port signal comprising comprehensive signal information relating to the input power and the output power of the resonant converter.

2. The resonant converter of claim 1, wherein the resonant converter is a non-isolated resonant converter.

3. The resonant converter of claim 1, wherein the control module comprises:

a sense interface circuit configured to receive the buffered primary port signal and to provide a sense interface signal indicative of a primary port signal of the resonant transformer.

4. The resonant converter of claim 3, wherein the control module further comprises:

a sampling block configured to sample a plurality of sense interface signal samples from the sense interface circuit during a switching cycle of the sense interface signal.

5. The resonant converter of claim 4, wherein the control module comprises a signal processing block configured to calculate an instantaneous output power estimate in response to the plurality of sense interface signal samples.

6. The resonant converter of claim 5, wherein the control module is configured to control the output power to the load in response to the instantaneous output power estimate.

7. The resonant converter of claim 6, further comprising a synchronous rectifier coupled to the resonant transformer, wherein the control module is configured to control the synchronous rectifier in response to the instantaneous output power estimate.

8. The resonant converter of claim 6, wherein the control module is configured to control the primary bridge circuit to provide the input power to the input port in response to the instantaneous output power estimate.

9. The resonant converter of claim 1, wherein the buffer circuit comprises:

a coupling circuit; and a second transformer comprising:

a first winding coupled in parallel with the input port; and a second winding coupled to the coupling circuit to provide the buffered primary port signal.

10. A method of controlling an output power delivered by a resonant converter to a load, comprising:

applying an input power comprising an input voltage to an input of the resonant converter;

providing a switched power signal to a resonant transformer input port, the switched power signal comprising a switching cycle and a switching frequency; and providing a buffered primary port signal from the resonant transformer input port to a control module with a parallel coupled buffer circuit coupled to the resonant transformer input port, the buffered primary port signal comprising comprehensive signal information relating to the input power and the output power of the resonant converter.

11. The method of claim 10, further comprising:

controlling the output power in response to the buffered primary port signal.

12. The method of claim 11, wherein controlling the output power in response to the buffered primary port signal comprises:

level shifting an alternating current (ac) component of the buffered primary port signal;

converting the ac component into a sense interface signal; and controlling the output power in response to the sense interface signal.

13. The method of claim 12, further comprising:

sampling a plurality of sense interface signal samples from the sense interface signal during the switching cycle.

14. The method of claim 13, further comprising:

estimating a resonant capacitor differential voltage from the plurality of sense interface signal samples.

15. The method of claim 14, further comprising:

estimating an input voltage from the plurality of sense interface signal samples.

16. The method of claim 15, further comprising:

estimating a value of the output power based on the resonant capacitor differential voltage, the input voltage, and the switching frequency; and controlling the output power in response to the value of the output power estimated based on the resonant capacitor differential voltage, the input voltage, and the switching frequency.

17. A controller for use in a resonant converter, comprising:

a sense interface circuit coupled to receive a buffered primary port signal from a buffer circuit, the buffered primary port signal comprising comprehensive signal information relating to an input power and an output power of the resonant converter, the buffer circuit coupled across an input port of a resonant transformer of the resonant converter and configured to generate a sense interface signal representative of a primary port signal of the resonant transformer; and a clock control circuit configured to receive a sense interface signal from the sense interface circuit and to receive a feedback signal representative of an output of the resonant converter, the clock control circuit further configured to generate a switch signal to control a primary bridge circuit in response to the buffered primary port signal, the primary bridge circuit configured to provide the input power to the input port of the resonant transformer to control the output power provided to a load.

18. The controller of claim 17, wherein the controller further comprises:

a sampling block coupled to receive the sense interface signal from the sense interface circuit to sample data points of the sensed interface signal; and a signal processing block coupled to receive the sample data points from the sampling block to extract the comprehensive signal information from the sampled data points, wherein the signal processing block is coupled to calculate at least one of an input voltage, an incremental resonant capacitor voltage change, and the output power from the comprehensive signal information from the sampled data points.

19. The controller of claim 18, further comprising a power control block configured to control the primary bridge circuit based on the at least one of the input voltage, the incremental resonant capacitor voltage change, and the output power.

20. The controller of claim 19, wherein the power control block is configured to provide overcurrent protection.

* * * * *